United States Patent [19]

Ohmi et al.

[11] Patent Number: 4,791,469
[45] Date of Patent: Dec. 13, 1988

[54] PHOTOELECTRIC CONVERTER

[75] Inventors: Tadahiro Ohmi, Sendai; Nobuyoshi Tanaka, Tokyo, both of Japan

[73] Assignee: Canon Kabushiki Kaisha, Tokyo, Japan

[21] Appl. No.: 1,580

[22] Filed: Jan. 8, 1987

Related U.S. Application Data

[62] Division of Ser. No. 625,130, Jun. 27, 1984, Pat. No. 4,686,554.

[30] Foreign Application Priority Data

| Jul. 2, 1983 | [JP] | Japan | 58-120751 |
| Jul. 2, 1983 | [JP] | Japan | 58-120752 |
| Jul. 2, 1983 | [JP] | Japan | 58-120753 |
| Jul. 2, 1983 | [JP] | Japan | 58-120754 |
| Jul. 2, 1983 | [JP] | Japan | 58-120755 |
| Jul. 2, 1983 | [JP] | Japan | 58-120756 |
| Jul. 2, 1983 | [JP] | Japan | 58-120757 |

[51] Int. Cl.$^4$ ............... H01L 27/14; H01L 31/00
[52] U.S. Cl. .................... 357/30; 357/340; 357/40; 357/45; 307/311
[58] Field of Search ........... 357/30, 34, 35, 23.1, 357/23.6, 43, 45, 47, 40, 50, 51; 307/311

[56] References Cited

U.S. PATENT DOCUMENTS

| 3,624,428 | 11/1971 | Weimer | 307/311 |
| 4,072,975 | 2/1978 | Ishitani | 357/23.4 |
| 4,425,574 | 1/1984 | Silvestri et al. | 357/50 |

FOREIGN PATENT DOCUMENTS

| 038697 | 10/1981 | European Pat. Off. | |
| 042218 | 12/1981 | European Pat. Off. | |
| 0007888 | 1/1979 | Japan | 357/23.6 |
| 0207384 | 12/1982 | Japan | 357/90 |
| 2077490 | 12/1981 | United Kingdom | 357/23.6 |

OTHER PUBLICATIONS

Tadahiro Ohmi et al., "Static Induction Transistor and Its Application to Imaging Devices", Television Society of Japan, Technical Report, ED590, pp. 53–58, Aug. 28, 1981 (with English translation).

Primary Examiner—William L. Sikes
Assistant Examiner—Georgia Y. Epps
Attorney, Agent, or Firm—Fitzpatrick, Cella, Harper & Scinto

[57] ABSTRACT

A photoelectric converter comprising a photosensor element, a typical example of the photosensor element comprising: a transistor including an n or n$^+$ collector region an n$^-$ region disposed contiguous to the collector region, a p base region disposed contiguous to the n$^-$ region, an n$^+$ emitter region disposed contiguous to the base region, and a first electrode connected to the emitter region; and a storage capacitor constituted by the base region, an electrically insulating region disposed contiguous to the base region, and a second electrode connected to the electrically insulating region; whereby the base region is held in a floating state. A photogenerated charge is stored in the base region by controlling the potential of the base region and an electric signal corresponding to the charge stored in the base region is subsequently output from the first electrode.

105 Claims, 35 Drawing Sheets

PHOTOELECTRIC CONVERTER

This is a division of application Ser. No. 625,130, filed June 27, 1984, now U.S. Pat. No. 4,686,554.

BACKGROUND OF THE INVENTION

The present invention relates to a photoelectric converter.

Recently, studies on photoelectric converters, especially solid state image pickup devices, have been widely conducted as semiconductor technologies advance, and some of them have already become available.

These image pickup devices are mainly classified into those of CCD (Charge Coupled Device) type and those of MOS (Metal-Oxide-Semiconductor Device) type. For instance, the CCD type image pickup devices generally adopt the operation principle featured by forming potential wells below MOS capacitor electrodes, storing charge produced in response to incident light, and, in a readout period, sequentially shifting these potential wells in accordance with pulses to transfer the stored charges on an output amplifier to read out them. In another CCD type image pickup device, light-receiving areas are formed by junction diodes, and transfer areas are formed by CCD structures. On the other hand, the MOS type image pickup devices adopt the operational principle featured by storing charges produced in response to incident light in respective photodiodes comprising pn junctions constituting light-receiving areas, and, in a readout period, reading out stored charges to an output amplifier by sequentially turning on MOS switching transistors respectively connected to photodiodes.

The CCD type image pickup devices are of a relatively simplified structure and, when viewed from the point of noise, only capacitance of a charge detector provided at the final stage, originating from floating diffusion, affects random noise. Accordingly, the CCD image pickup devices have relatively low noise characteristics and are capable of operating at low illumination. However, because of restriction of processes for producing CCD type image pickup devices, a MOS type amplifier serving as an output amplifier is provided on a chip and it is likely that visually noticeable 1/f noise occurs from interfaces between silicon and a film of $SiO_2$. Accordingly, although such a noise is relatively low, there exists a limitation on their performance. Further, if an attempt is made to increase the number of cells, and pack them with a high density for the purpose of performing high resolution pick up, the maximum charge storage capacity of a potential well decreases, failing to maintain a desired dynamic range. Accordingly, this will result in a big problem when solid state image pickup devices of high resolution are realized in the future. Moreover, as the CCD type image pickup devices are formed to transfer stored charges by sequentially shifting potential wells, even if there exists a defect in only one cell, the charge transfer is stopped thereat or the greatly thereof is extremely lowered, whereby it is difficult to increase production yield.

On the contrary, the MOS type image pickup devices, while they are somewhat complicated in structure as compared with the CCD type image pickup devices, particularly, the frame transfer type devices, can be so constituted that they will have a large storage capacity and a wide dynamic range. Further, even if there is a defect in one cell, the influence of the defect does not spread over the other cells because an X-Y addressing scheme is employed, whereby a high production yield is attained. However, in the MOS type image pickup devices, at the signal readout stage, wiring capacitance is connected to each photodiode, and there occurs extremely large signal voltage drop, resulting in a low output voltage. Furthermore, noticeable random noise occurs due to a large wiring capacitance and fixed pattern noise occurs due to variation of parasitic capacitance existing in respective photodiodes and MOS switching transistors for horizontal scanning. ecause of these and other difficulties, the MOS type image pickup devices have drawbacks such that it is difficult to take a picture at a low illumination, in contrast to the CCD type image pickup devices.

Further, when an attempt is made to realize high resolution image pickup devices in the future, it is expected that the dimension of each cell will be reduced and a charge stored therein will decrease. On the contrary, the wiring capacity determined by a chip size can not be lowered substantially, even if the line width becomes small. Accordingly, the MOS type image pickup devices will be further disadvantageous in respect of S/N ratio.

Although the CCD type and MOS type image pickup devices have both advantages and drawbacks described above, they are gradually approaching a practically usable level. However, they have essential problems in realizing the still higher resolutions required in the future.

Meanwhile, there have been proposed novel solid-state image pickup devices as disclosed in Japanese Laid Open Patent Application Nos. 56-150878, 56-157073 and 56-165473, all entitled "Semiconductor Image Pickup Device". While the conventional CCD and MOS type image pickup devices are based on the principle that charge generated in response to the incident light is stored in a main electrode (for instance, the source of a MOS transistor), those novel image pickup devices are based on the principle that charge generated in response to the incident light is stored in a control electrode (for instance, the base of a bipolar transistor or the gate of an SIT (static induction transistor) or MOS transistor in such a way that the flowing current is controlled in response to the charge generated in response to the incident light. That is, in the conventional CCD or MOS type image pickup devices, the stored charge per se is read out to the exterior, whereas, in those novel image pickup devices, each cell has an amplification capability so that the amplified signal is read out by charge amplification. In other words, the stored charge is read out as a low impedance output by the impedance conversion. As a result, the newly proposed image pickup devices have various advantages such as a high output, a wide dynamic range, and low noise and moreover that the nondestructive readout is possible because the carrier (charge) excited in response to the light or light image is stored in a control electrode. Furthermore, they can be improved in the future in such a way that they will have a higher degree of resolution.

However, these newly proposed image pickup devices fundamentally adopt an X-Y address scheme and have a fundamental cell structure comprising a cell of the conventional MOS type image pickup device and an amplifier element such as a bipolar transistor or SIT. As a result, they are complicated in construction and even though they have a possibility of exhibiting a higher degree of resolution, there exists a limit to their resolution capability at their present stage of evolution.

SUMMARY OF THE INVENTION

In view of the above, a principal object of the present invention is to provide a novel photoelectric converter which is very simple in construction while each cell thereof has its own amplification function and which can be adapted for a higher degree of resolution in the future.

According to a broad aspect of the invention, there is provided a photoelectric converter comprising a photosensor element, said photosensor element comprising:
  a transistor including
    a first semiconductor region having a first conductivity type,
    a second semiconductor region disposed contiguous to the first semiconductor region, the second semiconductor region having the same conductivity type as that of and a lower impurity concentration than that of the first semiconductor region,
    a third semiconductor region disposed contiguous to the second semiconductor region, the third semiconductor region having a different conductivity type from that of the second semiconductor region,
    a fourth semiconductor region disposed contiguous to the third semiconductor region, the fourth semiconductor region having a different conductivity type from that of the third semiconductor region, and
    a first electrode connected to the fourth semiconductor region; and
  a storage capacitor constituted by
    said third semiconductor region,
    an electrically insulating region disposed contiguous to the third semiconductor region, and
    a second electrode connected to the electrically insulating region;
  whereby said third semiconductor region is in a floating state so that the third semiconductor region is adapted for storing a charge generated by photoexcitation by controlling the potential of the third semiconductor region through said electrically insulating region, and an electric signal corresponding to the charge stored in the third semiconductor region is output from said first electrode.

According to another broad aspect of the invention, there is provided a photoelectric conversion process comprising the steps of
(A) providing a photoelectric converter as defined above; and
(B) sequentially and cyclically conducting the following stages of operations;
  (a) Charge Storage Operation, comprising
    setting the following initial conditions wherein;
      the first semiconductor region is held at a reverse polarity of voltage,
      the third semiconductor region is biased to a reverse polarity of voltage, and
      the fourth semiconductor region is grounded or floated, and
    illuminating the photosensor element with incident light to store a charge corresponding to the incident light in the third semiconductor region,
  (b) Readout Operation, comprising
    holding the fourth semiconductor region in a floating state and forward biasing the third semiconductor region to output an electrical signal corresponding to the charge in the third semicoductor region; and
  (c) Refreshing Operation, comprising
    holding the first semiconductor region at a ground potential or a reverse polarity of voltage,
    holding the fourth semiconductor region at a ground potential, and
    applying a forward polarity of voltage to the third semiconductor region to remove a charge remaining corresponding to the photogenerated charge in the third semiconductor region.

Herein, the term "a forward polarity of voltage" is used to mean "a positive voltage" with respect to a p-type semiconductor region and "a negative voltage" to an n-type semiconductor region, whereas the term "a reverse polarity of voltage" means "a negative voltage" to a p-type semiconductor region and "a positive voltage" to an n-type semiconductor region. In determining the polarity of voltage, an i-type semiconductor region is regarded as a p-type semiconductor region when it is used in combination with an n-type semiconductor region and an n-type semiconductor region when combined with a p-type semiconductor region.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1-6 are views for illustrating the essential construction and the fundamental mode of opertion of a first embodiment of the present invention;

FIG. 2 shows an equivalent circuit in the case of the readout operation;

FIG. 3 is a graph showing the relationship between the readout time and the readout voltage;

FIG. 5 is a diagram of an equivalent circuit in the case of the refreshing operation;

FIG. 10 is a graph showing the relationship between the output voltage and the time elapsed after the photoelectric converter is turned on;

DESCRIPTION OF PREFERRED EMBODIMENTS

FIG. 1 are views used to explain the fundamental structure and mode of operation a photosensor cell of a first embodiment of the photoelectric converter in accordance with the present invention.

Figure 1A:
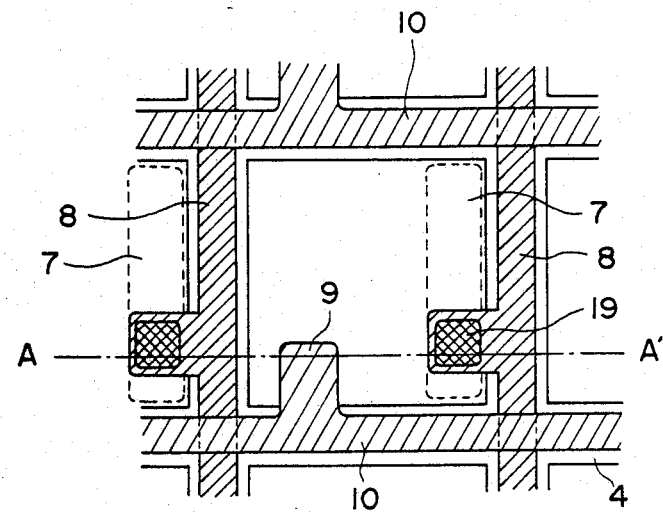
FIG. 1(a) is a plan view thereof.
Figure 1B:
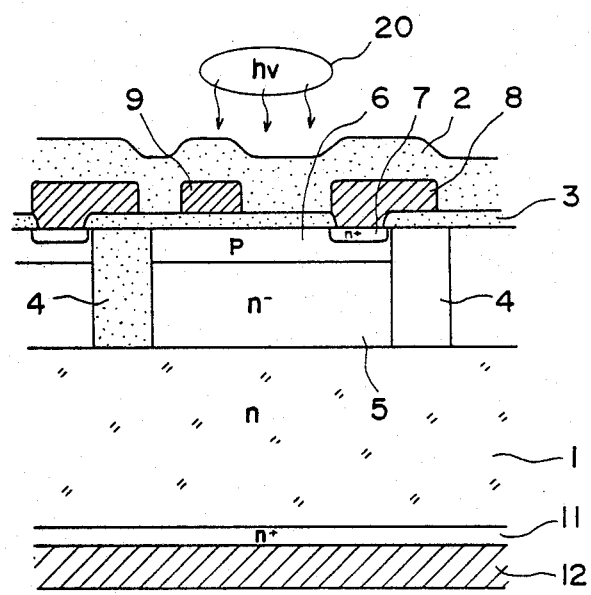
FIG. 1(b) is a sectional view thereof.
Figure 1C:
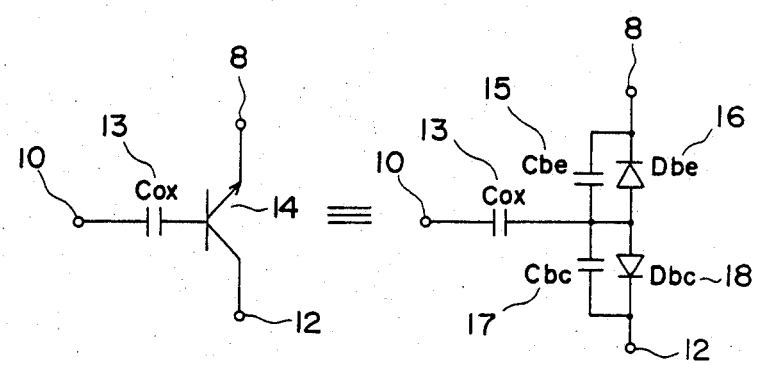
FIG. 1(c) is a diagram of an equivalent circuit thereof.

FIG. 1(a) is a plan view of a photosensor cell; FIG. 1(b) is a sectional view taken along the line A—A' of FIG. 1(a); and FIG. 1(c) is a diagram of an equivalent circuit thereof. Same reference numerals are used to designate similar parts throughout the figures.

In FIG. 1, the photosensor cells are shown as being arranged in a normal pixel arrangement, but it is to be understood that they may be arranged in an offset pixel arrangement in order to enhance the resolution in the horizontal direction.

As shown in FIGS. 1(a) and (b), each photosensor cell comprises:

a passivation film 2 comprising, in general, a film of PSG (phospho-silicate glass) formed on a major surface of an n type silicon substrate 1 doped with an impurity such as P, Sb or As;

an insulating oxide film 3 comprising a silicon oxide film ($SiO_2$);

a cell isolation region 4 comprising an $SiO_2$, $Si_3N_4$ or polysilicon insulating film in order to electrically isolate adjacent photosensor cells from each other;

an $n^-$ region 5 which has a low impurity concentration and has been formed by an epitaxial process or the like;

a p region 6 which has been doped with an impurity such as boron (B) by an impurity diffusion process or ion injection process and which serves as the base of a bipolar transistor;

an $n^+$ region 7 which serves as the emitter of a bipolar transistor formed by an impurity diffusion process or ion injection process;

a conductor 8 formed with an electrically conductive material such as aluminum (Al), Al—Si, or Al—Cu—Si in order to read out the signal to the exterior;

an electrode 9 for applying pulses through the insulating film 3 to the p region 6 which is maintained in a floating state;

a conductor 10 connected to the electrode 9;

an $n^+$ region 11 which has a high impurity concentration and is formed by an impurity diffusion process or the like in order to make it in contact with the bottom surface of the substrate 1; and an electrode 12 made of an electrically conductive material such as aluminum in order to apply a potential to the substrate 1; that is, in order to apply a potential to the collector of a bipolar transistor.

In FIG. 1(a), a contact 19 is formed in order to interconnect the $n^+$ region 7 and the conductor 8. The intersection of the conductors 8 and 10 comprises a so-called two-layer arrangement in which the conductors 8 and 10 are electrically isolated from each other by means of an insulating film consisting of an insulating material such as $SiO_2$. That is, at the intersection of the conductors 8 and 10, two metal layers are laid one over the other, but they are electrically isolated from each other.

In the equivalent circuit as shown in FIG. 1(c), a capacitor Cox 13 is constituted by an MOS structure comprising the electrode 9, the insulating film 3 and the p region 6 and bipolar transistor 14 is constituted by the emitter consisting of the $n^+$ region 7, the base consisting of the p region 6 and the $n^-$ region 5 with a low impurity concentration and the collector consisting of the n region 1. As is clear from FIG. 1(b), the p region 6 is floated.

In the second equivalent circuit as shown at the right half of FIG. 1(c), the bipolar transistor 14 is represented by a base-emitter junction capacitor Cbe 15, a pn junction diode Dbe 16 between the base and emitter, a base-collector junction capacitor Cbc 17 and a pn junction diode Dbc 18 between the base and collector.

Still referring to FIG. 1, the mode of operation of the photosensor cell with the above-described structure will be described in detail.

The fundamental operation of the photosensor cell is composed of a charge storage operation in response to incident light, a readout operation and a refresh operation. In the charge storage operation, for instance, the emitter 7 is grounded through the conductor 8 while the collector is biased to a positive potential through the conductor 12. Since a positive pulse voltage is applied through the conductor 10 to the capacitor Cox 13, the base 6 is maintained at a negative potential. That is, the base 6 is reverse biased with respect to the emitter 7. The operation of biasing the base to a negative potential by applying a pulse to the capacitor Cox 13 will be described in more detail in conjunction with the refreshing operation.

When light 20 falls on the upper surface of the photosensor cell under these conditions, electron-hole pairs are generated within the semiconductor. Since the n region 1 is biased to a positive potential, electrons flow into the n region 1, and holes flow into the p region 6. As the holes are stored in the p region 6, the potential of the p region 6 is gradually raised toward a positive potential.

As shown in FIGS. 1(a) and (b), the portion under the light receiving surface of each photosensor cell is almost occupied by the p region 6 and partly occupied by the $n^+$ region. The concentration of electron-hole pairs is of course greater as they approach the surface of the photosensor cell. As a result, many electron-hole pairs are excited in response to the incident light in the p region 6. The structure of each photosensor cell is such that electrons excited in the p region 6 are not recombined with the holes and flow out of the p region 6 into the n region. Therefore the excited holes remain in the p region 6 so that the p region 6 gradually rises to a positive potential. When the p region 6 has a uniform concentration of impurities, the photo-excited electrons flow to the $pn^-$ junction between the p region 6 and the $n^-$ region 5 due to diffusion and then are absorbed into the n region 1 due to drift caused by a strong electric field applied to the $n^-$ region 5. It is of course possible that electrons are transferred through the p region 6 by diffusion, but when the photosensor cell is so designed and constructed that the concentration of impurities is decreased as the impurities are away from the surface into the interior, an electric field Ed given by $$Ed = \frac{1}{W_B} \cdot \frac{K \cdot T}{q} \cdot \ln \frac{N_{AS}}{N_{Ai}}$$

is generated in the direction of from the interior of the p region 6 toward the surface, where $W_B$: the junction depth from the light incident surface of the p region 6;
K: Boltzmann's constant;
T: the absolute temperature:
q: unit charge;
$N_{AS}$: the impurity concentration at the surface of the p region 6; and
$N_{Ai}$: the impurity concentration in the p region 6 at the boundary thereof with the $n^-$ high resistance region 5.

It is assumed that $N_{AS}/N_{Ai} > 3$. Then, the transfer of electrons within the p region 6 is effected by drift rather than by diffusion. That is, in order that the carriers excited by the incident light in the p region 6 may effectively function as a signal, it is preferred that the impurity concentration in the p region 6 decreases from the light receiving surface toward the interior. If the p region 6 is formed by diffusion, the impurity concentration decreases toward the interior as compared with the impurity concentration at the light incident or receiving surface.

Part of the light receiving surface of the sensor cell is occupied by the $n^+$ region 7. The depth of the $n^+$ region 7 is prefrably designed to be about 0.2–0.3 micron or less. Therefore, the quantity of light absorbed in the $n^+$ region 7 is not so much so that there arises no problem. However, the presence of the $n^+$ region 7 causes a decrease in sensitivity to the short-wave light, especially blue light. The impurity concentration in the $n^+$ region is preferably designed at $1 \times 10^{20} cm^{-3}$ or higher. When the $n^+$ region 7 is doped with a high concentration of impurities, the diffusion length of holes in the $n^+$ region 7 is of the order of 0.15–0.2 micron. Therefore, in order to effectively flow the light excited holes from the $n^+$ region 7 to the p region 6, it is preferable that, the impurity concentration decreases from the side of the light incident or receiving surface to the interior. If the above condition for impurity concentration is satisfied in the $n^+$ region 7, a strong drift electric field directed from the light incident surface to the interior is produced so that the holes excited in the $n^+$ region 7 in response to the incident light can immediately flow into the p region 6 by drift. If the impurity concentrations in both the $n^+$ region 7 and the p region 6 decrease from the light incident or receiving surface toward the interior, photo-excited carriers in the $n^+$ region 7 and the p region 6 in the vicinity of the light incident or receiving surface of the photosensor cell can all effectively function as a light signal. If the $n^+$ region 7 is formed by the diffusion from a silicon oxide film or polysilicon film which is heavily doped with As or P, it becomes possible an $n^+$ region in which the desirable impurity gradation is produced as described above.

Due to the accumulation or storage of holes, the base potential finally becomes equal to the emitter potential, i.e., the ground potential in this case, and then clipped at this potential. Strictly speaking, the base potential is clipped at such a voltage that the base-emitter junction is deeply forward biased so that the holes stored in the base begin to flow into the emitter. That is, the saturation potential of the photosensor cell in this case is substantially equal to the difference between a negative bias potential to which the p region 6 is initially biased and the ground potential. When the n+ region 7 is not grounded and photo-excited charge is stored under the condition that the n+ region 7 is floated, it is possible to store the charge in the p region 6 so that the potential of the p region 6 becomes substantially equal to the potential of the n region 1.

While, the charge storage operation has been described qualitatively so far, it will be described more definitely and quantitatively.

The spectral sensitivity distribution of this photosensor cell is given by $$S(\lambda) = \frac{\lambda}{1.24} \cdot \exp(-\alpha x) \times [1 - \exp(-\alpha y)] \cdot T(A/W)$$

where
$\lambda$: the wavelength in micron;
$\alpha$: the absorption coefficient of light in silicon crystal in micron$^{-1}$;
x: the thickness in micron of a "dead layer" in the surface region of semiconductor in which the recombination loss occurs so that it does not contribute to the sensitivity;
y: the thickness in micron of an epitaxially grown layer; and
T: transmissivity, that is, the ratio between the quantity of incident light and the quantity of light effectively penetrated into a semiconductor, the ratio being affected by the quantity of light reflected at the light receiving surface, etc.

The photocurrent Ip can be obtained by the following equation by using the spectrum sensitivity $S(\lambda)$ and the radiation illumination $Ee(\lambda)$:

$$Ip = \int_0^\infty S(\lambda) Ee(\lambda) \, d\lambda \, [\mu A/cm^2]$$

where the radiation illumination $Ee(\lambda)$ [$\mu$W cm$^{-2}$ nm$^{-1}$] is given by $$Ee(\lambda) = \frac{Ev \cdot P(\lambda, Td)}{6.80 \int_0^\infty V(\lambda) \cdot P(\lambda, Td) \cdot d\lambda} \, [\mu W \, cm^{-2} nm^{-1}]$$

where
Ev: the illumination intensity [lux] at the surface of the photosensor cell;
$P(\lambda, Td)$: spectrum distribution of light incident on the surface of the photosensor cell; and
$V(\lambda)$: luminous efficiency of human eyes.

The above-described equations are used in the case of a photosensor cell with an epitaxial grown layer having the thickness of 4 microns which is illuminated by an A light source (Td=2854° K.) so that the illumination intensity at the light receiving surface is 1 lux. The result is that the photocurrent of about 280 nA/cm$^2$ flows and that the number of incident photons or the number of electron-hole pairs generated is of the order of $1.8 \times 10^{12}$/cm$^2$ sec.

In this case, the potential Vp which is produced when the photo-excited holes are stored in the base is given by $$Vp = Q/C$$

where
Q: the charge of holes stored, and
C: the sum of the capacitance Cbe 15, the capacitance Cbc 17, and the capacitance Cox 13.

Now, assuming that the impurity concentration of the n+ region 7 be $10^{20}$ cm$^{-3}$; the impurity concentration of the p region 6 be $5 \times 10^{16}$ cm$^{-3}$; the impurity concentration of the n$^-$ region be $10^{13}$ cm$^{-3}$; the area of the n+ region 7 be 16 $\mu$m$^2$; the area of the p region 6 be 64 $\mu$m$^2$; and the thickness of the n$^-$ region 6 be 3 microns, then the junction capacitance is about 0.014 pF. Further, assuming that the storage time be 1/60 sec.; and the effective light receiving area which is equal to the area of the p region 6 minus the area of the electrodes 8 and 9 be 56 $\mu$m$^2$, then, the number of holes stored in the p region 6 becomes $1.7 \times 10^4$. Consequently, the potential Vp produced in response to the incident light becomes about 190 mV.

It should be noted herein that when the resolution is improved and the cell size is made smaller, the quantity of light incident on each photosensor cell decreases, but since the junction capacitance decreases in proportion to the decrease in size of a photosensor cell, the potential Vp produced in response to the incident light is substantially maintained at the same level. This is because, as shown in FIG. 1, the photosensor cell in accordance with the present invention is simple in construction so that the effective light receiving area can be remarkably increased.

This is one of the reasons why the photoelectric converter in accordance with the present invention is advantageous over the conventional interline type CCD image sensors. In the case of the interline type CCD image sensors, as the resolution is enhanced and when the transfer of a certain quantity of charge intended, the transfer area relatively increases so that the effective light receiving area decreases, and consequently the sensitivity, i.e., the voltage produced in response to the incident light, decreases. Furthermore, in the case of the interline type CCD image sensors, the saturation voltage is limited by the size of the transfer area and considerably decreases. On the other hand, according to the present invention, the saturation voltage is determined by a bias voltage appllied so as to bias the p region 6 at a negative potential as described hereinbefore, whereby a high saturation voltage can be maintained.

Next, a mode of reading out to the exterior of the voltage produced by the charge stored in the p region 6 in the manner described above will be described.

Figure 2:
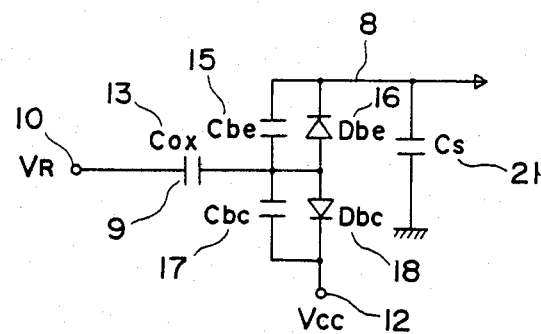

In the readout mode, the emitter 7 and the conductor 8 are floated and the collector 1 is maintained at a positive potential Vcc. FIG. 2 shows the equivalent circuit. Assuming that prior to the illumination, the base 6 be negatively biased to $-V_B$ and the storage voltage produced in response to the incident light be Vp, the base potential becomes $-V_B + Vp$. When a positive readout voltage $V_R$ is applied through the conductor 10 to the electrode 9 under these conditions, it is capacitively divided by the oxide film capacitance Cox 13, the base-emitter junction capacitance Cbe 15 and the base-collector junction capacitance Cbc 17. As a result, a voltage of $$\frac{Cox}{Cox + Cbe + Cbc} V_R$$

is applied to the base. Therefore, the base potential is given by $$-V_B + V_p + \frac{Cox}{Cox + Cbe + Cbc} V_R.$$

It is assumed that the following condition is satisfied:

$$-V_B + \frac{Cox}{Cox + Cbe + Cbc} V_R = 0$$

Then, the base potential becomes equal to the storage voltage Vp produced in response to the incident light. When the base potential is forward biased with respect to the emitter potential, the electrons are injected from the emitter into the base, and accelerated by the drift electric field to reach the collector because the collector is held at a positive potential. The current flowing at this stage is given by $$i = \frac{Aj \cdot q \cdot Dn \cdot n_{po}}{W_B}\left(1 + \ln \frac{N_{Ae}}{N_{AC}}\right)$$
$$\times [\exp(q/kT)(Vp - Ve) - 1]$$

where
Aj: the area of the base-emitter junction;
q: unit charge ($1.6 \times 10^{-19}$ coulomb);
Dn: the diffusion coefficient of electrons in the base 6;
$n_{po}$: the concentration of electrons (which are minority carriers) at the emitter end of the p base 6;
$W_B$: the width of the base;
$N_{Ae}$: the acceptor concentration at the emitter end of the base;
$N_{AC}$: the acceptor concentration at the collector end of the base;
k: Boltzmann's constant;
T: the absolute temperature; and
$V_e$: the emitter potential.

It is apparent from the above-described equation that the current keeps flowing until the emitter voltage Ve becomes equal to the base potential, that is, the storage voltage Vp produced in response to the incident light in this case. Now, the variation is emitter potential Ve with the elapse of time can be obtained by the following equation:

$$Cs \cdot dVe/dt = i = \frac{Aj \cdot q \cdot Dn \cdot n_{po}}{W_B} (1 + \ln \cdot N_{Ae}/N_{AC}) \times$$
$$[\exp(q/kT)(Vp - Ve) - 1]$$

where Cs: the capacitance 21 of the conductor 8 connected to the emitter 7.

Figure 3:
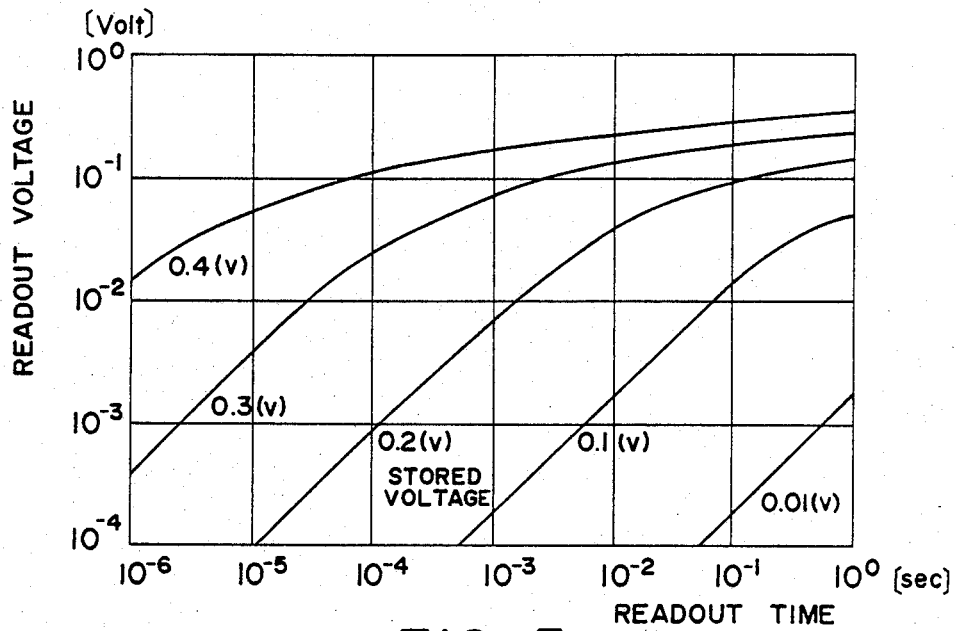

FIG. 3 shows some examples of the variation in emitter potential with time obtained from the above-described equation.

It is seen from FIG. 3 that it takes more than one second before the emitter potential becomes equal to the base potential. This is because, as the emitter potential Ve approaches Vp, the current flow is somewhat retarded. Therefore, in order to solve this problem, instead of establishing the condition $$-V_B + \frac{Cox}{Cox + Cbe + Cbc} V_R = 0$$

when the positive potential $V_R$ is applied to the electrode 9, the following condition may be adopted to be established:

$$-V_B + \frac{Cox}{Cox + Cbe + Cbc} V_R = V_{bias}$$

Thus, the base potential is further forward biased by $V_{bias}$. In this case, the current is given by $$i = \frac{Aj \cdot q \cdot Dn \cdot n_{po}}{W_B} (1 + \ln N_{Ae}/N_{AC}) \times$$
$$[\exp(q/kT)(Vp + V_{bias} - Ve) - 1]$$

Figure 4A:
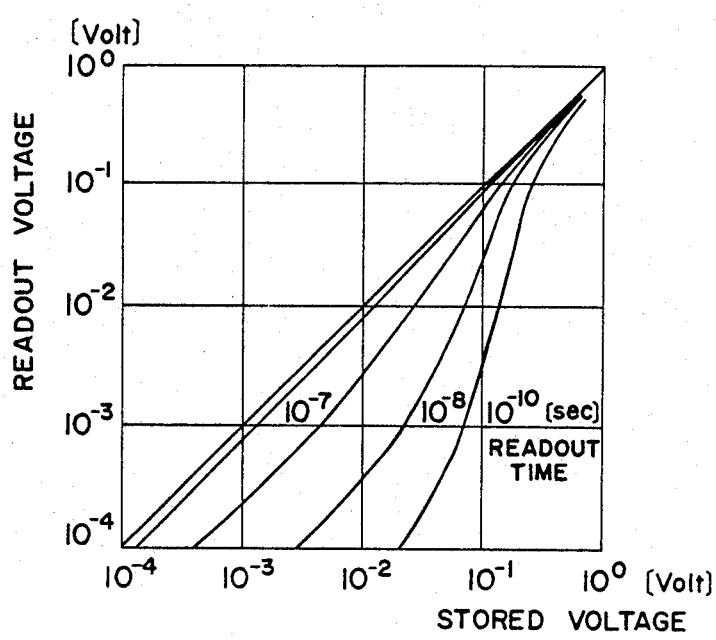
FIG. 4(a) is a graph showing the relationship between the storage voltage and the readout time.

FIG. 4(a) shows the relationship between the storage voltage Vp and the readout voltage, i.e., the emitter potential Ve, under the conditions that $V_{bias}$ is set at 0.6V and the potential $V_R$ applied to the electrode 9 is returned to zero volt after a predetermined time period so that the flow of current is interrupted. It is to be noted that, while actually a certain potential given by the bias voltage component and dependent upon a readout time is always added to the readout voltage, the value obtained by subtracting such additional potential as described above is plotted in FIG. 4(a). When the positive voltage $V_R$ which has been applied to the electrode 9 is returned to zero volt, then the voltage given by $$-\frac{Cox}{Cox + Cbe + Cbc} V_R$$

is contrariwise added to the base potential so that the base potential becomes equal to the potential prior to the application of the positive voltage $V_R$. That is, the base potential becomes equal to $-V_B + V_P$ and is reverse biased with respect to the emitter 7 so that the current flow is interrupted. It is seen from FIG. 4(a) that when a readout time (i.e., a time during which $V_R$ is being applied to the electrode 9) is longer than 100 ns, the linearity between the storage voltage Vp and the readout voltage $V_R$ can be maintained within a range of about four orders of magnitude so that the readout operation can be carried out at a high speed. In FIG. 4(a), the straight line with a slope angle of 45° corresponds to the result obtained in a case where a sufficient readout time is used. In obtaining the characteristic curves shown in FIG. 4(a), it has been assumed that the capacitance Cs of the conductor 8 is 4 pF. Even though the capacitance Cs is about 300 times as large as 0.014 pF of the junction capacitance Cbe+Cbc, FIG. 4(a) shows that the storage voltage Vp produced in the p region 6 is not attenuated at all and that the readout speed is considerably high because of the effect of the bias voltage. This is because the amplification function, i.e., the charge amplification function, of the photosensor cell in accordance with the present invention is very effective.

On the other hand, in the case of the conventional MOS image pickup devices, in the readout stage, the storage voltage Vp becomes Cj·Vp/(Cj+Cs) (where Cj is the pn junction capacitance of the light receiving area of a MOS type image pickup device) due to the influence of the conductor capacitance Cs. Thus, the conventional MOS image pickup devices have a drawback that the readout voltage drops by a factor of two. Consequently, the MOS type image pickup devices have drawbacks such as high fixed pattern noise due to the fluctuation of parasitic capacitance of MOS switching transistors which are used to read out information to the exterior or high random noise produced due to a high wiring or output capacitance. Therefore, the conventional MOS type image pickup devices cannot give a satisfactorily high S/N (signal-to-noise) ratio. In contrast thereto, in the case of the photosensor cell of the type as shown in FIGS. 1(a), (b) and (c), since the storage voltage produced in the p region 6 per se is read out to the exterior and this storage voltage is relatively high, fixed pattern noise and random noise due to an output capacitance are reduced relatively so that a satisfactory S/N ratio can be obtained.

Figure 4B:
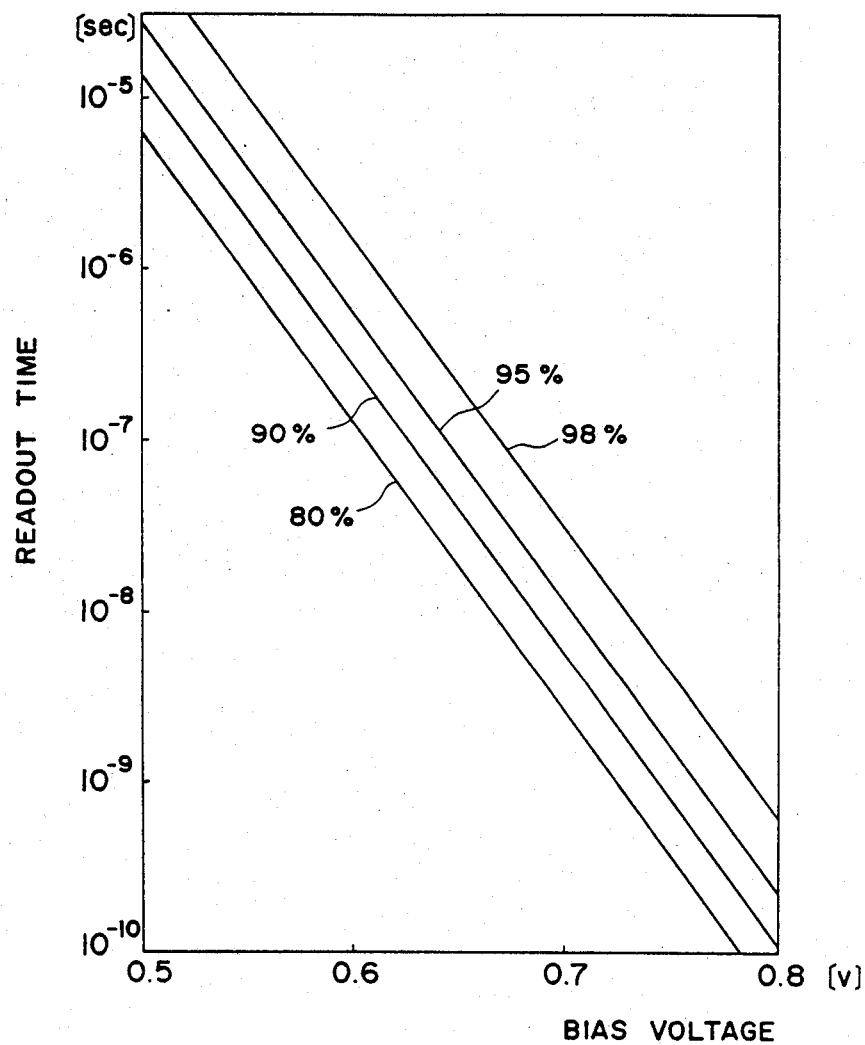
FIG. 4(b) is a graph showing the bias voltage and the readout time.

It has been described that the linearity of about four orders can be obtained at a high readout speed when the bias voltage $V_{bias}$ is set to 0.6V, and FIG. 4(b) shows in more detail the linearity in terms of the relationship between a readout time and a bias voltage, based on the calculated data.

In FIG. 4(b), the abscissa represents the bias voltage $V_{bias}$ while the ordinate the readout time. The parameters represent the percentages of the readout voltage with respect to the stored voltage, and the lines in FIG. 4(b) indicate the required readout time within which the readout voltages reach 80, 90, 95 and 98%, respectively, of the stored voltage on the assumption that the stored voltage is 1 mV. As will be understood from FIG. 4(a), it is apparent that when the readout voltages reach 80, 90, 95 and 98%, respectively, of the stored voltage of 1 mV, better readout characteristic or percentages can be obtained if the storage voltage is in excess of 1 mV.

From FIG. 4(b), it is seen that when the bias voltage $V_{bias}$ is 0.6V, the readout time required for obtaining a readout voltage of 80% of the stored voltage is 0.1 μs; for 90% 0.27 μs; for 95% 0.54 μs; and for 98% 1.4 μs. FIG. 4(b) further shows that if the bias voltage $V_{bias}$ is increased above 0.6V, a higher readout speed can be obtained. Thus, when a desired readout time and desired linearity are determined during the design of the whole construction of an image pickup device, a required bias voltage $V_{bias}$ can be determined from the graph as shown in FIG. 4(b).

Another advantage of the photosensor cell in accordance with the present invention is that the holes stored in the p region 6 can be read out nondestructively because the probability of recombination of holes with electrons in the p region 6 is extremely low. More particularly, when the voltage $V_R$ which has been applied to the electrode 9 during the readout stage is returned to zero volt, the potential of the p region 6 is reverse biased as in the case before the voltage $V_R$ is applied. Therefore, as long as new light is not incident on the photosensor cell, the stored voltage Vp produced in response to the incident light can be maintained as it is. This means that when the above-described photosensor cell is used as a photoelectric converter, a novel function can be provided from the standpoint of system operation.

The time period during which the stored voltage Vp can be held in the p region 6 is extremely long and the maximum holding time is rather restricted by a dark current thermally produced in the depletion layer. This is because the photosensor cell is saturated by the dark current thermally produced. However, according to the above described photosensor cell of the present invention, the depletion layer extends in the low-impurity-concentration $n^-$ region 5 and the impurity concentration in the $n^-$ region 5 is as extremely low as $10^{12}-10^{14}$ cm$^{-3}$ so that the $n^-$ region 5 has excellent crystal properties. As a result, as compared with the MOS and CCD type image pickup devices, thermally generated electron-hole pairs are very few so that the dark current is also less as compared with the conventional devices. In other words, the photosensor cell of the above construction has a structure which essentially results in less dark current noise.

Next, the operation of refreshing the charge stored in the p region 6 will be described.

In the photosensor cell of the invention, as has been already described, charge stored in the p region 6 does not vanish in the readout stage. Therefore, in order to input new light information, a refresh operation for extinguishing the charge stored in the p region 6 is required. Simultaneously, the potential of the p region 6 which has been floated must be set to a predetermined negative potential.

Figure 5:
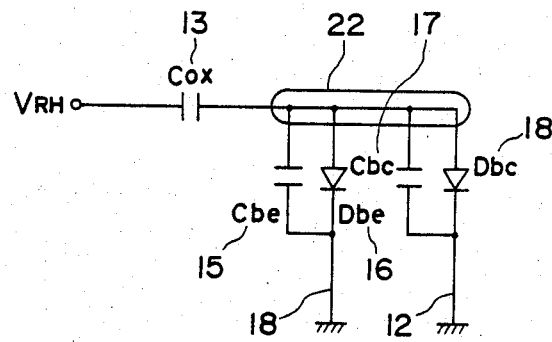

In the photosensor cell in accordance with the present invention, the refreshing operation is carried out by applying a positive voltage to the electrode 9 through the conductor 10 as in the readout operation. In this case, the emitter is grounded through the conductor 8. The collector is grounded or maintained at a positive potential through the electrode 12. FIG. 5 shows an equivalent circuit of the refresh operation in the case of the collector grounding.

When a positive voltage $V_{RH}$ is applied to the electrode 9 under these conditions, because of the capacitance division among the insulating film capacitance Cox 13, the base-emitter junction capacitance Cbe 15 and the base-collector junction capacitance Cbc 17, a voltage given by $$\frac{Cox}{Cox + Cbe + Cbc} V_{RH}$$

is instantaneously applied to the base 22 as in the readout operation previously explained. Because of this voltage, a base-emitter junction diode Dbe 16 and a base-collector junction diode Dbc 18 are both forward biased so that they are conducted and consequently a current flows through them. As a result, the base potential gradually decreases.

In this case, the variation of the potential V of the base which is maintained in the floating state can be approximately expressed by the following equation:

$$(Cox + Cbe + Cbc)\, dv/dt = -(i_1 + i_2)$$

where $$i_1 = Ab\left(\frac{q \cdot Dp \cdot p_{no}}{Lp} + \frac{q \cdot Dn \cdot n_{po}}{W_B}\right) \times$$

$$\left[\exp\left(\frac{q}{kT} V\right) - 1\right];$$

and

-continued $$i_2 = Ae \frac{q \cdot Dn \cdot n_{po}}{W_B} \times \left[ \exp\left(\frac{q}{KT} V\right) - 1 \right]$$

where
$i_1$: the current flowing through the diode Dbc;
$i_2$: the current flowing through the diode Dbe;
Ab: the area of the base;
Ae: the area of the emitter;
Dp: the diffusion constant of holes in the collector;
$p_{no}$: the concentration of holes in the collector which are in the thermally equilibrium state;
Lp: the mean free path of holes in the collector; and
$n_{po}$: the concentration of electrons in the base are in the thermally equilibrium state.

In connection with the current $i_2$, the current due to injection of holes from the base to the emitter is negligible because the impurity concentration in the emitter is sufficiently higher than that in the base.

The above-described equation is given based on the abrupt junction approximation, but the behavior in an actual device deviates from the abrupt junction. Furthermore, because the width of the base is shallow and the impurity profile is complicated, the above-described equation does not strictly hold, but the refresh operation can be sufficiently explained thereby with a fair approximation.

Of the current $i_1$ flowing between the base and collector, the component $q.Dp.p_{no}/Lp$ represents a current due to holes, i.e., a component due to holes flowing from the base to the collector. In order to facilitate the flow of current due to holes, in the photosensor cell of the above construction, the impurity concentration in the collector is designed to be relatively lower than that of a conventional bipolar transistor.

FIG. 6 shows some examples of the time-dependency of the base potential obtained from the above-described equation. The abscissa represents a time period having elapsed from the instant when the refreshing voltage $V_{RH}$ is applied to the electrode 9, that is, the refreshing time, while the ordinate represents the base potential. The initial potential of the base is used as a parameter. The initial potential of the base is the potential of the base which is maintained in the floated state at the instant when the refreshing voltage $V_{RH}$ is applied and is determined by the refreshing voltage $V_{RH}$, the capacitance Cox, Cbe and Cbc and the charge stored in the base.

It is seen from FIG. 6 that the base potential is not dependent upon the initial potential and drops linearly after a certain time when the base potential is plotted versus the refreshing time on a semilogarithmic scale.

Figure 6A:
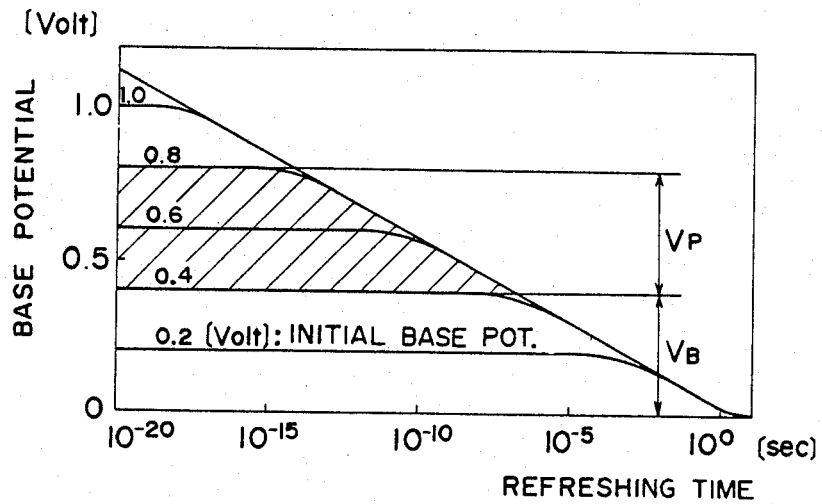
FIGS. 6(a) and 6(b) are graphs each showing the relationship between the refreshing time and the base potential.
Figure 6B:
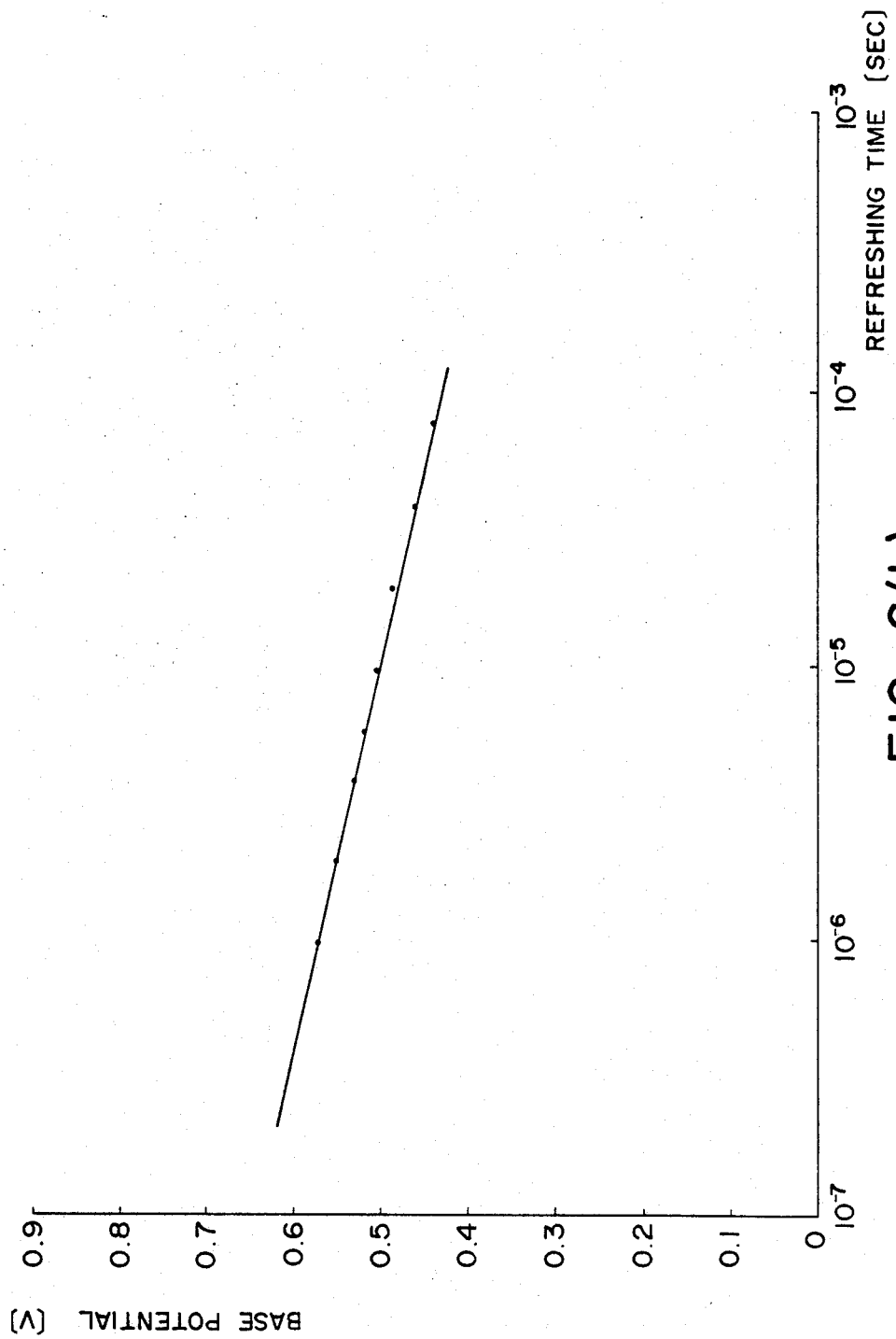

FIG. 6(b) shows an experimental relationship between the refreshing time and the base potential. As compared with FIG. 6(a) showing calculated data, the experimental data does not coincide with the former in terms of values themselves because of the device used in the experiments was considerably large in dimension, but it has been proved that the base potential varies linearly with respect to time when the data obtained in the experiments were plotted on a semilogarithmic scale. The data obtained by the experiments show the values when both the collector and emitter were grounded.

It is now assmed that the maximum stored voltage due to light irradiation is 0.4V and that the voltage V applied to the base because of the appliation of the refreshing voltage $V_{RH}$ is 0.4V. Then, the maximum value of the initial potential of the base becomes 0.8V as shown in FIG. 6(a) and about $10^{-15}$ sec. after the refreshing voltage $V_{RH}$ is applied, the base potential starts to drop linearly. After $10^{-5}$ sec., the base potential varies coinciding with the potential variation where no light falls on the photosensor cell, that is, the potential variation where the initial base potential is 0.4V.

There are two methods for applying a positive voltage to the p region 6 for a predetermined time period through the MOS capacitor Cox and then removing the positive voltage so that the p region 6 is charged negatively. According to one method, the negative charge is stored because holes having a positive charge flow from the p region 6 mainly into the n region 1 which is grounded. In order that the holes may flow unidirectionally from the p region 6 into the n region 1 and that the flow of electrons from the n region 1 into the p region may be prevented, the impurity concentration in the p region 6 is made higher than that in the n region 1. According to the other method, the negative charge may be stored in the p region 6 because electrons from the n+ region 7 and the n region 1 flow into the p region 6 and recombine with holes therein. In this case, the impurity concentration in the n region 1 is made higher than that in the p region 6. The operation in which the negative charge is stored because of the flow of holes from the p region 6 is by far faster than the operation in which the negative charge is stored because electrons flow into the p region 6 and recombine with holes therein. However, according to our experiments conducted so far, it has been confirmed that even the refreshing operation by injecting the electrons into the p region 6 has a sufficiently fast response with respect to the operation of the photoelectric converter.

When a plurality of photosensor cells of the above construction are arranged in X and Y directions so as to provide a photoelectric converter, the storage voltages Vp vary in the range between 0 and 0.4V as described above in respective sensor cells. However, $10^{-5}$ sec after the refreshing voltage $V_{RH}$ is applied, the constast voltage of the order of about 0.3V remains at the bases of all photosensor cells, but the variations in storage voltage Vp due to pictorial image all disappear. Thus, with respect to the photoelectric converter consisting of photosensor cells of the above construction, there are two refreshing modes. One is the complete refreshing mode in which the base potentials of all the photosensor cells are brought to zero volt (In this case, it takes 10 seconds in the example as shown in FIG. 6(a).). The other is a transient refreshing mode in which even though a certain base potential remains, varying components due to the storage voltage Vp disappear. (In this case, a refreshing pulse of 10 microseconds to 10 seconds is applied in the example as shown in FIG. 6(a).). In the examples explained so far, the voltage V applied to the base due to the refreshing voltage $V_{RH}$ has been described as being 0.4V, but if this voltage $V_{RH}$ is 0.6V, the transient refreshing mode is accomplished within one nanosecond in the case of the example as shown in FIG. 6(a). Thus, it is understood that the refreshing operation can be carried out at a remarkably high speed. Whether the complete refreshing mode or the transient refreshing mode is employed is dependent upon the use or purpose of a photoelectric converter.

It is assumed that the voltage remaining at the base in the transient refreshing mode is Vk. Then, during the transient state in which the refresh voltage $V_{RH}$ is returned to zero volt after it has been applied, the negative voltage given by $$-\frac{Cox}{Cox + Cbe + Cbc} V_{RH}$$

is applied to the base so that the base potential after the refreshing operation in response to a refresh pulse becomes $$Vk - \frac{Cox}{Cox + Cbe + Cbc} V_{RH}$$

and consequently the base is reverse biased with respect to the emitter.

In the previous explanation of the storage operation in which the carriers excited by the incident light are stored, the storage operation has been described as being carried out while the base is reverse biased. According to the above-described refreshing operation, however, not only the refresh operation but also the operation for reverse biasing the base are performed simultaneously.

Figure 6C:
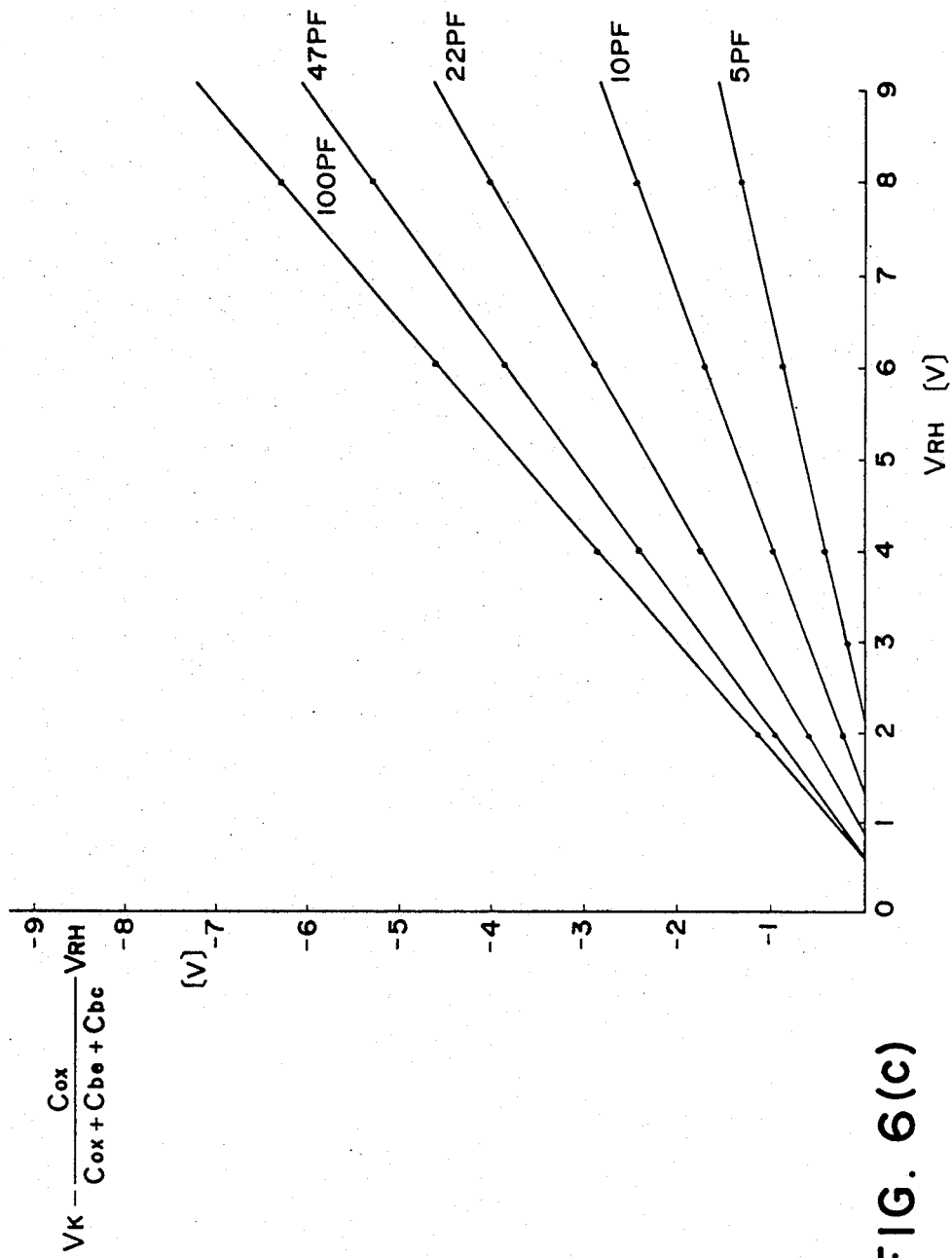
FIG. 6(c) is a graph showing the relationship between the refreshing voltage and the base potential.

FIG. 6(c) shows experimental data for the base potential after the refreshing operation versus the refreshing voltage $V_{RH}$ satisfying the relationship given by $$Vk - \frac{Cox}{Cox + Cbe + Cbc} V_{RH}.$$

Cox is taken as a parameter varying from 5 pF to 100 pF. The dots represent the experimental results while the solid lines indicate the values obtained by the following expression:

$$Vk - \frac{Cox}{Cox + Cbe + Cbc} V_{RH}.$$

Herein, Vk=0.52V and Cbc+Cbe=4 pF. Further, the capacitance of the probe of an observation oscilloscope was connected in parallel with the capacitance Cbc+Cbe. Thus, the calculated values and the experimental results exactly coincide with each other and the refeeshing operation has been confirmed by the experiments.

So far, the refreshing operation has been described with reference to a case where the collector is grounded as shown in FIG. 5, but it is to be understood that the refreshing operation can also be carried out under the state where the collector is maintained at a positive potential. In the latter case, when a refreshing pulse is applied to the base-collector junction diode Dbc 18, if the positive potential applied to the collector is higher than the potential applied to the base in response to the application of this refreshing pulse, the nonconduction state remains so that the current flows only through the base-emitter junction diode Dbe 16. Therefore, the decay of the base potential becomes slower, but the operation which is basically the same as the operation described hereinbefore is carried out.

More specifically, the relationship between the refreshing time and the base potential as shown in FIG. 6(a) changes in such a way that the oblique straight line indicating the potential drop is shifted to the right, i.e. in a direction to lengthen the refresh time. As a result, when the same refreshing voltage $V_{RH}$ is used as in the case where the collector is grounded, the refreshing time is increased, but when the refreshing voltage is increased slightly, the high-speed refreshing operation becomes possible as in the case where the collector is grounded.

So far, the fundamental operation of the photosensor cell of the above construction comprising the charge storage operation in response to the incident light, the readout operation and the refresh operation has been described.

As described above, the fundamental construction of the photosensor cell in accordance with the present invention is by far simpler as compared with those of the semiconductor image pickup devices of the types disclosed in Japanese Patent Application Laid-Open Nos. 56-150878, 56-157073 and 56-165473 described hereinbefore, and can satisfactorily be adapted to a higher resolution required in the future. In addition, the photosensor cell of the above construction retains such advantages as the low noise, high output, wide dynamic range and nondestructive readout of the disclosed devices.

Next, one embodiment of the photoelectric converter in accordance with the present invention in which the unit photosensor cells of the above-described construction are arranged two-dimensionally will be described with reference to the accompanying drawings.

Figure 7:
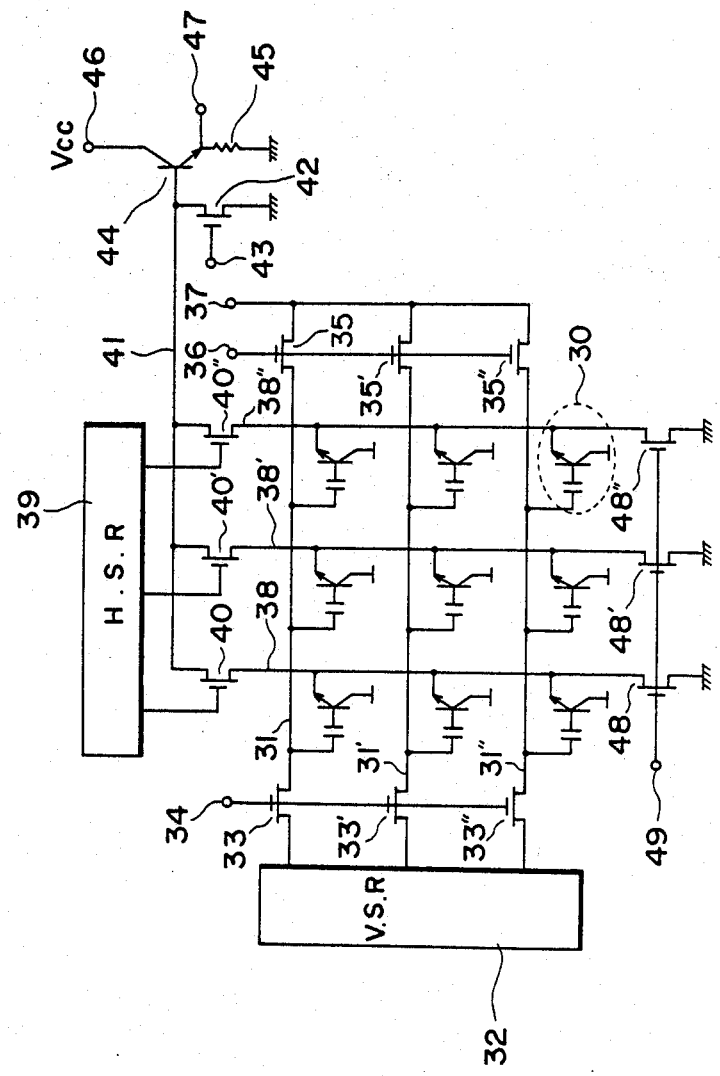
FIG. 7 is a circuit diagram of a photoelectric converter consisting of a plurality of photosensor cells of the type as shown in FIG. 1.

FIG. 7 shows a circuit diagram of a photoelectric converter in which the unit photosensor cells are arranged two-dimensionally in 3×3 units.

The photoelectric converter shown in FIG. 7 comprises unit photosensor cells, one of which is surrounded by the dotted line and designated by a reference numeral 30 (the collector of each bipolar transsitor being shown as connected to a substrate and a substrate electrode); horizontal lines 31, 31' and 31" to which are applied refresh and readout pulses; a vertical shift register generating readout pulses; buffer MOS transistors 33, 33' and 33" interconnected between the vertical shift register 32 and the horizontal lines 31, 31' and 31", respectively; a terminal 34 for applying a gate pulse to the gates of the buffer MOS transistors 33, 33' and 33"; buffer MOS transistors 35, 35' and 35" for applying refresh pulses; a terminal 36 for applying a pulse to the gates of these buffer MOS transistors 35, 35' and 35"; a terminal 37 for applying refreshing pulses; vertical lines 38, 38' and 38" for reading out the stored voltages from the fundamental photosensor cells; a horizontal shift register 39 for generating pulses so as to select the vertical lines 38, 38' and 38"; MOS gate transistors 40, 40' and 40" for turning on and off the vertical lines 38, 38' and 38"; an output line 41 for reading the stored voltage out to an amplifier; a MOS transistor 42 for refreshing the charge stored on the output line 41 after the readout operation; a terminal 43 for applying a refreshing pulse to the MOS transistor 42; a transistor 44 such as a bipolar transistor, MOS transistor, FET or J-FET transistor for amplifying the output signal; a load resistor 45; a terminal 46 for interconnecting a power supply and the transistor 44; an output terminal 47 of the transistor 44; MOS transistors 48, 48' and 48" for refreshing the charge stored on the vertical lines 38, 38' and 38" during the readout operation; and a terminal 49 for applying a pulse to the gates of the MOS transistors 48, 48' and 48".

The operation of the photoelectric converter will be described by referring to FIG. 7 and a pulse timing chart shown in FIG. 8(a).

Figure 8A:
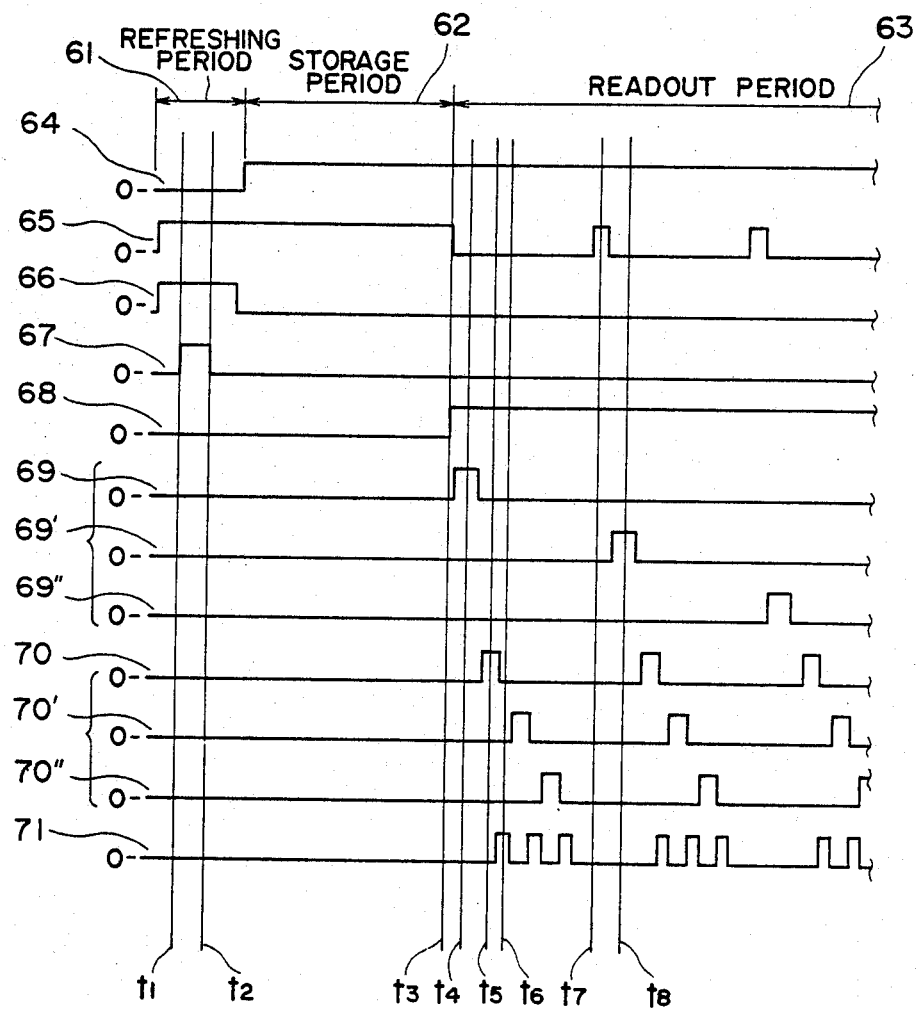
FIG. 8(a) is a pulse timing diagram used to explain the mode of operation thereof.

In FIG. 8(a), the period 61 corresponds to the refreshing operation; the period 62, the storage operation; and the period 63, the readout operation.

At time $t_1$, the substrate potential, that is, the collector potential 64 of the photosensor cell is maintained at the ground potential or a positive potential. FIG. 8(a) shows a case where the collector potential 64 is at the ground potential. Regardless of whether the collector potential 64 is grounded or maintained at a positive potential, the fundamental mode of operation remains unchanged except that the refreshing time changes as described before. The potential 65 of the terminal 49 is maintained at a high level so that the MOS transistors 48, 48' and 48'' are conducted or turned on and consequently each emitter of photosensor cell is grounded through the vertical lines 38, 38' and 38''. A voltage shown by a waveform 66 is applied to the terminal 36 so that the buffer MOS transistors 35, 35' and 35'' for overall refreshing of the whole frame or picture are turned on. When a pulse shown by a waveform 67 is applied to the terminal 37 under these conditions, a voltage is applied through the horizontal lines 31, 31' and 31'' to the bases of the photosensor cells so that the refreshing operation is initiated as described hereinbefore. Therefore, the previously stored charge is refreshed in accordance with the complete refresh mode or the transient refreshing mode. Whether the complete refreshing mode or the transient refreshing mode is carried out, is dependent upon the pulse width of the waveform 67.

At time $t_2$, as described hereinbefore, the base of the transistor of each photosensor cell is reverse biased with respect to the emitter and the storage period 62 commences. In the refresh period 61, as shown in FIG. 8(a), all the pulses except for those described above are maintained at low levels.

In the storage operation period 62, the substrate potential, i.e., the collector potential of the transistor is rendered a positive potential as indicated in a waveform 64 in FIG. 8(a), whereby the electrons of the electron-hole pairs produced in response to the incident light are caused to flow immediately into the collector. That the collector potential is maintained at a positive potential is not an essential condition because when the photoelectric converter is used for picking up images, the base is reverse biased with respect to the emitter, that is, maintained at a negative potential. Therefore, the fundamental mode of storage operation remains unchanged even if the collector potential is grounded or maintained slightly at a negative potential.

In the storage operation, the potential 65 of the gate terminal 49 of the MOS transistors 48, 48' and 48'' is maintained at a high level as in the refreshing period so that the MOS transistors are kept turned on. As a result, the emitters of the photosensor cells are grounded through the vertical lines 38, 38' and 38''. As the holes are stored in the base and the base is saturated due to irradiation of high intensity light, i.e., as the base potential is forward biased with respect to the emitter potential (ground potential), the holes flow through the vertical lines 38 38' and 38''. Consequently, variation in base potential is interrupted and the base potential is clipped. It follows therefore that even when the emitters of the photosensor cells disposed adjacent to each other in the vertical direction are connected to the vertical lines 38, 38' and 38'' in common, no blooming phenomenon occurs as the vertical lines 38, 38' and 38'' are grounded as described above.

The blooming phenomenon may also be obviated in a different way as follows. First, the MOS transistors 48, 48' and 48'' are turned off so that the vertical lines 38, 38' and 38'' are floated. The substrate potential or the collector potential 64 is maintained at a slightly negative potential so that when the base potential is raised to a positive potential due to the storage of holes, the holes are caused to flow into the collector rather than into the emitter.

At time $t_3$, the readout operation period 63 commences following the storage period 62. At the time $t_3$, the potential 65 at the gate terminal 49 of the MOS transistors 48, 48' and 48'' is rendered low while the potential at the gate terminal 34 of the buffer MOS transistors 33, 33' and 33'' is rendered high so that the MOS transistors 33, 33' and 33'' are turned on. It should be noted, however, that it is not essential to bring the potential 68 of the gate terminal 34 to a high level at time $t_3$ and that the potential 68 may be raised to a high level at any time prior to $t_3$.

At time $t_4$, of the output signals from the vertical shift register 32, one connected to the horizontal line 31 rises to a high level as indicated by the waveform 69 in FIG. 8(a), whereby the information is read out from the three photosensor cells connected to the horizontal line 31. This readout operation is conducted as has been explained before. That is, the signal voltages produced by the signal charges stored in the base regions of the respective photosensor cells directly appear at the vertical lines 38, 38' and 38''. In this case, the pulse width of the pulse voltage from the vertical shift register 32 is so determined that, as shown in FIG. 4, the readout voltage with respect to the storage voltage may have a sufficient linearity. Furthermore, as described hereinbefore the pulse voltage is forward biased with respect to the emitter by a value $V_{bias}$.

At time $t_5$, of the outputs from the horizontal shift register 39, one to the gate of the MOS transistor 40 connected to the vertical line 38 is raised to a high level as indicated by the waveform 70 in FIG. 8(a) so that the MOS transistor. 40 is turned on, whereby the output signal is applied to the output transistor 44 through the output line 41, amplified and derived from the output terminal 47. After the signal has been read out in the manner described above, as the signal charge remains on the output line 41 due to the conductor capacitance, a pulse as shown by waveform 71 is applied to the gate terminal 43 of the MOS transistor 42 at time $t_6$ so that the latter is turned on and consequently the output line is grounded, whereby the remaining signal charge is refreshed. In like manner, the switching MOS transistors 40' and 40'' are sequentially turned on so that the signal outputs are readout from the vertical lines 38' and 38''. After the signals have been read out from the photosensor cells along one horizontal line in the manner described above, some signal charges remain on the vertical lines 38, 38' and 38'', as in the case of the output line 41, due to their capacitances. Therefore, the potential at the gate terminal 49 is raised to a high level as indicated by the waveform 65 so that the MOS transistors 48, 48' and 48'' connected to the vertical lines 38, 38' and 38'', respectively, are turned on and consequently the remaining signal charges are refreshed.

At time $t_8$, of the outputs from the vertical shift register 32, the output transmitted to the horizontal line 31' is raised to a high level as indicated by the waveform 69' in FIG. 8(a) so that the storage voltages of the photosensor cells connected to the horizontal line 31' are read out to the vertical lines 38, 38' and 38", respectively. Therefore, the signal is derived from the output terminal 47 in a manner substantially similar to that described above.

So far, the mode of operation has been described with reference to a field of application where the storage period 62 and the readout period 63 are distinctly distinguished from each other such as a still mode of a video device whose research and development have been recently extensively carried out, but the photoelectric converter in accordance with the present invention may be equally applied to the field where the operation in the storage period 62 and the operation in the readout period 63 are simultaneously carried out if the pulse timing as shown in FIG. 8(a) is modified. In the latter case, however, the refreshing operation is not the overall refreshing of the whole picture but a line-by-line refreshing operation is required. For instance, after the signals from the photosensor cells connected to the horizontal line 31 have been read out, the MOS transistors 48, 48' and 48" are turned on at time $t_7$ in order to refresh the charges remaining on the vertical lines 38, 38' and 38". At this time, a refreshing pulse is applied to the horizontal line. That is, the refreshing operation of each line can be accomplished by employing a vertical shift register which is adapted to generate a pulse at $t_7$ as well as at $t_4$ in the waveform 69, the voltage and the pulse width of the pulse generated at $t_7$ being different from those of the pulse generated at $t_4$. Alternatively, the refreshing operation of each line can be accomplished in the manner described below. That is, instead of the device shown at the right side in FIG. 7 for applying the overall refreshing pulse, a second vertical shift register is disposed on the right side and caused to operate in different timing relationship with the vertical shift register 32 on the left side.

In this case, the degree of freedom for suppressing blooming by controlling the potentials at the emitter and collector of each photosensor cell is decreased. However, as described in conjunction with the fundamental mode of operation, the photosensor cell according to the invention is so constructed that the high-speed readout operation can be carried out only when the bias voltage $V_{bias}$ is applied to the base. Therefore, as is clear from the graph as shown in FIG. 3, the signal charges flowing into the vertical lines 38, 38' and 38" because of the saturation of the photosensor cells are extremely small in amount when no bias voltage $V_{bias}$ is applied, whereby the blooming phenomenon hardly occurs.

Furthermore, the photoelectric converter in accordance with this embodiment has an excellent capability of suppressing the smearing phenomenon. The smearing is caused in the CCD type image pickup devices, especially in the frame transfer type image pickup device, because of the mode of operation and construction where the charge is transferred over the illuminated area. In the case of the interline image pickup devices, the smearing is caused because carriers which have been produced at a deep portion of a semiconductor due to light rays having relatively long wavelengths are accumulated in a charge transfer area. Furthermore, in the case of the MOS image pickup devices, the smearing occurs because the carriers which have been produced at a deep portion of a semiconductor due to light rays having relatively long wavelengths are accumulated on the drain side of a MOS switching transistor connected to each photosensor cell.

In contrast to the above, in the case of the photoelectric converter in accordance with the present invention, the smearing caused due to the mode of operation and structure can be substantially eliminated. Furthermore, the smearing does not substantially occur at all due to carriers produced and accumulated at a deep portion of a semiconductor in response to light rays having relatively long wavelengths. On the other hand, some people may be concerned about a phenomenon that electrons among electrons and holes produced in the emitter in the vicinity of the surface of the photosensor cell are accumulated. However, such a phenomenon cannot actually be a cause of the smearing because, in the case of the storage operation according the overall refresh mode, the emitter is grounded so that no electron is accumulated.

Furthermore, in the case of the line refreshing operation adapted for ordinary television cameras, the vertical lines are grounded for refreshing during the horizontal blanking period prior to the readout of the stored voltages to the vertical lines, whereby the electrons which have been stored or accumulated at the emitter during one horizontal scanning period are almost flown out so that the smearing can be substantially eliminated. As described above, according to the photoelectric converter of this embodiment, because of the mode of operation and construction thereof, the smearing can only occur to a substantially negligible extent. This is one of the important advantages of the photoelectric converter in accordance with the present invention.

The operation for suppressing blooming phenomenon by controlling the emitter and collector potentials in the storage operation has been described and the operation can also be used to control the gamma ($\gamma$) characteristic.

More specifically, during the storage operation, the emitter or collector potential is temporarily maintained at a predetermined negative potential so that, of the carriers stored in the base, the holes which are stored in excess of the number of carriers giving the negative potential are caused to flow into the emitter or collector. Then, the relationship between the stored voltage and the quantity of incident light becomes such that when the quantity of incident light is small, it is close to the characteristic of $\gamma=1$, of a silicon crystal and that when the quantity of incident light is large, the gamma ($\gamma$) becomes less than unit. Therefore, the photoelectric converter in accordance with the present invention can have the characteristic of $\gamma=0.45$ which is demanded by ordinary television cameras, according to the line-segment approximation. When the above-described operation is carried out once during the storage operation, two-line-segment approximation can be obtained. When the negative potential applied to the emitter or collector is changed twice, the three-line-segment approximation type gamma characteristic can be obtained.

In the above example, the silicon substrate is used as a common collector but, as in the case of a bipolar transistor, a buried n+ region may be provided so that each line has its own collector.

In addition to the pulses shown in FIG. 8(a), clock pulses for driving the vertical shift register 32 and the horizontal shift register 39 are required for practical operation.

Figure 9:
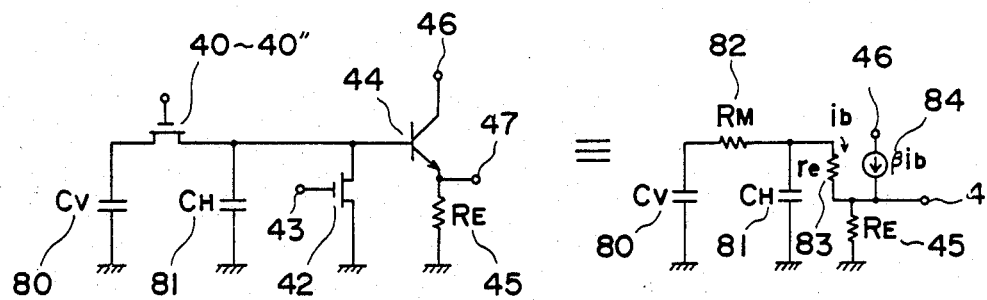
FIG. 9 shows an equivalent circuit used to explain how an output signal is derived.

FIG. 9 shows equivalent circuits for deriving the output signal. The capacitance $C_V$ 80 represents the sum of the capacitance of the vertical lines 38, 38' and 38" and the capaticance $C_H$ 81 represents the conductor capacitance of the output line 41. The right-side equivalent circuit in FIG. 9 shows the readout stage when the MOS switching transistors 40, 40′ and 40″ are turned on and the resistance thereof in the state of turning on is represented by a resistor $R_M$ 82. The amplifier transistor 44 is represented by an equivalent circuit consisting of a resistor $r_e$ 83 and a current source 84. In the readout stage, the MOS transistor 42 for refreshing the stored charge due to the conductor capacitance of the output line 41 remains turned off and since it has a high impedance, it is not shown in the right-side equivalent circuit.

Parameters used in the equivalent circuit are determined depending upon the size of a photoelectric converter actually used. Calculated waveforms of the output signals derived from the output terminal 47 are shown in FIG. 10 based on the assumption that the capacitance $C_V$ 80 is about 4 pF; the capacitance $C_H$ 81 is about 4 pF; the resistance $R_M$ 82 of the turned-on MOS transistor is 3K ohms; and the current amplification factor $\beta$ of the bipolar transistor 44 is about 100.

Figure 10:
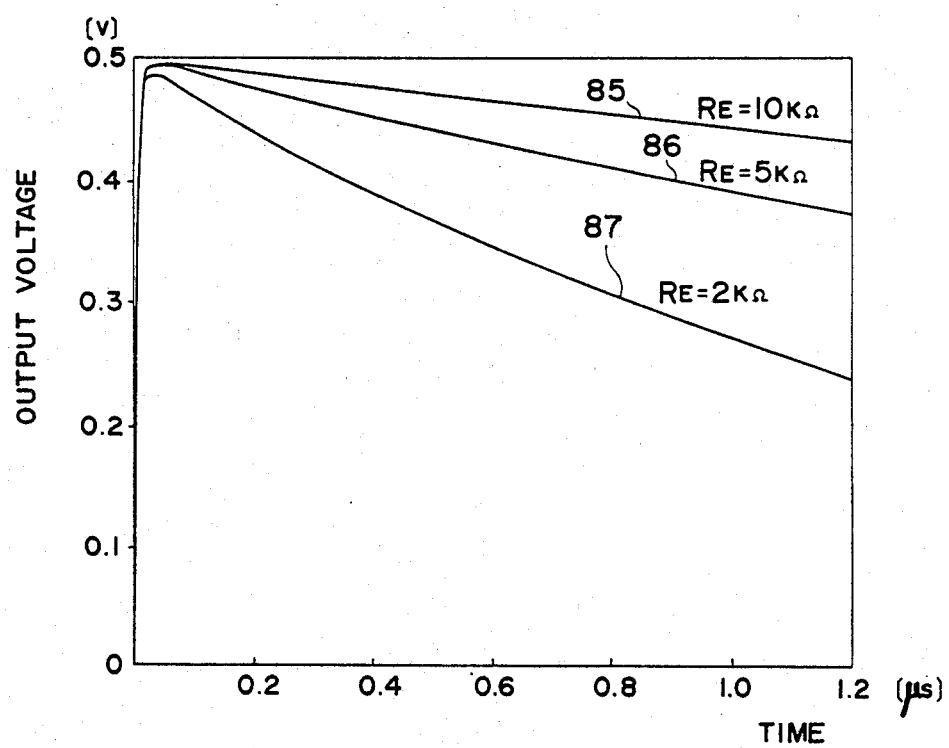

In FIG. 10, the abscissa represents the time in microsecond from the instance when the MOS switching transistors 40,40′ and 40″ are turned on while the ordinate represents the output voltage [V] derived from the output terminal 47 when one volt is applied across the conductor capacitance $C_V$ 80 of the vertical lines 38, 38′ and 38″ due to readout of the signal charge from each photosensor cell.

The output signal waveform 85 is obtained when the load resistor $R_E$ 45 is 10 kiloohms; the waveform 86 is obtained when the load resistance $R_E$ 45 is 5 kiloohms; and the waveform 87 is obtained when the load resistor $R_E$ 45 is 2 kiloohms. They have the peak values of the order of 0.5V because of the capacitance division of the capacitance $C_V$ 80 and $C_H$ 81. As a matter of course, the larger the value of the load resistor $R_E$ 45 is, the lesser the attenuation becomes. Thus, it is preferable that in order to obtain a desired output waveform the load resistor $R_E$ 45 has a large value. With the above-described parameters, the rise time is as short as of the order of about 20 nanoseconds. The readout time can be further shortened by decreasing the resistance $R_M$ under the state where the MOS switching transistors 40, 40′ and 40″ are turned on, and by decreasing the conductor capacitances $C_V$ and $C_H$.

In the photoelectric converter of the type described above, a high output voltage is obtained because each photosensor cell has an amplification function so that the final stage amplifier can be made simple in construction as compared with the one in the conventional MOS type image pickup device. So far, only one bipolar transistor is used, but it is apparent that two bipolar transistors or any other suitable systems may be used. When a bipolar transistor is used as in the case of this embodiment, the problem of 1/f noise which is caused from the final stage MOS transistor amplifier of the conventional CCD image pickup device and which is readily noticeable on the image can be substantially solved. As a result, an image quality with a high S/N ratio can be obtained by the photoelectric converter of this embodiment.

As described above, in the photoelectric converter consisting of a plurality of photosensor cells in accordance with the present invention, the final stage amplifier may be very simple in construction so that, in addition to the photoelectric converter of the type in which only one amplifier is arranged at the final stage as shown in FIG. 7, a plurality of amplifiers may be disposed in such a way that one picture frame may be divided into a plurality of sections which may be read out separately.

Figure 11:
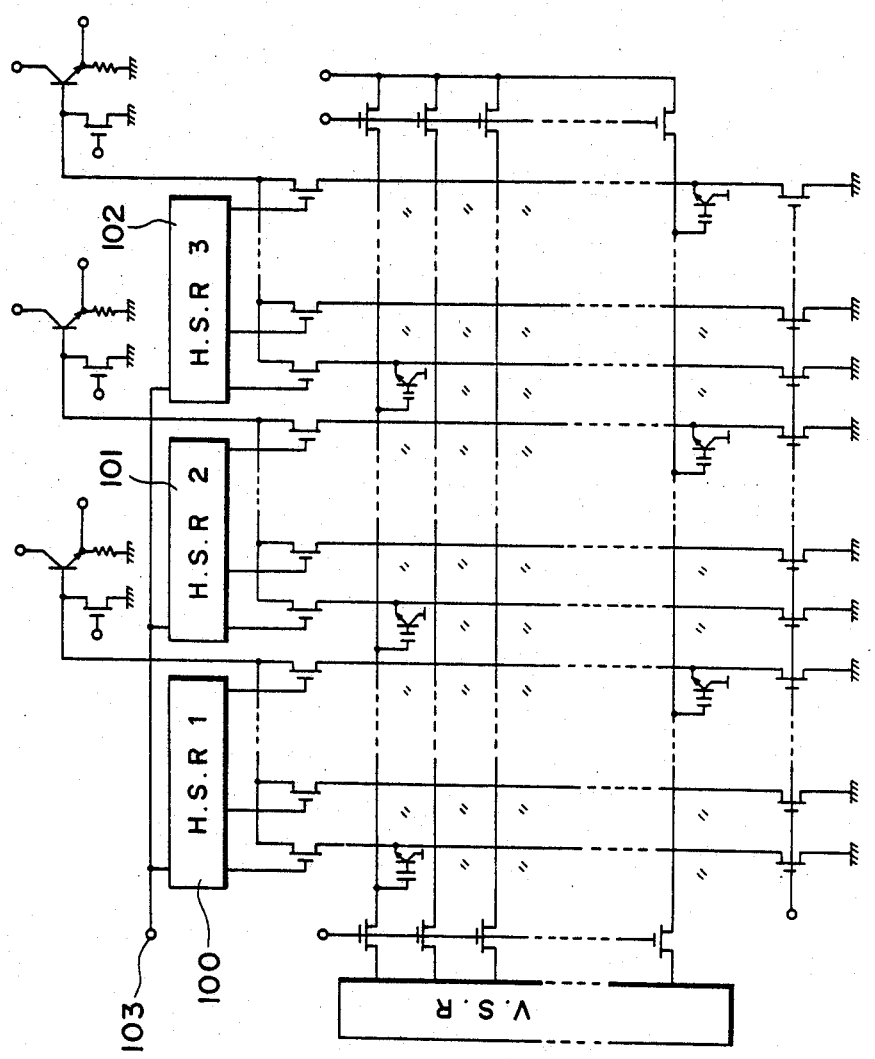
FIGS. 11, 12 and 13 show circuit diagrams, respectively, of photoelectric converters which are modifications of the photoelectric converter as shown in FIG. 7.

FIG. 11 shows an example of a multiple or divisional readout system in which a photoelectric converter is divided into three sections in the horizontal direction and three final-stage amplifiers are disposed. The fundamental mode of operation of this embodiment is substantially the same as that of the embodiment described in detail with reference to FIG. 7 and FIG. 8(a), but in the embodiment shown in FIG. 11, three equivalent horizontal shift resistors 100, 101 and 102 are provided. When a starting pulse is applied to a terminal 103 so as to apply it to the horizontal shift registers 100, 101 and 102, the outputs of the photosensor cells connected to the first column, the (n+1)-th column and the (2n+1)-th column (where n is an integer and in this embodiment, the number of 3n picture elements or pixels are arranged in each horizontal row.) can be simultaneously read out. In the next step, the second, (n+2)-th and (2n+2)-th columns are read out.

According to this embodiment, when a time period required for reading out one horizontal line is fixed, the horizontal scanning frequency required becomes ⅓ as compared with the system in which only one finalstage amplifier is disposed. As a result, the horizontal shift registers can be made simple in fabrication. Another great advantage of the multiple readout system is that even when the analog output signal from the photoelectric converter is converted into a digital signal and the digital signal is further processed, a high-speed analog-to-digital converter need not be used.

In the embodiment as shown in FIG. 11, three equivalent horizontal shift registers are provided, but the same function can be accomplished with only one horizontal shift register as will be described below with reference to FIG. 12.

Figure 12:
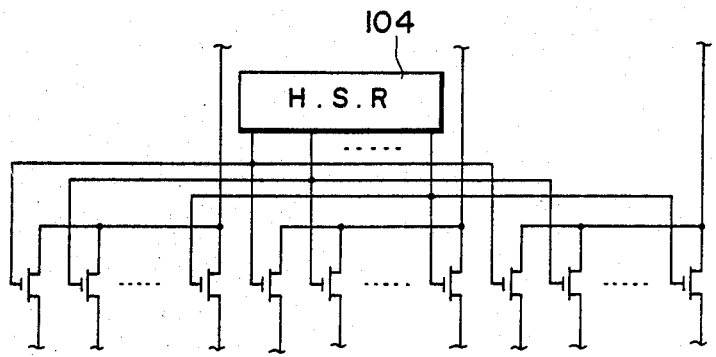

In FIG. 12, among the members also contained in the embodiment of FIG. 11, only horizontal switching MOS transistors and an intermediate portion of a final stage amplifier are shown because the other arrangements are substantially the same as those of the embodiment shown in FIG. 11.

In the embodiment shown in FIG. 12, the output from one horizontal shift register 104 is applied to the gates of the switching MOS transistors of the first column, the (n+1)-th column and the (2n+1)-th column so that these lines are simultaneously read out. In the next step, the second, the (n+2)-th and the (2n+2)-th columns are simultaneously read out.

According to this embodiment, the readout operation can be carried out with only one horizontal shift register even though the number of line connected to the gates of the switching MOS lines transistors is increased.

In the embodiments as shown in FIGS. 11 and 12, three output amplifiers are provided, but the number of output amplifiers can be further increased as desired in view of the object.

In FIGS. 11 and 12, the start pulses and the clock pulses to be applied to the horizontal and vertical shift registers are not shown and these pulses may be supplied from a clock pulse generator disposed on the same chip or on another chip as is the case of the refreshing pulses.

When the line refreshing operation or the frame refreshing operation is carried out in the multiple readout system of the type described above, the storage time of the photosensor cells of the n-th column is slightly different from the storage time of the photosensor cells of the (n+1)-th column. As a result, slight discontinuity of the dark current component and the signal component can occur and can be observed on the picture image. However, in practice, the quantity of discontinuity is extremely small so that no problem arises. Even when discontinuity exceeds a tolerable level, an external circuit may be used so as to compensate it in a simple manner by using a conventional compensation technique which comprises generating a sawtooth waveform, subtracting it from the dark current component and multiplying or dividing it with the signal component.

When the photoelectric converter in accordance with the present invention is used to pick up a color image, a stripe or mosaic filter may be integrally formed over the chip of the photoelectric converter or a separate filter may be bonded to the photoelectric converter so that the color signals may be obtained.

Figure 13:
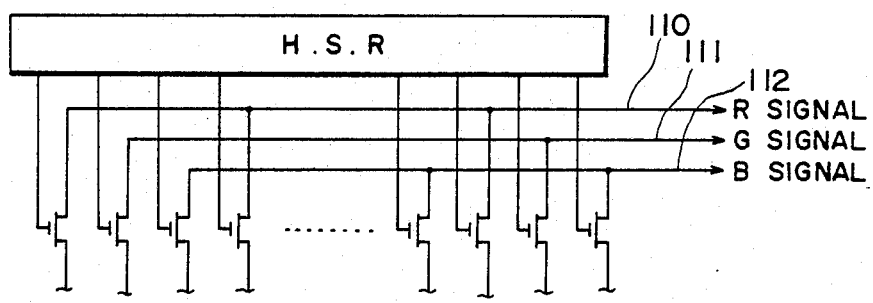

For instance, when an R-G-B stripe filter is used, the R, G and B signals can be derived from separate final stage amplifiers as shown in an embodiment of FIG. 13. As is the case of FIG. 12, FIG. 13 only shows a horizontal shift register and its associated parts and other arrangements are substantially similar to those shown in FIGS. 7 and 11. It is assumed that the first column is provided with an R color filter; the second column is provided with a G color filter; the third column is provided with a B color filter; the fourth column is provided again with an R filter and so on. As shown in FIG. 13, the vertical lines in the first, fourth, seventh and so on columns are connected to an output line 110 so that the R signal may be derived therefrom. The vertical lines of the second, fifth, eighth and so on columns are connected to an output line 111 so as to derive the G signal. In like manner, the third, sixth, nineth and so on columns are connected to an output line 112 so that the B signal may be derived. These output lines 110, 111 and 112 are connected to refreshing MOS transistors and final-stage amplifiers such as emitter-follower provided on the same chip, whereby respective color signals can be derived.

Figure 14:
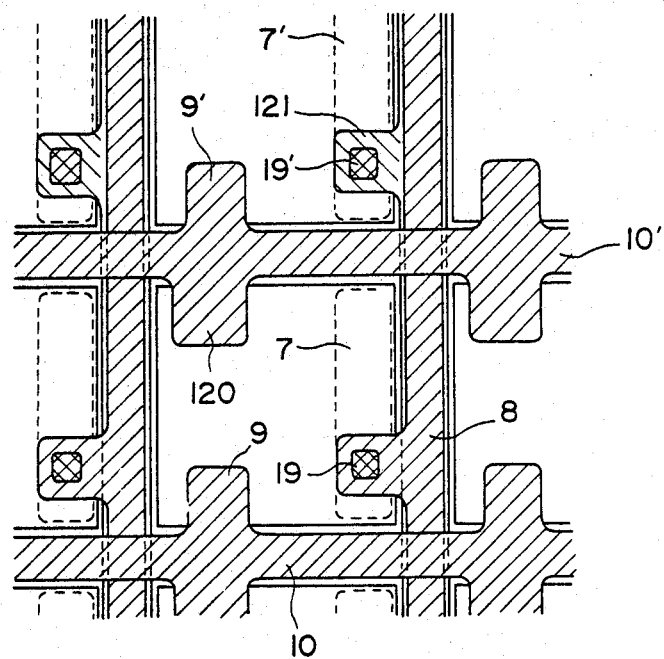
FIG. 14 is a plan view of a photosensor cell which is a modification of the photosensor cell shown in FIG. 1.
Figure 15A:
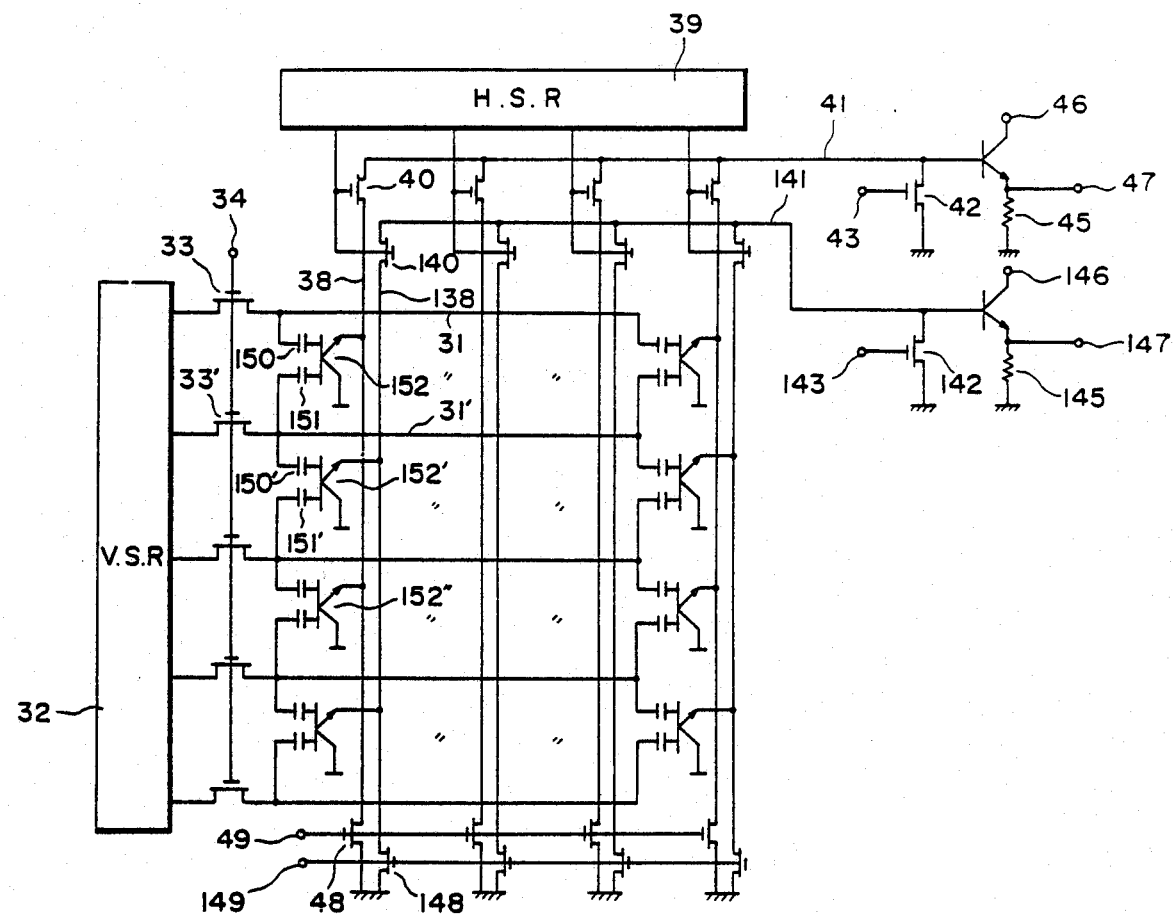
FIG. 15, consisting of FIGS. 15(a) and 15(b) is a circuit diagram of a photoelectric converter consisting of photosensor cells as shown in FIG. 14.

Referring next to FIG. 14, the fundamental construction and the mode of operation of another embodiment of the photosensor cell in accordance with the present invention which can be used to construct a photoelectric converter will be described. FIG. 15(a) shows a whole circuit of a photoelectric converter comprising a plurality of photosensor cell of the type as shown in FIG. 14, some of which are shown by equivalent circuits thereof.

According to the photosensor cell shown in FIG. 14, the readout operation and the line refreshing operation can be carried out simultaneously with the same scanning pulse. While the embodiment shown in FIG. 1 has only one MOS capacitor electrode 9 connected to the horizontal line 10, in the embodiment shown in FIG. 14, a MOS capacitor electrode 120 is also connected to the horizontal line 10 and extends into a photosensor cell provided contiguously below the photosensor cell in question. As a result, one photosensor cell is of a double capacitor construction. The embodiment shown in FIG. 14 is further different from the embodiment shown in FIG. 1 in that the emitters 7 and 7' of the vertically adjacent photosensor cells are respectively and alternately connected to the conductor 8 and 121 forming two layers. (FIG. 14 may appear to show only one vertical line, but that two lines are disposed and isolated from each other with an insulating layer therebetween.) That is, the emitter 7 is connected through a contact hole 19 to the conductor 8 while the emitter 7' is connected through a contact hole 19' to the conductor 121.

These arrangements will become more apparent when reference is made to an equivalent circuit shown in FIG. 15(a). More particularly, a MOS capacitor 150 connected to the base of a photosensor cell 152 is connected to a horizontal line 31 and a MOS capacitor 151 is connected to a horizontal line 31'. A MOS capacitor 150' of a photosensor cell 152' which is disposed immediately below the photosensor cell 152 is also connected to the horizontal line 31'.

The emitter of the photosensor cell 152 is connected to a vertical line 38 and the emitter of the photosensor cell 152' is connected to a vertical line 138. The emitter of a photosensor cell 152" is connected again to the vertical line 38. In this manner, the emitters of the photosensor cells in one column are alternately connected to the vertical lines 38 and 138.

Figure 15B:
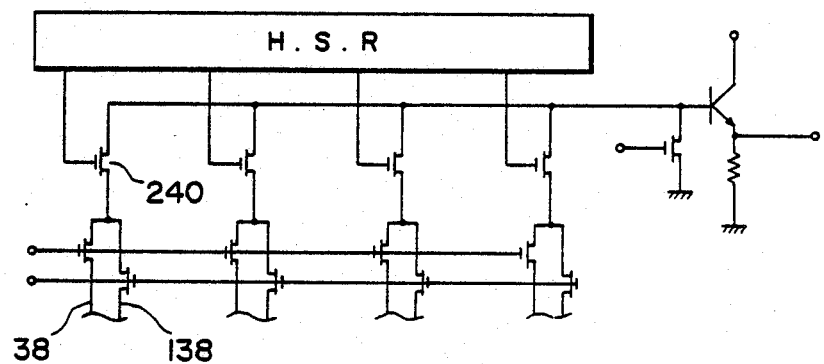

In addition to the differences concerning the unit photosensor cells described above, the equivalent circuit shown in FIG. 15(a) is further different from the circuit of the image pickup device shown in FIG. 7 in that there are provided a switching MOS transistor 148 for refreshing the vertical line 138 in addition to a switching MOS transistor 48 for refreshing the vertical line 38, and a switching MOS transistor 140 for selecting the vertical line 138 in addition to a switching MOS transistor 40 for selecting the vertical line 38. Moreover, an additional output amplifier system is provided. The output system is such that the switching MOS transistors 40 and 140 for selecting the vertical lines are connected to the switching MOS transistors 48 and 148, respectively. As shown in FIG. 15(b), it is possible to use only one output amplifier by using an additional switching MOS transistor 240 for horizontal scanning. FIG. 15(b) shows only the vertical line selection system and the output amplifier system corresponding to those in FIG. 15(a).

With the photosensor cell as shown in FIG. 14 and the photoelectric converter as shown in FIG. 15(a), the following operation is possible. That is, during the horizontal blanking period as in a television receiver after the output signals have been read out from the photosensor cells connected to the horizontal line 31, the output pulse is issued from the vertical shift register 32 and applied to the horizontal line 31', whereby the photosensor cell 152 for which the read out operation has been finished is refreshed through the MOS capacitor 151. At this time, the switching MOS transistor 48 is turned on and the vertical line 38 is grounded.

The output from the photosensor cell 152' is delivered to the vertical line 138 through the MOS capacitor 150' connected to the horizontal line 31'. As a matter of course, at this stage, the switching MOS transistor 148 is turned off so that the vertical line 138 is floated. As described above, in response to a single vertical scanning pulse, the refreshing operation of a photosensor cell whose output has been read out and the readout operation of a photosensor cell of the next line can be carried out simultaneously. Here, the refreshing voltage is desirably different from the readout voltage because in the readout operation, a bias voltage is added to the readout voltage in order to facilitate the highspeed readout operation. Therefore, as shown in FIG. 14, the area of the MOS capacitor electrode 9 is made different from the area of the MOS capacitor 120 so that even when the same voltage is applied to them, different voltages are applied to the bases of the respective photosensor cells.

That is, the area of the refreshing MOS capacitor is made smaller than the area of the readout MOS capacitor. When the photosensor cells are refreshed line by line as in this case instead of simultaneous refreshing of all photosensor cells, the collector may be composed of the n type substrate as shown in FIG. 1(b), but sometimes it is preferable to provide a separate collector for each horizontal line. When the collector is composed of the substrate, it is apparent that the collectors of all the photosensor cells form a common region so that a certain bias voltage is applied to the collector in the storage and readout operations. As previously described, it is of course possible that even when a bias voltage is applied to the collectors, the refreshing operation of a floating base can be carried out through an emitter. In this case, however, there is accompanied a drawback that simultaneously with the refreshing operation of the base region, a waste current flows between the emitter and the collector of the photosensor cell to which the refreshing pulse has been applied so that the power consumption is increased. In order to overcome this drawback, instead of connecting in common the collectors of all the photosensor cells, the collectors of the photosensor cells on each horizontal line are connected in common but the collectors on the different horizontal lines are made isolated from each other. More specifically, as an explanation in connection with a structure as shown in FIG. 1, the substrate is made one of p type, and buried n or n+ regions which are isolated from each other are formed for collectors on respective horizontal lines. The horizontally adjacent n or n+ buried regions may be isolated from each other by interposing a p region between them. In order to decrease the capacitance of collectors buried along the horizontal lines, however, it is better to isolate them with an insulating material. In the embodiment shown in FIG. 1, the collectors are composed of a substrate so that the isolation regions surrounding the photosensor cells are formed down to almost the same depth. In order to isolate the collectors between respective horizontal lines, the isolation regions in the horizontal line direction are desirably made deeper than the isolation regions in the vertical line direction by a certain value as required.

When the collectors are isolated from each other between horizontal lines, by grounding the collectors on each horizontal line after the readout operation and prior to the refreshing operation, no current flows between the emitter and collector so that the power consumption is prevented from being increased. When the charge storage operation in response to the incident light signal is started after the refreshing operation, a predetermined bias voltage is applied to the collector regions again.

As shown in the equivalent circuit of FIG. 15(a), the outputs from respective horizontal lines are alternately derived from the output terminals 47 and 147. As described hereinbefore, when the photoelectric converter is designed and constructed as shown in FIG. 15(b), the outputs can be obtained from one amplifier.

As described above, according to the embodiment as shown in FIGS. 14 and 15, the line refreshing operation becomes possible so that the photoelectric converter can be used for such applications as television cameras and the like.

As a further embodiment of the present invention, photosensor cell may be provided with a pluralty of emitters or each emitter is provided with a plurality of contacts so that a plurality of outputs may be derived from a single photosensor cell.

This is possible because each photosensor cell of the photoelectric converter in accordance with the present invention has an amplification ability so that even if a plurality of conductor capacitances are connected to each sensor cell in order to derive a plurality of outputs from each photosensor cell, it is possible to read out each output without causing any attenuation of the storage voltage Vp produced in each photosensor cell.

When a photoelectric converter is so designed and constructed as to obtain a plurality of outputs from each photosensor cell as described above, various advantages can be obtained from the standpoint of the signal processing and the countermeasure against noise.

Next, a method for fabricating a photoelectric converter in accordance with the present invention will be described. FIG. 16 shows the steps for fabricating the photoelectric converter by a selected epitaxial growth process (as disclosed by N. Endo et al. in "Novel Device Isolation Technology with Selected Epitaxial Growth" Tech. Dig. of 1982 IEDM, pp 241–244).

A contact n+ region 11 is formed by the diffusion of As or P over the back surface of an n type Si substrate 1 with an impurity concentration of the order of $1-10 \times 10^{16}$ cm$^{-3}$. In order to prevent autodoping from the n+ region, the back surface of the silicon substrate has been normally formed with an oxide film or nitride film, while not shown in the figure.

As the substrate 1, one having a uniformly controlled impurity concentration and oxygen concentration is used. That is, a uniform crystal wafer in which the carrier life is sufficiently long is used and such wafer can be obtained by, for example, the MCZ process. An oxide film is formed to a thickness of the order of 1 micron over the surface of the substrate by the wet oxidation process. Thus, oxidation is conducted in the atmosphere of $H_2O$ or $H_2+O_2$. In order to obtain the oxide film without any stacking fault, it is preferable to use a high-presure oxidation process at a temperature of the order of 900° C.

Over the oxide film is formed an $SiO_2$ film of the thickness of, for example, about 2–4 microns by a CVD process. The $SiO_2$ film of a desired thickness may be deposited at a temperature of the order of from 300° to 500° C. in a gas system of $N_2+SiH_4+O_2$. The mol ratio of $O_2$ to $SiH_4$ is set to a value between 4 and 40 while it depends upon the temperature. Except the portion of the oxide films 4 which serve as isolation regions between cells, the oxide film is removed by a reactive ion ion etching process using a gas such as $CF_4+H_2$, $C_2F_6$, $CH_2F_2$ or the like (see FIG. 16(a)). For instance, when a picture element is formed per $10\times10$ $\mu m^2$, the $SiO_2$ film is left in the form of a mesh with a pitch of 10 microns. The width of the $SiO_2$ film is selected at, for instance, two microns. After damaged and contaminated layers formed during the reactive ion etching process have been removed by an $Ar/Cl_2$ gas plasma etching or wet etching process, amorphous silicon 301 is deposited by an ultra-high vacuum deposition process, a sputtering process the atmosphere of which has been sufficiently made clean by the load lock type or a reduced pressure CVD process in which the $CO_2$ laser beam is illuminated on SiH4 gas (see FIG. 16(b)). Thereafter, except the portions deposited over the side surfaces of the SiO2 layers, the amorphous silicon is removd by anisotropic etching by means of the reactive ion etching process using a gas such as CBrF3, CCl2F2, Cl2 or the like (see FIG. 16(c)). After damaged and contaminated layers formed in the reactive ion etching process have been sufficiently removed as before, the top surface of the silicon substrate 1 is sufficiently cleaned and a selective growth of a silicon layer is carried out in a gas system of H2+SiH2Cl2+HCl. The silicon layer is grown in a reduced pressure atmosphere of a few tebs Torrs. The temperature of the substrate 1 is maintained between 900° and 1000° C. The mol ratio of HCl is set at a relatively high value. If the quantity of HCl is not sufficient, no selective growth occurs. Over the silicon substrate is formed a silicon crystal layer (epitaxial growth layer), but a part of the silicon on the SiO2 layer is etched away by HCl so that no silicon is deposited on the SiO2 layer (see FIG. 16(d)). The thickness of the n$^-$ layer 5 thus formed is, for instance, of the order of between 3 and 5 microns.

The impurity concentration is preferably set to a value of the order of $10^{12}-10^{16}$ cm$^{-3}$. Of course, the impurity concentration may be lower or higher than the above-described range, but it is preferable that the impurity concentration and the thickness of the n$^-$ layer are such that a completely depleted layer is formed due to the diffusion potential of the pn junction or at least the n$^-$ region is completely depleted when an operating voltage is applied to the collector.

Ordinarily available HCl gas normally contains a large amount of water so that an oxide film is always formed over the surface of the silicon substrate 1 and consequently high-quality epitaxial growth cannot be expected at all when such HCl gas is used. When HCl gas containing a large amount of water is filled into a cylinder, it reacts with the materials of the cylinder so that it contains a large amount of heavy metals, mainly iron. As a result, an epitaxial growth layer contaminated with heavy metals tends to be formed. The epitaxial growth layer which is used in a photosensor cell preferably has a minimum amount of dark current component so that the contamination with heavy metals should be reduced to a minimum. An ultra pure grade of SiH2Cl2 should be used and, in addition, HCl containing the least amount of moisture, that is, HCl with a moisture content of not more than 0.5 ppm should be used. Of course, the lesser the content of water, the better. In order to improve the quality of the epitaxial growth layer, it is effective to heat the substrate 1 to a high temperature of 1150°–1250° C. so that the oxygen in the vicinity of the surfaces of the substrate 1 is removed and thereafter, to heat-treat the substrate 1 for a relatively long time period at about 800° C. so as to cause many microdefects, thereby to make the substrate 1 one having denuded zones which can be subjected to the intrinsic gettering process. Epitaxial growth is carried out in the presence of the isolation regions 4 consisting of SiO2 so that in order to prevent the imigration of the oxygen from the SiO2 regions, it is preferable that the epitaxial growth temperature is as low as possible. In the case of a frequently used high frequency heating process, an epitaxial growth layer is contaminated by a carbon susceptor so that it is difficult to carry out the epitaxial growth at low temperature. When a process for directly heating wafers by lamps in which no carbon susceptor is disposed within a reaction chamber is employed, a highly clean atmosphere can be maintained so that a high-quality epitaxial growth layer can be formed at low temperatures.

A wafer supporting member disposed in a reaction chamber preferably consists of ultra high purity molten sapphire with a lower vapor pressure. A process for directly heating wafers by lamps is best adapted for obtaining a high-quality epitaxial growth layer because starting material gas or gases can be preheated in a relatively simple manner and because a uniform temperature distribution can be obtained over the surface of a wafer even in the presence of a large volume of gas flow so that thermal stresses hardly occur. When ultraviolet rays are irradiated at the surfaces of a wafer during the epitaxial growth, the quality of the epitaxial growth layer can be further improved.

Figure 16A:
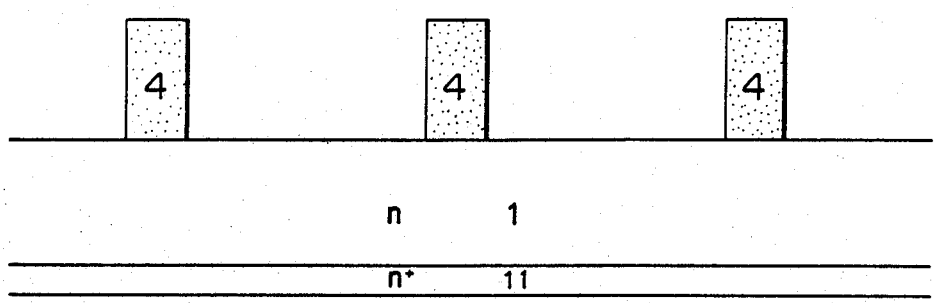
FIGS. 16, consisting of FIGS. 16(a) through 16(g) and 17 are sectional views used to explain a method for fabricating a photoelectric converter in accordance with the present invention.
Figure 16B:
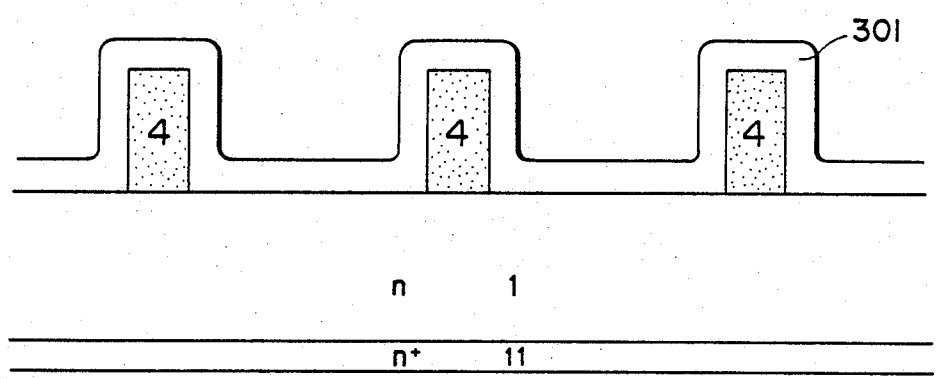
Figure 16C:
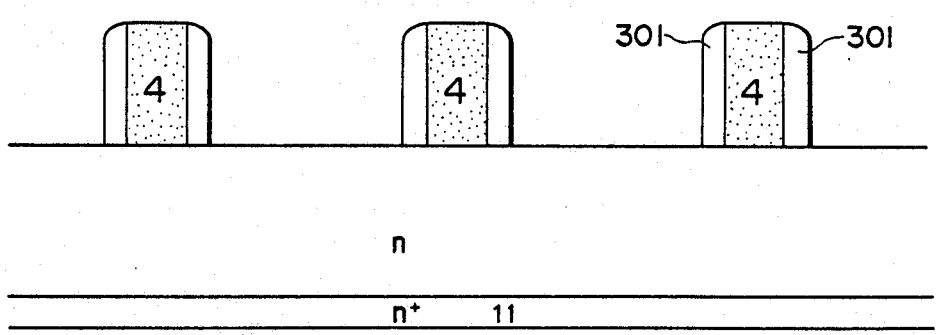
Figure 16D:
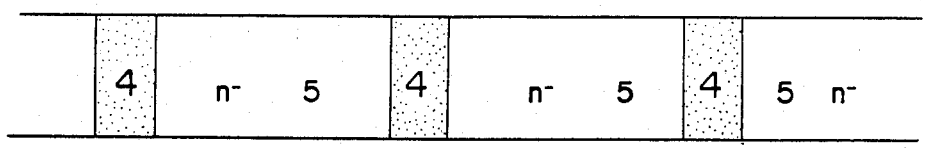

Amorphous silicon is deposited on the side surfaces of the SiO2 isolation regions 4 (see FIG. 16(c)). Amorphous silicon tends to become a single crystal during the solid-phase growth so that crystals in the vicinity of the SiO2 isolation regions 4 are highly excellent in quality. After the high-resistance n$^-$ layer 5 has been formed by the selected epitaxial growth process (see FIG. 16(d)), a p region 6 with a surface impurity concentration of $1-20\times10^{16}$ cm$^{-3}$ is formed to a predetermined depth by the diffusion of a doped oxide or by the diffusion using as a source a low dose ion injection layer. The depth of the p region is, for instance, of the order of 0.6 to 1 micron.

The thickness and the impurity concentration of the p region 6 are determined in consideration of the following factors. In order to increase the sensitivity, it is preferable that the impurity concentration of the p region 6 is decreased so that the capcitance Cbe is reduced. The capacitance Cbe is roughly given by $$C_{be} = A\epsilon \left( \frac{q \cdot N_A}{2\epsilon \cdot V_{bi}} \right)$$

where Vbi: the base-emitter diffusion voltage given by $$V_{bi} = \frac{kT}{q} \ln \frac{N_D - N_A}{n_i^2}$$

$\epsilon$: the dielectric constant of an emitter:
$N_D$: the impurity concentration in the emitter;
$N_A$: the impurity concentration of the portion of a base adjacent to the emitter; and
$n_i$: the intrinsic carrier concentration.
The lower $N_D$ is, the lower the capacitance Cbe becomes so that the sensitivity is increased. However, when the impurity concentration $N_A$ is made too low, the base region is completely depleted during operation so that punch-through occurs. Therefore, the impurity concentration $N_A$ cannot be made too low. That is, the impurity concentration $N_A$ is so determined that the base region will not be completely depleted and no punch-through will occur.

Next, a thermally oxidized film 3 of a thickness ranging from tens to hundreds of A (angstrom) is formed on the surface of the silcon substrate 1 by a steam oxidation process using H2+O2 gas at a temperature of about 800° to 900° C. Thereafter, a nitride film (Si3N4) 302 of a thickness ranging from 500 to 1500 A is formed over the oxide film 3 by a CVD process using SiH4+NH3 gas system. As is the case of HCl, ordinary commercially available $NH_3$ gas contains a large amount of moisture. If $NH_3$ gas containing a large amount of moisture is used as a starting material, a nitride film with a high oxygen concentration is formed. Furthermore, reproducibility is adversely affected and an exact selection ratio cannot be attained when it is subjected to selective etching together with the $SiO_2$ film.

Figure 16E:
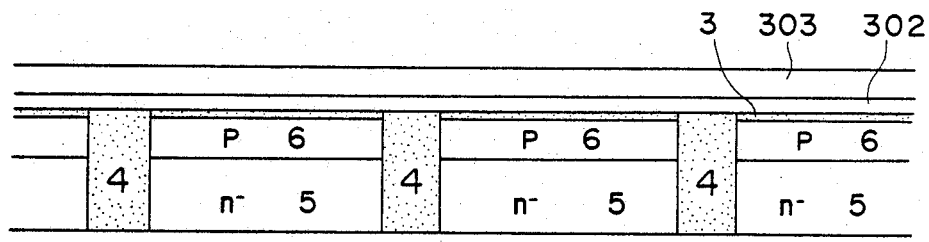
Figure 16F:
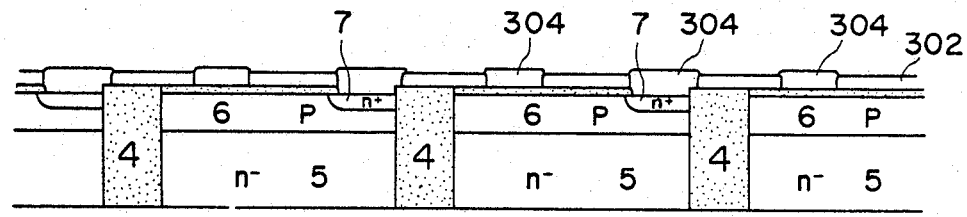
Figure 16G:
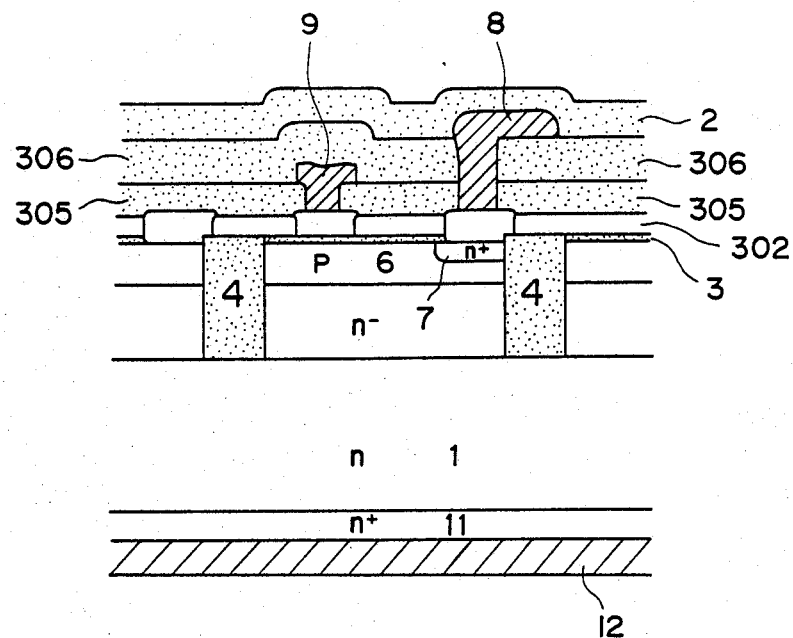

It is preferable that the water content in $NH_3$ gas is not more than 0.5 pm. As a matter of course, the lesser the moisture content, the better. A PSG film 303 is deposited on the nitride film 302 by a CVD process. For instance, as shown in FIG. 16(e), the PSG film 303 of a thickness of about 2000–3000 A is deposited at about 300°–400° C. by a CVD process using an $N_2+SiH_4+O_2+PH_3$ system. By a photolithography process including two mask alignment steps, as As doped polysilicon film 304 is deposited over the n+ region 7 and an electrode to which are applied a refreshing pulse and a readout pulse. In this case, a P doped polysilicon film may also be used. For instance, by two photolithography steps, the PSG film, the $Si_3N_4$ film and the $SiO_2$ film over the emitter are all removed and only the PSG film and the $Si_3N_4$ film are etched at a portion where the refreshing and readout pulse application electrode is disposed while leaving the underlying $SiO_2$ film. Thereafter, an As doped polysilicon film is deposited by a CVD process using an $N_2+SiH_4+AsH_3$ gas system or an $H_2+SiH_4+AsH_3$ gas system. The deposition temperature is about 550° to 700° C. and the thickness is about 1000 to 2000 A. It is of course possible that after a non-doped polysilicon film has been deposited, As or P is diffused into the film. After a photolithography process including a mask alignment step, the polysilicon film except for the portions on the emitters and the refreshing and readout pulse application electrodes is removed by etching. When the PSG film is further etched, the polysilicon deposited on the PSG film is removed by lifting-off in a self-alignment manner (see FIG. 16(f)). The polysilicon film can be etched by using $C_2Cl_2F_4$ or $CBrF_3+Cl_2$ gas and the $Si_3N_4$ film can be etched by using $CH_2F_2$ gas or the like.

Next, an insulating film 305 consisting of PSG is deposited in a similar manner as described above by using a gaseous CVD system and then contact holes are opened to the refreshing and readout pulse application electrode polysilicon film by a masking step followed by an etching step. Thereafter, a metal such as Al, Al—Si or Al—Cu—Si is deposited by a vacuum deposition process or a sputtering process, or Al is deposited by a plasma CVD process using $(CH_3)_3Al$ or $AlCl_3$ as a starting material gas or by a light-irradiation CVD process in which an Al—C bond or Al—Cl bond is directly cut off by the irradiation of light. In the case of the CVD process of the type using $(CH_3)_3Cl$ or $AlCl_3$ as a starting material, a largely excessive amount of hydrogen is caused to flow. In order to deposit aluminum (Al) into a narrow and steep contact hole, it is superior to employ a CVD process in which the substrate temperature is heated to 300°–400° C. in a clean atmosphere containing no moisture and oxygen. After the metal conductor pattern 10 as shown in FIG. 1 has been made, an insulating film 306 for isolation between layers is deposited by a CVD process. The insulating film 306 may be composed of the above-described PSG film or the CVD $SiO_2$ film or, when the water resistance must be taken into consideration, may be composed of an $Si_3N_4$ film formed by a plasma CVD process using an $SiH_4+NH_3$ gas system. In order to reduce the water content in the $Si_3N_4$ film, the film is preferably formed by a plasma CVD process using an $SiH_4+N_2$ gas system.

In order to reduce damage caused by the plasma CVD process, to increase the breakdown voltage of a formed $Si_3N_4$ film and to decrease a leakage current, the light CVD process is superior to the plasma CVD process. There are two light CVD processes. One is a process wherein an ultraviolet ray of 2537 A emitted from an exterior mercury lamp are irradiated to an $SIH_4+NH_3+Hg$ gas system and the other is a process wherein an ultraviolet ray of 1849 A emitted from a mercury lamp is irradiated to an $SiH_4\ NH_3$ gas system. In both processes, the substrate temperature is maintained at a temperature of the order of 150°–350° C. A contact hole is opened through the insulating films 305 and 306 to the polysilicon film on the emitter 7 through a masking step and a reactive ion etching step. Thereafter a metal such as Al, Al—Si, Al—Cu—Si or the like is deposited in the above described manner. A CVD process is superior for this purpose since the aspect ratio of the contact hole is high. After the metal conductor pattern 8 as shown in FIG. 1 has been made, a passivation film 2 consisting of $Si_3N_4$ or PSG is deposited by a CVD process (see FIG. 16(g)).

In this case, the use of a light CVD process is superior. A metal electrode 12 consisting of Al or Al—Si is formed over the back surface of the substrate 1.

Various techniques may be employed in order to fabricate the photoelectric converter in accordance with the present invention and only one example has been described with reference to FIG. 16.

One of the very important factors of the photoelectric converter in accordance with the present invention is how the leakage currents between the p region and the n− region 5 and between the p region 6 and the n+ region 7 are decreased to a minimum. It is of course necessary that the quality of the n− region 5 is improved so that the dark current is suppressed to a minimum, but a problem to be considered is rather found in the interface between the isolation region 4 consisting of an oxide film and the n− region 5. In order to solve this problem, it has been described with reference to FIG. 16 that the epitaxial growth is carried out after amorphous silicon is deposited on the side surfaces of the isolation region 4. In this case, during the epitaxial growth step, amorphous silicon is converted into a single crystal by the solid phase growth from the silicon substrate 1. The epitaxial growth step is carried out at a relatively high temperature between 850° and 1000° C. so that before amorphous silicon is converted into a single crystal by the solid state growth from the silicon substrate 1, fine crystals are liable to grow in amorphous silicon. As a result, crystal properties are degraded. When the temperature is low, the rate of solid phase growth becomes by far relatively higher than the rate at which high crystals are grown in amorphous silicon. Therefore, prior to the selected epitaxial growth, amorphous silicon is converted into a single crystal at a low temperature of the order of 550° to 700° C. so that the interface properties can be improved. In this case, if an oxide film or the like is present between the silicon substrate 1 and amorphous silicon, the initiation of the solid phase growth is delayed so that an ultra clean process is required so that no such film is present at the interface between them.

For the solid phase growth of amorphous silicon, in addition to the furnace growth process as described above, there may be effectively employed a rapid annealing process in which while the silicon substrate is maintained at a predetermined temperature, heating by a flash lamp or an infrared lamp is conducted for a few seconds to tens of seconds. If the rapid annealing process is used, polysilicon may be deposited over the side surfaces of the SiO$_2$ region. However, it is necessary that the deposition is carried out in a very clean atmosphere and polysilicon whose crystal boundaries are free from oxygen, carbon and the like is used.

After the silicon deposited on the side surfaces of the SiO$_2$ film has been converted into a single crystal, the selective growth of silicon is initiated.

Figure 17:
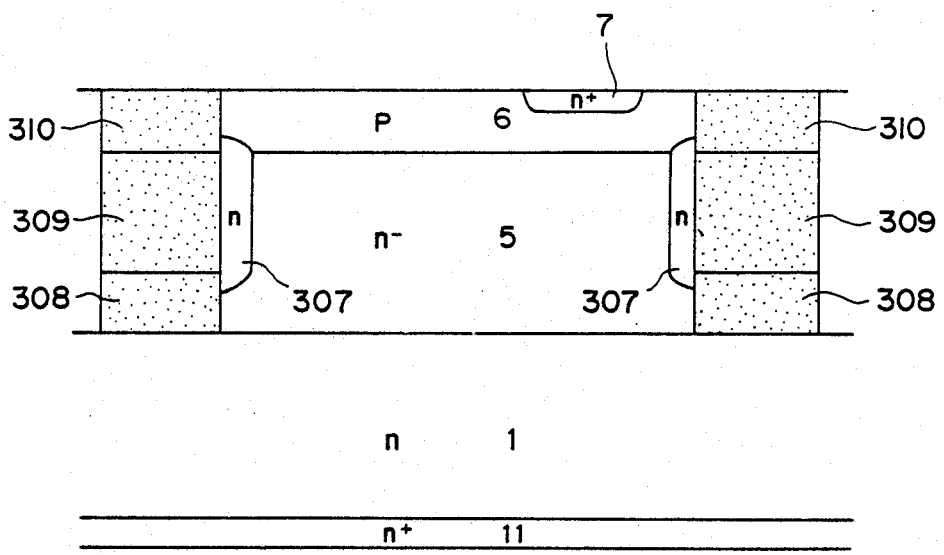

When the leakage current at the interface between the SiO$_2$ isolation region 4 and the high-resistance n$^-$ region 5 is still of problem, the concentration of n type impurities is preferably increased only at a portion of the high-resistance n$^-$ region adjacent to the SiO$_2$ isolation region 4 to obviate the problem of the leakage current. For instance, the concentration of n type impurities is increased to $1-10 \times 10^{16}$ cm$^{-3}$ in the portion of a thickness ranging from 0.3 to one micron of the n$^-$ region 5 which is adjacent to the SiO$_2$ isolation region 4. This structure can be realized in a relatively simple manner. That is, after an oxide film or a thickness of about one micron has been thermally grown on the surface of the substrate 1, an SiO$_2$ film containing a predetermined quantity of P is deposited by a CVD process. Thereafter, an SiO$_2$ film deposited by a CVD process to form the isolation region 4. Next, the substrate 1 is subjected to a high temperature treatment so that a satisfactory impurity distribution that the impurity concentration is highest at the interface can be obtained because the phosphorus diffuses from the sandwiched SiO$_2$ film in the isolation region 4 into the high-resistance n$^-$ region 5. More specifically, a structure as shown in FIG. 17 is composed. The isolation region 4 comprises three films, that is, a thermally grown oxide film (SiO$_2$) 308, an SiO$_2$ film 309 formed by a CVD process and containing phosphorus P and an SiO$_2$ film 310 formed by a CVD process. An n region 307 is formed at the interface between the isolation region 4 and the n$^-$ region 5 by diffusion from the SiO$_2$ film 309 containing phosphorus P. Then n region 307 is formed along the whole periphery of a cell. With this structure, the base-collector capacitance Cbc is increased, but the leakage current between the base and the collector is remarkably decreased.

So far, an example is described with reference to FIG. 16 wherein the selected epitaxial growth is conducted after the isolation region 4 has been formed, it is to be understood however that the U-groove isolation technique may also be employed in which a required high resistance n$^-$ region 5 is epitaxially grown on the surface of the substrate and a portion thereof giving an isolation region is cut in the form of a mesh by a reactive ion etching process, thereby forming the isolation region 4 (A. Hayasaka et al, "U-groove isolation technique for high speed bipolar VLSI's" Tech. Dig. of IEDM P. 62, 1982).

The photoelectric converter of the present invention, according to the above described embodiments, is characterized in that a bipolar transistor whose major portion is a floated base region adjacent to a semiconductor wafer surface is formed in a region surrounded by an isolation region composed of an insulating material and the potential of the floated base region is controlled by an electrode disposed at a part of the base region through a thin insulating film whereby light information is converted into an electrical signal. An emitter region with a high impurity concentration is disposed at a part of the base region and is connected to a MOS transistor which is operated in response to a horizontal scanning pulse. The above-mentioned electrode disposed at a portion of the floated base region through a thin insulating film is connected to a horizontal line. The collector disposed within the wafer may be composed of a substrate or a high-impurity-concentration region buried in a high-resistance substrate having an opposite conductivity type, depending on the purpose. A pulse voltage applied for reading out the signal is substantially higher than a pulse voltage applied for refreshing the floated base region. Actually, a pulse train consisting of pulses having two different voltage levels may be used. Moreover, as described in conjunction with the structure of a double capacitor, the capacitance Co of a readout MOS capacitor electrode can be made higher than the capacitance Cox of a refreshing MOS capacitor electrode. In response to a refreshing pulse applied, the photoexcited carriers are stored in the floated base region which has been reverse biased so that the signal corresponding to the light signal is stored. In the signal readout operation, a readout pulse voltage is applied in such a way that the base-emitter junction is deeply forward biased so that the signal can be read out at a high speed. The above-described structure and the mode of operation are characteristic features of the present invention. As far as such features as described above are retained, the photoelectric converter in accordance with the present invention may have any structure and the present invention is of course not limited to the above-described embodiments.

For instance, the photoelectric converter in accordance with the present invention may have the same structure as described above, but the conduction types of various regions and films may be reversed. In this case, the polarities of voltages applied are also reversed. That is, in an embodiment wherein the conductivity types are reversed, the base region is of n type. More particularly, the base region contains As or P impurities. When the surface of a region containing As or P is oxidized, As or P is piled up on the side of silicon at the interface between silicon and SiO$_2$. As a result, a strong drift electric field is produced from the surface to the interior within the base so that the photoexcited holes immediately flow into a collector so that electrons are stored in the base in an efficient manner.

In the case where the base is of p type, an ordinarily used impurity is boron. When the surface of a p region containing boron is thermally oxidized, boron penetrates into an oxide film so that the boron concentration in the silicon adjacent to the interface between the silicon and SiO$_2$ becomes lower than the boron concentration within the p region. The depth of the transient layer is generally of the order of hundreds of angstroms (Å) while it is dependent upon the thickness of the oxide film. A reverse drift electric field for electrons is produced in the vicinity of the interface so that the photoexcited electrons in this region tend to be collected at the surface. Under these conditions, the region in which the reverse drift electric field is produced can become a dead region. According to the present invention, however, an n$^+$ region is present at a portion along the surface so that the electrons collected at the interface between the silicon and SiO₂ in the p region are caused to flow into this n+ region before the recombination occurs. As a result, even when the number of boron is less at the interface between the silicon and SiO₂ so that the region which has a reverse drift electric filed is present, this region will not become a dead region. Rather, if such region is present at the interface between, the silicon and SiO₂, the stored holes are forced to leave the Si/SiO₂ interface and move into the interior. As a result, the effect that the holes varnish at the interface is lost so that the effective storage of holes in the base of the p region can be enhanced. Such phenomena as described above are highly desirable.

Figure 8B:
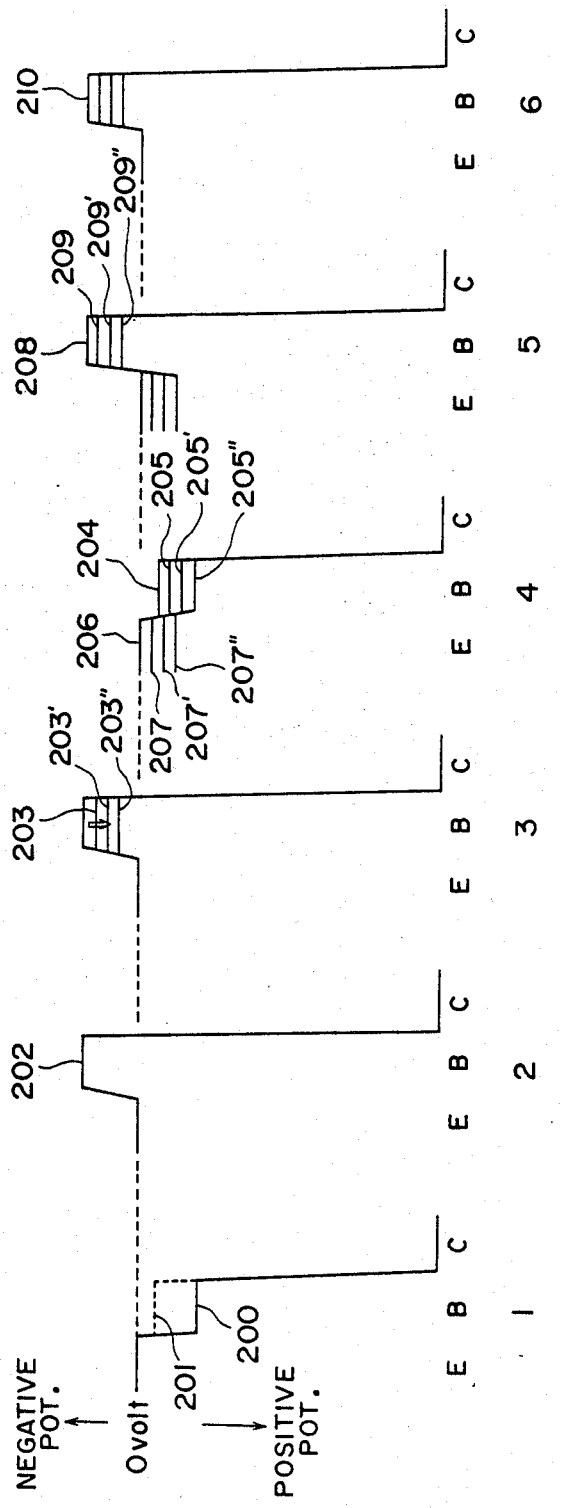
FIG. 8(b) is a graph showing the potential levels in respective operations.

Next, a preferred embodiment of the photoelectric converter of the present invention which operates in a transient refreshing mode allowing a high-speed refreshing operation will be described. Referring first to FIG. 8(b), the changes in the emitter, base and collector potential levels will be explained when a transient refreshing operation, a storage operation and a readout operation are cyclically conducted in the order named. The voltage levels at various points are externally viewed so that some of them do not correspond with the internal potential levels.

For the sake of simplicity of explanation, the diffusion potential between an emitter and a base is not shown. Accordingly, when the emitter potential and the base potential are shown as having the same level in FIG. 8(b), a diffusion potential given by the following expression exists between the emitter and the base:

$$\frac{k \cdot T}{q} \ln \frac{N_D \cdot N_A}{n_i}$$

In FIG. 8(b), states 1 and 2 represent a refreshing operation; 3, a storage operation; 4 and 5, a readout operation; and 6, an operation when the emitter is grounded. The negative voltage is shown above the zero voltage line while the positive voltage, below the zero voltage line. It is assumed that the base potential be maintained at 0 volt prior to the state 1 and that the collector potential be biased at a positive voltage throughout the states 1-6.

The mode of operation comprising the above mentioned series of steps will be described with further reference to the timing diagram as shown in FIG. 8(a).

A positive voltage or refreshing voltage $V_{RH}$ is applied to a terminal 37 at a time $t_1$ as shown in a wave form 67 in FIG. 8(a). Then, as shown by a potential level 200 in the state 1 in FIG. 8(b), a distributed voltage expressed by $$\frac{Cox}{Cox + Cbe + Cbe} V_{RH}$$

is applied to the base as described before. This potential is gradually decreased to zero from $t_1$ to $t_2$ and becomes a potential 201 indicated by a broken line in FIG. 8(b) at $t_2$. As described before, this potential 201 is a potential $V_k$ which remains at the base in the transient refreshing mode. At $t_2$, at the instant when the refreshing voltage or potential $V_{RH}$ returns to zero potential, a potential given by $$\frac{Cox}{Cox + Cbe + Cbe} V_{RH}$$

is applied to the base due to capacitance division so that the base potential becomes the sum of the remaining potential $V_k$ and a newly produced voltage. That is, the base potential is maintained at a potential 202 in the state 2 and is expressed by $$V_k - \frac{Cox}{Cox + Cbe + Cbc} V_{RH}$$

When light is intercepted under the condition that the base is reverse biased with respect to the emitter, holes are generated and stored in the base region so that, as shown in the state 3, the base potential 202 gradually rises to a positive potential as indicated by 203, 203' and 203'' in response to the intensity of the incident light. The potential generated in response to the incident light is designated by Vp.

Next, when the readout potential $V_R$ is applied to a horizontal line from a vertical shift register as indicated in a waveform 69, a potential expressed by $$\frac{Cox}{Cox + Cbe + Cbc} V_R$$

is additionally applied to the base. As a result, when no light is intercepted at all, the base potential 204 becomes $$V_k + \frac{Cox}{Cox + Cbe + Cbc} (V_R - V_{RH})$$

As described before, the potential 204 is so set that it is forward biased with respect to the emitter potential by 0.5–0.6V. The base potentials 205, 205' and 205'' are given by $$V_k + V_p + \frac{Cox(V_R - V_{RH})}{Cox + Cbe + Cbc},$$

$$V_k + V_{p'} + \frac{Cox(V_R - V_{RH})}{Cox + Cbe + Cbc} \text{ and}$$

$$V_k + V_{p''} + \frac{Cox(V_R - V_{RH})}{Cox + Cbe + Cbc}$$

respectively.

When the base potential is forward biased with respect to the emiter potential as described above, the electrons are injected into the base from the emitter so that the emitter potential gradually rises to a positive potential. When no light is intercepted at all, the emitter potential is of the order of about 50–100 mV when the forward bias is set at 0.5–0.6V and the read pulse width is 1–2 μs. The emitter potential is designated by $V_B$. The linearity of the emitter potentials 207, 207' and 207'' can be satisfactorly maintained when the pulse width is not less than 0.1 μs. As a result, the emitter potentials 207, 207' and 207'' are given by $V_p+V_B$, $V_{p'}+V_B$, and $V_{p''}+V_B$, respectively.

When the readout potential $V_R$ becomes zero after a predetermined readout time as indicated in a waveform 69 in FIG. 8(a), a potential expressed by $$-\frac{Cox}{Cox + Cbe + Cbe} V_R$$

is applied to the base. As a result, as shown in the state 5, the base potential returns to the potential prior to the application of the readout pulse. That is, the base potential is reverse biased so that the emitter potential will not vary. In this case, the base potential 208 is given by $$V_k - \frac{Cox}{Cox + Cbe + Cbc} V_{RH}$$

and the base potentials 209, 209' and 209" are given by $$V_k + V_p - \frac{Cox}{Cox + Cbe + Cbc} V_{RH},$$

$$V_k + V_p' - \frac{Cox}{Cox + Cbe + Cbc} V_{RH}, \text{ and}$$

$$V_k + V_p'' - \frac{Cox}{Cox + Cbe + Cbc} V_{RH},$$

respectively. The above potentials are the same as those indicated in the state 3 prior to the readout operation or mode.

In the state 5, the video information signal is read out from the emitter to the exterior. After the readout operation or mode, switching MOS transistors 48, 48' and 48" are turned on so that the emitter is grounded and consequently the emitter potential becomes zero as indicated in the state 6. Thus, the refreshing operation, the storage operation and the readout operation are carried out and the mode returns to the state 1. Prior to the first refreshing operation, the base potential has started from zero potential, but after one cycle of the refreshing operation, the storage operation and the readout operation, the base potentials become $$V_k - \frac{Cox}{Cox + Cbe + Cbc} V_{RH},$$

$$V_k - \frac{Cox}{Cox + Cbe + Cbc} V_{RH} + V_p,$$

$$V_k - \frac{Cox}{Cox + Cbe + Cbc} V_{RH} + V_p', \text{ and}$$

$$V_k - \frac{Cox}{Cox + Cbe + Cbc} V_{RH} + V_p''.$$

Therefore, when the refresh potential $V_{RH}$ is applied under these conditions, the base potentials remain $V_k+V_p$, $V_k+V_p'$ and $V_k+V_p''$, respectively. As a result, the base is not satisfactorily forward biased so that the region which has received high intensity light has been deeply forward biased and consequently the video information is removed, but in the region having received low intensity light, the video information will not be removed and remains. These facts are clear from the calculated data with respect to the refreshing operation as shown in FIG. 6.

The above-described phenomenon is unique in the transient refreshing mode and, in the case of the complete refreshing mode, a long refreshing time is used before the base potential becomes zero so that the above-described problem will not occur at all.

Next, a first method which uses the transient refreshing mode allowing a high-speed refreshing operation and which will not cause such defects as described above will be described below.

A cause of the above defects is that the base potential is too negative, that is, excessively reverse biased with respect to the emitter potential in the state 6. In the first method for solving the above problem, the base potential 210 is brought to zero potential or caused to rise slightly to a positive potential by some method before a refresh pulse is applied in the state 1 in the subsequent cycle.

Figure 18A:
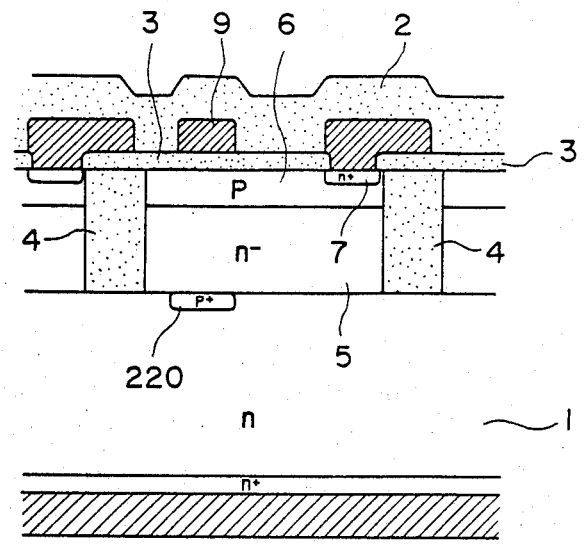
FIG. 18(a) is a sectional view of another embodiment of the photosensor cell in accordance with the present invention.
Figure 18B:
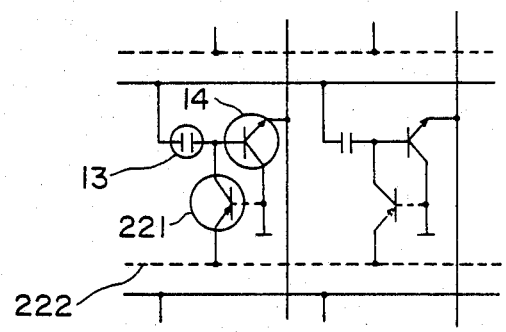
FIG. 18 (b) shows an equivalent circuit thereof.
FIG. 18(c) shows a potential level used to explain the mode of operation of the photosesor cell as shown in FIG. 18(a)

FIG. 18(a) is a sectional view of a photosensor cell which can solve the above-described problem; FIG. 18(b) shows an equivalent circuit thereo; and FIG. 18(c) shows the internal potential.

The photosensor cell as shown in FIG. 18(a) is different from the one shown in FIG. 1 only in that it includes a buried p+ region 220. The equivalent circuit as shown in FIG. 18(b) further includes a pnp transistor 221 comprising a collector composed of the base region 6 of the sensor cell, an emitter composed of the buried p+ region 220, and a base composed of a part of the high resistance n− region 5 between the base region 6 and the collector region 1. The base region of the pnp transistor is loosely coupled to the collector region 1 of the sensor cell as indicated by the broken line in the equivalent circuit. The buried p+ region 220 is connected as indicated by a line 222 in the crystal so that a voltage can be applied from the exterior of a sensor cell.

As is clear from FIG. 18(b), the p+ buried region 220 forms a horizontal line as indicated by 222 so that the p+ buried region should be shown as continuous in the horizontal direction in FIG. 18(a), but for the sake of simplicity, the p+ buried region 220 is schematically shown as an island.

Figure 18C:
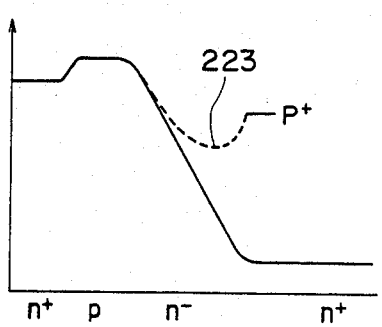

The potential with respect to the interior electrons is shown in FIG. 18(c) and the potential distribution along a vertical section not including buried p+ region 220 is substantially similar to the one shown in FIG. 1, but the potential distribution along a vertical section including the buried p+ region is indicated by the broken line curve 223. However, it should be noted that FIG. 18(c) shows a potential distribution when the buried p+ region is slightly biased to a positive potential. When the buried p+ region 220 is further biased positively, the intermediate n− region 5 is completely punched through so that holes flow from the p+ region 220 into the base region 6 of the sensor cell. As a result, the base region 6 rises to a positive potential.

In order to maintain the n− region 5 in the punch-through state so that the holes flow from the p+ region into the p base region 6, the following relationship must be satisfied;

$$V_p^+ + V_{bi} > \frac{q \cdot N \cdot d^2}{2\epsilon}$$

where
d is the thickness of the n− region 5,
N is the impurity density,
Vp is the voltage applied to the p+ region, and
Vbi is the diffusion potential at the p+−n− junction.

Therefore, in the state 6 as shown in FIG. 8(b), a positive potential is applied through the line 222 to the uried p+ region so that holes are injected into the p base region 6. As a result, the base potential 210 can be brought to zero or a slightly positive potential so that it becomes possible to solve the defect encountered in the transient refreshing mode as described above. In this case, if the voltage applied to the buried p+ region is slightly lower than the voltage applied to the collector 1 of the sensor cell, that is, the buried p+ region 220 and the n region 1 are not forward biased, a sufficient number of holes can be injected into the base region 6.

An impurity (boron in general) which is injected in order to form the p+ region 220 has a high diffusion constant. As a result, when the high resistance n− region 5 is formed by the epitaxial process, there arise the problems of auto doping and diffusion. However, when the epitaxial process is carried out at low temperatures, the auto doping and diffusion from the buried p+ region 220 can be reduced to a minimum.

Figure 19:
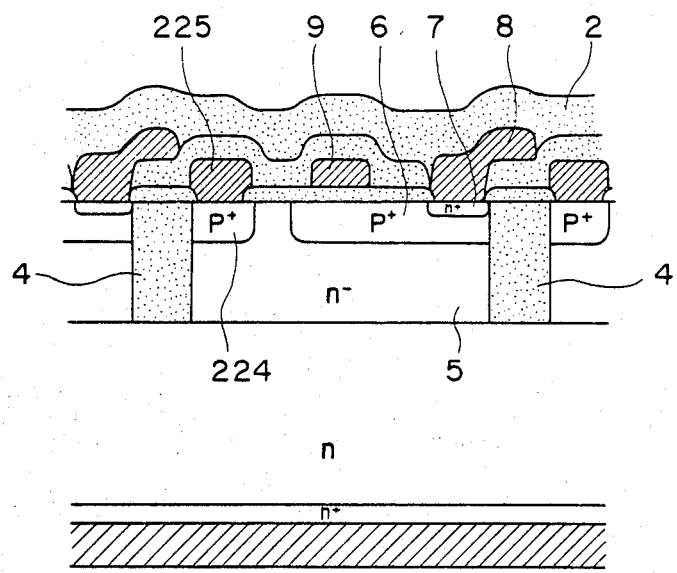
FIG. 19 is a sectional view showing the essential structure of a modification of the photosensor cell shown in FIG. 18.

The above-described photosensor cell as an embodiment is different from the fundamental photosensor cell as shown in FIG. 1 only in that the buried p+ region is formed by the diffusion or ion injection process. Thus, the method for fabricating the fundamental photosensor cell is applicable to the production of the above embodiment with respect to the other portion than the buried p+ region as described above. FIG. 19 is a sectional view used to explain further embodiment of the present invention. In the photosensor cell as shown in FIG. 19, instead of the buried p+ region 220 as shown in FIG. 18(a), a p+ region 224 is formed on the side of the top surface simultaneously with the formation of the base region 6. As a consequence, there is provided a pnp transistor having an emitter comprising the p+ region 224, a base comprising the low impurity n− region 5 and a collector comprising the p+ region 6 which is a base of a photosensor cell. Therefore, while the pnp transistor as shown in FIG. 18 has a vertical structure, the pnp transistor as shown in FIG. 19 has a horizontal structure. Accordingly, in the case of the embodiment as shown in FIG. 19, a line 225 along the top surface is used to apply a voltage to the p+ region 224.

Although there is a difference in that the photosensor cell as shown in FIG. 18 has a vertical structure while the photosensor cell as shown in FIG. 19 has a horizontal structure, the equivalent circuit of the photosensor cell as shown in FIG. 19 is substantially the same as that shown in FIG. 18(b). Furthermore, the mode of operation of the photosensor cell as shown in FIG. 19 is quite the same as that of the photosensor cell as described with reference to FIG. 18.

In FIG. 19, for the sake of explanation, the p+ region 224, its line 225, the MOS capacitor electrode 9, the emitter region 7 and the line 8 are depicted on the same plane, but it is to be understood that the p+ region 224 and its line 225 may be disposed in other places in the same photosensor cell. The arrangement of the p+ region 224 and the line 225 is determined depending upon the design factors such as the shape of a light receiving aperture and the arrangement of various lines.

Another method which uses a transient refreshing mode capable of a high-speed refreshing operation and which can substantially eliminate the above-described problem or defect will be described.

The problem or defect is caused because when a refreshing pulse and a readout pulse are applied, the same potential value produced by the positive and negative capacitance division at the leading and trailing edges of the pulse is applied to the base region. It follows therefore that the above-described problem or defect can be solved by clamping a negative voltage applied to the base region at a predetermined value by some method.

Figure 20A:
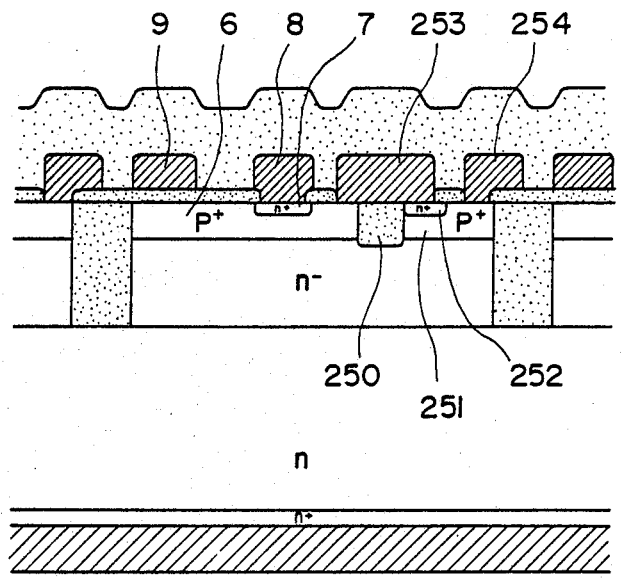
FIG. 20(a) is a sectional view of a further embodiment of the photosensor cell in accordance with the present invention.
Figure 20B:
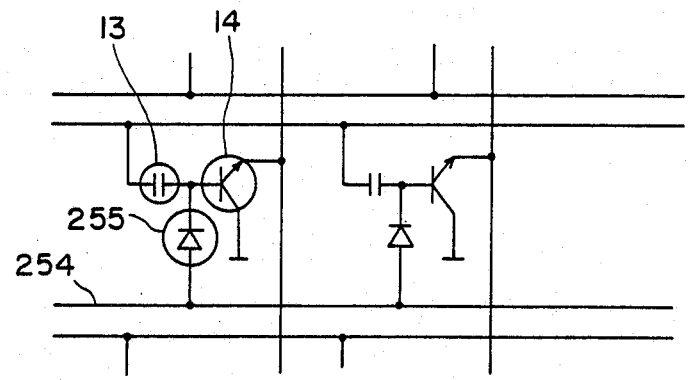
FIG. 20(b) shows an equivalent circuit thereof.

FIG. 20 shows an embodiment capable of accomplishing the above object. FIG. 20(a) shows a section of a sensor cell and FIG. 20(b) shows an equivalent circuit thereof.

The photoelectric converter as shown in FIG. 20(a) is different from the photosensor cell with the fundamental structure as shown in FIG. 1 in that there are further provided and an n− region 252 which constitute a p+−n+ junction diode, and an SiO2 isolation region 250 for separating these additional regions from photosensor cells 251. The b+ region 252 is connected through an aluminum conductor 253 to the base region 6 of the sensor cell. The p+ region 251 is connected through an aluminum conductor 254 to an external power supply. Except the above-described arrangement, the photosensor cell as shown in FIG. 20 is substantially the same in construction as the fundamental sensor cell as shown in FIG. 1. In the equivalent circuit as shown in FIG. 20(b), a p+−n+ junction diode 255 consisting of the p+ region 251 and the n+ region 252 has an anode (p+ region) connected to the line or conductor 254 which in turn is connected to an external power supply and an cathode (n+ region) connected to the base of the fundamental photosensor cell. Except the above-described arrangement, the equivalent circuit as show in FIG. 20(b) is substantially the same as that of the fundamental photosensor cell as show in FIG. 1.

In the case of the photosensor cell as shown in FIG. 20, the negative potential 202 of the base region in a state corresponding to the state 2 shown in FIG. 8(b) is maintained at a potential −Vc supplied through the conductor line 254 while, in the fundamental cell, the negative potential 202 of the base region is $$V_k \cdot \frac{C_{ox}}{C_{ox} + C_{be} + C_{bc}} V_{RH}$$

at the trailing edge of a refreshing pulse. That is, when the potential tends to drop below the clamping potential −Vc, the diode 255 is turned on so that the current flows and the ootential is finally clamped at the potential −Vc.

The clamping potential −Vc is determined at a suitable value depending upon the refreshing speed in the transient refreshing mode, a positive bias in the readout mode, the dynamic range of the light signals and so on.

The clamping potential −Vc is set at a predetermined suitable value which can be obtained by controlling the impurity concentration in the n+ regions 252 and p+ region 251.

In the case of the above-described photosensor cell with the clamping p-n junction diode, the problem or defect caused in the transient refreshing mode can be reliably solved. As a result, an image pickup device capable of high-speed refreshing can be provided.

In the embodiment as shown in FIG. 20, the MOS capacitor electrode 9, the conductor line 8 from the emitter 7, the conductor line 253 interconnecting the base 6 and the n+ region 252 of the p+−n+ junction diode and the conductor line 254 for supplying a voltage to the p+ region 251 of the p+−n+ junction diode are all shown as lying on the same plane for the sake of explanation and correspondingly the light receiving apertures are depicted to occupy a remarkably small area, but it is to be understood that these lines can be arranged in various manners in the same photosensor cell upon consideration of the shape of light receiving apertures or windows, convenience in the arrangement of conductor lines and so on.

Next, a third method which also uses the transient refreshing mode capable of a high-speed refreshing operation and which can substantially eliminate the above-described problem or defect will be described.

According to the third method, the base potential 210 at the state 6 in FIG. 8(b) is brought to zero potential.

Then, the zero base potential is same as the zero base potential when the refreshing pulse was applied in the state 1 in FIG. 8(b) so that the positive transient refreshing mode operation can be ensured.

Figure 21A:
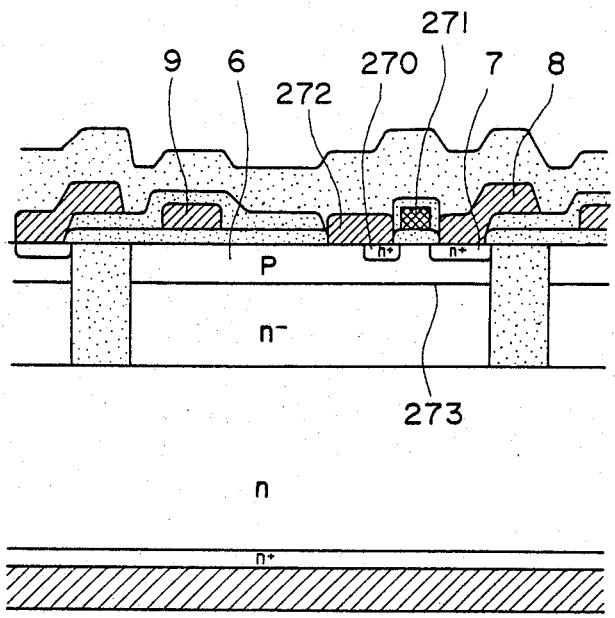
FIG. 21(a) is a sectional view of a further embodiment of the photosensor cell in accordance with the present invention.
Figure 21B:
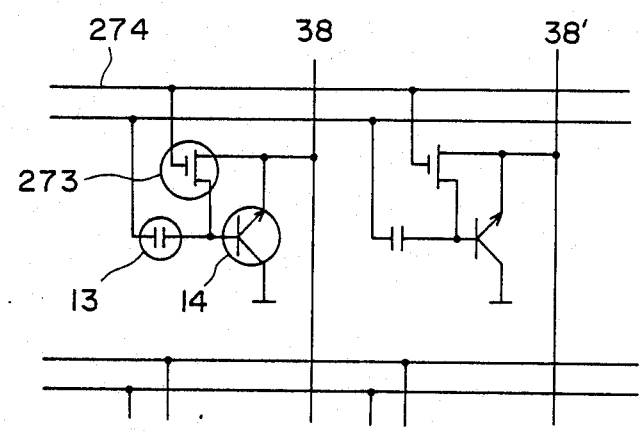
FIG. 21(b) shows an equivalent circuit thereof.

In FIG. 21 is shown an embodiment of the present invention adapted to carry out the third method. FIG. 21(a) is a sectional view of a photosensor cell and FIG. 21(b) shows an equivalent circuit thereof. The emitter region 7 of the fundamental photosensor cell as shown in FIG. 1 and an n+ region 270 constitute a drain and source, respectively, of a MOS transistor 273 which is controlled by a gate 271 made of polysilicon or the like. The n+ region 270 is connected through a conductor line 272 to the base region 6 of the fundamental photosensor cell. Except the above-described arrangement, the embodiment shown in FIG. 21(a) is substantially the same in construction as the fundamental photosensor cell shown in FIG. 1.

FIG. 21(b) shows the equivalent circuit of the photosensor cell as shown in FIG. 21(a). The MOS transistor 273 comprising the drain region 7 which is in common with the emitter of the photosensor cell, the gate 271 and the source region 270 is connected through the conductor line 272 to the base region 6 of Xthe photosensor cell. The drain region is in common with the emitter region and the gate 271 is connected to a conductor line 274 so that a pulse may be applied from the exterior.

In the refreshing operation, the storage operation and the readout operation, it is assumed that a negative potential is applied through a conductor line 274 to the gate 271 of the MOS transistor 273 in such a way that the channel of the MOS transistor 273 is sufficiently driven into the nonconduction state. In the case of the state 6 shown in FIG. 8(b), when the potential 210 of the base region is maintained at a negative potential, the emitter is grounded. When the gate 271 is brought to zero potential or is raised to a positive potential under these conditions, the channel of the MOS transistor is turned on. Therefore, it is clear that a current flows so that the base potential is brought to zero potential.

As described above, the base potential can be brought to zero in the state 6 so that, as described with reference to FIG. 8(b), a positive transient refreshing mode operation can be carried on in the next refreshing operation and consequently a high-speed refreshing operation becomes possible.

In the case of the embodiment shown in FIG. 21, the MOS capacitor electrode 9, the conductor line interconnecting the source region of the MOS transistor 273 and the base region 6 of the photosensor cell, the gate 271 of the MOS transistor and the conductor line 8 connected to the emitter region 7 of the photosensor cell are all shown on the same plane for the sake of explanation and the light receiving apertures or windows are depicted to occupy an extremely small area, but it is to be understood that in a practical device the above-described component parts may be suitably arranged in the same photosensor cell upon consideration of the shape of light receiving apertures or windows, convenience in the arrangement of conductors and so on.

So far, the refreshing operation and the readout operation have been described as being carried out by the electrode 9 on the p base region 6 through Cox, but the refreshing operation can also be carried out by the nMOS. In the latter case, a readout pulse is applied to the electrode 9. After the readout operation of one horizontal line has been completed, the refreshing operation of the sensor cells along this horizontal line is carried out as follows. That is, during a blanking period prior to the readout from the sensor cells along the next horizontal line, a positive potential is applied to the electrode 271 so that the nMOS is turned on and concurrently a negative voltage −Vp is applied to the vertical lines 38, 38′ and so on. The p base region 6 is charged to $-(V_p - V_{TH})$ and the refreshing operation is completed. $V_{TH}$ designates the threshold voltage of the nMOS. The use of nMOS in this manner is, so to speak, an operation by which the channel and the n+ region 270 are driven to the same potential.

A completely independent nMOS may be provided for the refreshing of the p base. In this case, the n+ emitter is completely independent and further two n+ regions 270 and 275 are formed in the p base, whereby an nMOS is provided.

Figure 22:
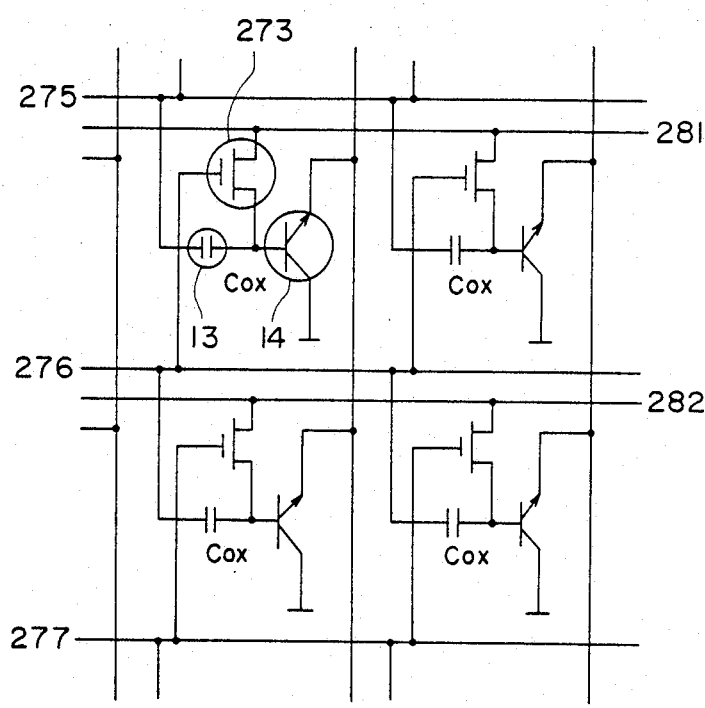
FIG. 22 is a circuit diagram of a photoelectric converter consisting of photosensor cells of the type as show in FIG. 21.

As in the case of the embodiment as shown in FIG. 21(a), the n+ region 270 is directly connected through a conductor line to the p base, whereas the other n+ electrode 275 is applied with a predetermined negative voltage −Vp when a voltage is applied to turn on the electrode 271. FIG. 22 shows a circuit diagram thereof. Lines 281, 282 and so on are provided along the horizontal lines in order to apply a negative voltage.

After the readout from the sensor cells along the horizontal line 275 has been completed by applying a readout pulse to the horizontal line 275, a readout pulse is applied to the next horizontal line 276 for readout thereabove. Then, the readout pulse is also applied to the gate of the refresh nMOS transistor 273 of each sensor cell along the horizontal line 275 and a negative voltage −Vp is applied to the line 281. As a result, while the readout from the sensor cells along the horizontal line 275 is carried out, the refreshing is accomplished.

Next, a further embodiment of the present invention which can substantially overcome the above described drawbacks and which is capable of a high-speed refreshing operation will be described. According to the refresh operation described heretofore, a pulse is applied through the MOS capacitor to the base so as to bring the base potential to a positive potential. More specifically, when the base potential is maintained at a positive potential, the base-collector junction diode Dbc is turned on so that holes flow out of the base and consequently the transfer refresh operation is carried out in such a way that the base potential decreases toward zero potential or the complete refreshing operation is carried out in such a way that the base potential is completely grounded. In the case of the p base, a predetermined quantity of holes have disappeared from the base so that when the refreshing pulse is removed, the p base is negatively charged at a predetermined negative voltage.

In contrast thereto, in the embodiments to be described in detail below, the refreshing operation is carried out based on a concept that a MOS transistor is added to each photosensor cell so that a predetermined negative potential is given by removing the holes which have been produced in response to the incident light and stored.

An embodiment will be described in more detail with reference to FIGS. 23(a), (b) and (c).

Figure 23A:
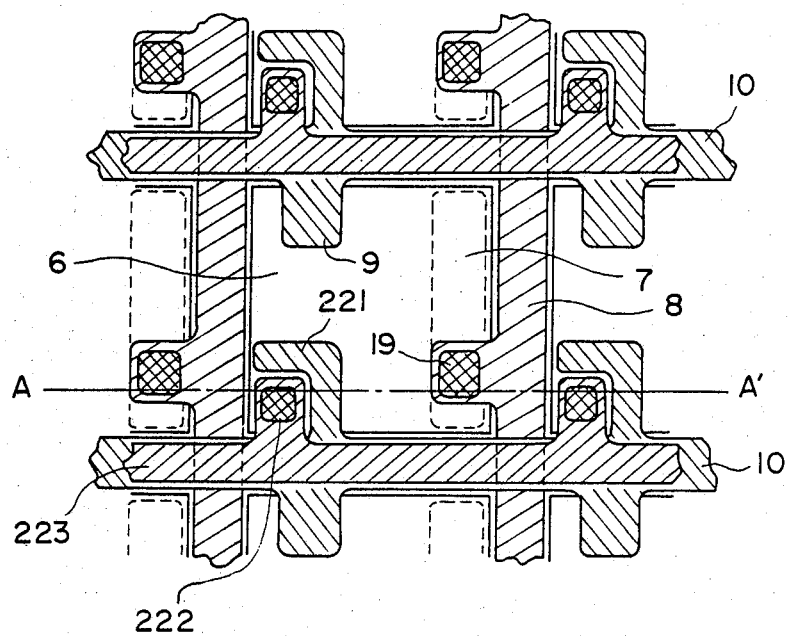
FIG. 23(a) is a plan view of a further embodiment of a photosensor cell in accordance with the present invention.
Figure 23B:
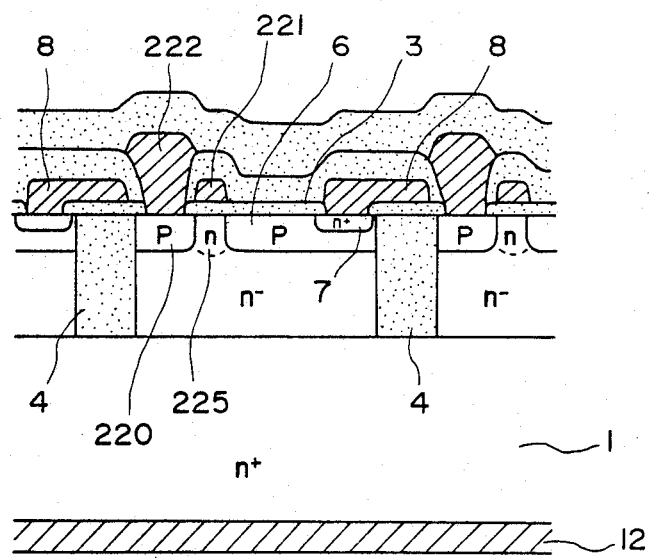
FIG. 23(b) is a sectional view taken along the line A—A' of FIG. 23(a)
Figure 23C:
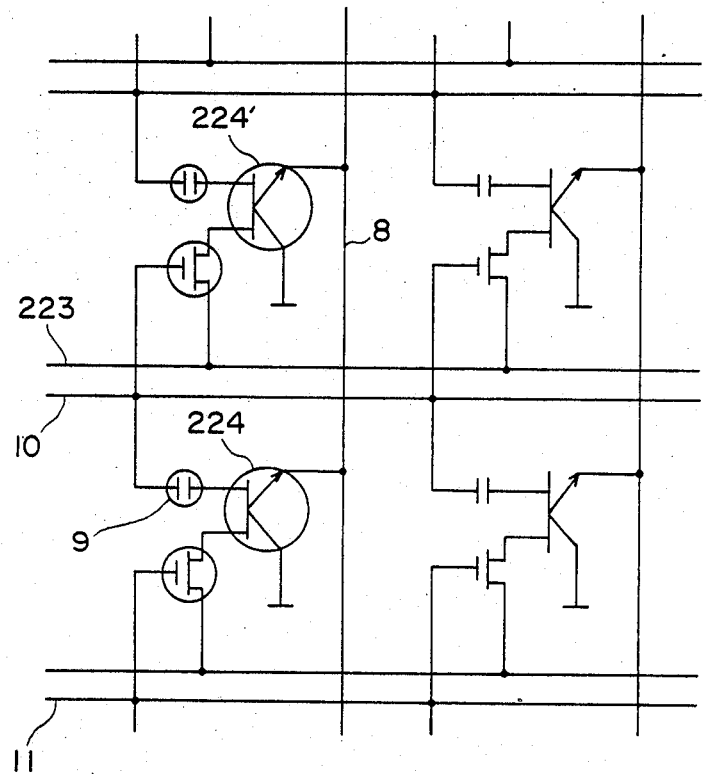
FIG. 23(c) shows an equivalent circuit of the photosensor cell shown in FIG. 23(a)

FIG. 23(a) is a plan view of a two-dimensional arrangement of unit photosensor cells; FIG. 23(b) is a sectional view taken along the line A—A′ of FIG. 23(a);

and FIG. 23(c) is a circuit diagram of a two-dimensional arrangement of unit photosensor cells.

The unit photosensor cell as shown in FIG. 23(a) is substantially the same in construction as the one shown in FIG. 1 in that there are provided an emitter region 7, a vertical readout line 8, a contact 19 between the emitter region 7 and the vertical readout line 8, a region 6 and a MOS capacitor 9.

However, while the MOS capacitor electrode 9 of the embodiment shown in FIG. 1 is used in common in the refreshing and readout operations, the MOS capacitor electrode 9 is used for the readout operation as will be described below, in this embodiment.

This embodiment is different from the embodiment shown in FIG. 1 in that a refreshing p-channel MOS transistor is added to each photosensor cell. More particularly, as best shown in FIG. 28(b), there is provided a p channel MOS transistor consisting of a p region 6, a p region 220 formed by a diffusion or ion injection process and spaced apart from a p region 6 of the photosensor cell, an n doped channel region 225 formed between the p region 6 and the p region 220, an insulating region 3 consistig of an oxide such as SiO2, and a gate electrode 221. The new p region 220 is formed simultaneously with the formation of the p region 6 of the photosensor cell. The n region 225 serving as the channel between the p regions 6 and 220 is so doped by an ion injection process or the like as to have an increased n type impurity concentration, whereby the punch-through between the source and the drain may be prevented. Even though the number of fabrication steps is somewhat increased, it will be advantageous that the p region 220 is formed very thin in the vicinity of the surface in order to suppress the punch-through between the source and drain.

As shown in FIG. 23(a), the gate 221 of the p channel MOS transistor is connected to the MOS capacitor electrode 9 and is applied with a pulse through a horizontal line 10. The p region 220 serving as the drain of the p channel MOS transistor is connected through a contact 222 to a horizontal line 223.

Therefore, the horizontal line 10, the horizontal line 223 and the vertical line 8 should be formed by a multi-layer wiring technique and insulated from each other through insulating films.

FIG. 23(c) shows that the p channel MOS transistor having a source region which is in common with the base region of the photosensor cell and a gate region which is commonly connected to the conductor 10 is added to each photosensor cell.

Next, the mode of the embodiment with the above-described construction will be described.

Prior to the storage operation in which the photoexcited holes are stored in the base, the base region is negatively biased as indicated by the state 2 in FIG. 8(b). In the charge storage operation, as indicated by the state 3, the photoexcited holes are stored in the base region so that the potential of the base region is increased positively in response to the intensity of light. Under these conditions, a readout pulse $V_R$ is applied so that the base potential is brought to a positive potential as indicated by the state 4 and cosequently the information stored in the base region is readout into the emitter region. When the readout pulse voltage $V_R$ is grounded, the state 5 is maintained. The state 5 changes to the state 6 when the information is read out through the vertical line to the exterior and then the emitter region is grounded through the vertical line 8 as described in conjunction with the above-described embodiments.

As best shown in FIG. 23(c), when a readout pulse is applied to the conductor or horizontal line 10, the information is read out from the photosensor cell 224. At this time, the same readout pulse is simultaneously applied to the gate of the p channel MOS transistor connected to a photosensor cell 224'. However, the readout pulse applied is a positive pulse so that the p channel MOS transistor is not turned on thereby and consequently the photosensor cell 224' is not influenced at all.

When the potential of the base of each photosensor cell varies depending upon the intensity of light as indicated by the state 6 in FIG. 8(b). In response to this negative pulse, the p channel MOS transistor is turned on so that the base potential of the photosensor cell 224' becomes $-(V_{SR}-V_{th})$ where $-V_{SR}$ is a power supply voltge supplied to the conductor or horizontal line 223 and $-V_{th}$ is the threshold voltage of the pMOS transistor.

Next, a photoelectric converter which has a sensitivity higher than that of the first embodiment as shown in FIG. 1 will be described with reference to FIG. 24.

Figure 24A:
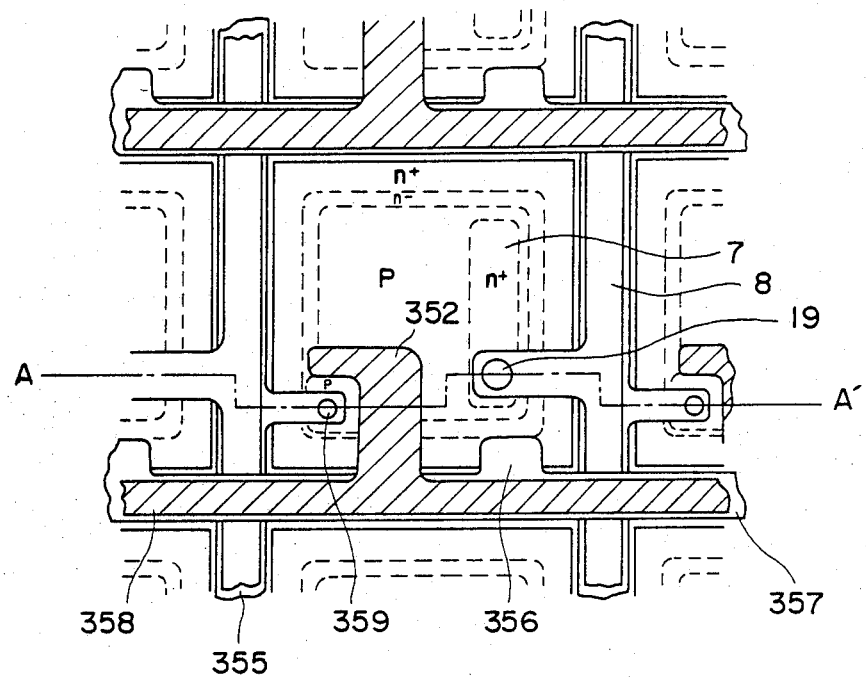
FIG. 24(a) is a plan view of a further embodiment of the photosensor cell in accordance with the present invention.
Figure 24B:
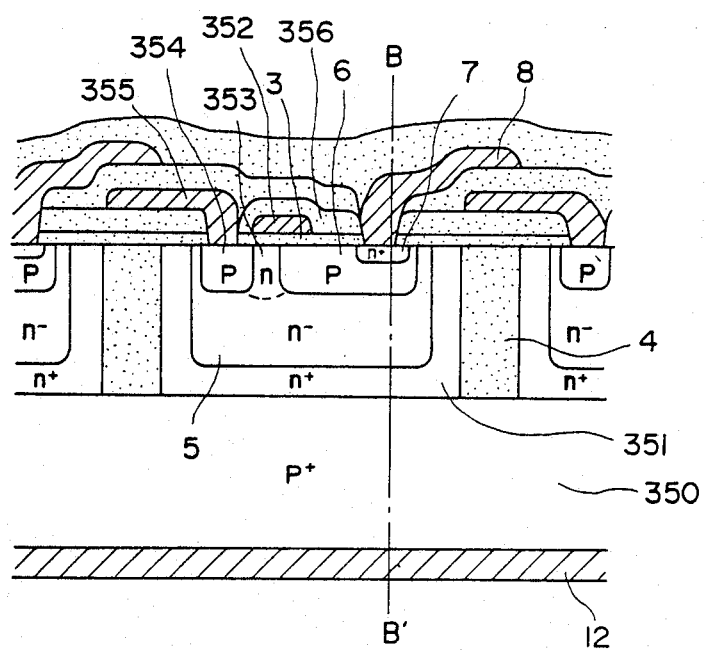
FIG. 24(b) is a sectional view taken along the line A—A' of FIG. 24(a)
Figure 24C:
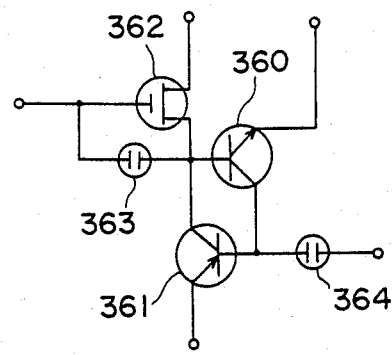
FIG. 24(c) shows an equivalent circuit thereof.
Figure 24D:
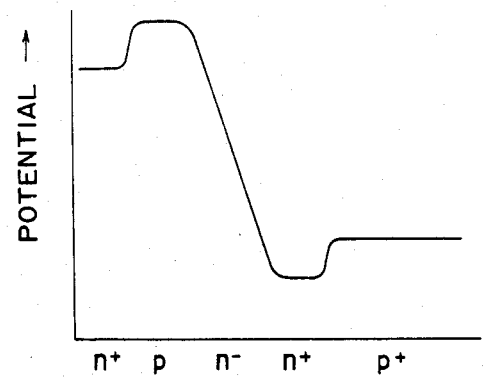
FIG. 24(d) shows a potential distribution therein.

FIG. 24(a) is a partial pan view of a two-dimensional arrangement of unit photosensor cells each having a plurality of control electrodes; FIG. 24(b) is a sectional view taken along the line A—A' of FIG. 24(a); FIG. 24(c) shows a circuit diagram of the unit photosensor cell; and FIG. 24(d) shows an example of the internal potential distribution along the section taken along the line B—B' of FIG. 24(b).

In the case of the first embodiment shown in FIG. 1, the high-resistance $n^-$ region 5, the p region 6 and the $n^+$ region 7 are formed over the n type substrate 1 so that the $n^+pn^-n$ phototransistor is provided, but in the embodiment shown in FIG. 24, these regions are formed over a $p^+$ substrate 350. That is, the embodiment shown in FIG. 24 is different from the embodiment shown in FIG. 1 in that an $n^+$ region 351 is used in place of the n type substrate 1 of the first embodiment shown in FIG. 1.

The embodiment shown in FIG. 24 has a thyristor structure because a first phototansistor comprising the $n^+$ region 7, the p region 6, the $n^-$ region 5 and the $n^+$ region 351 is overlapped with a second phototransistor comprising the p region 6, the $n^-$ region 5, the $n^+$ region 351 and the $p^+$ region 350. Therefore, the internal potential state with respect to electrons can be represented as shown in FIG. 24(d) when the abscissa is taken to represent the section from the surface of the semiconductor toward the interior thereof. When light is incident on the photoelectric converter or unit photosensor cell under the condition that the $p^+$ region of the substrate, is positively biased through the conductor 12 disposed on the back surface of the substrate, holes, of the carriers produced in the interior of the semiconductor in response to the incident light, are stored in the p region 6 or the base of the first phototransistor as described hereinbefore with reference to FIG. 1. At this stage, in the above-described embodiments, the electrons are accelerated by the electric field produced in the high-resistance $n^-$ region and flown into the substrate 1 as the collector, whereas, in the case of the embodiment shown in FIG. 24, the $n^+$ region 351 forming a potential well for electrons is disposed in front of the substrate $p^+$ region 350. Thus, the $n^+$ region 351 forms a base of the second phototransistor so that photo-excited electrons are stored therein.

In the case of the CCD type image sensor cell or the MOS type image sensor cell, electrons, of photoexcited carriers, are stored in a main electrode and in the case of the first embodiment shown in FIG. 1, holes are stored in the control electrode region. In this way, of photoexcited electron-hole pairs, only one type of carriers are used, but in the case of the embodiment shown in FIG. 24, there are provided two control electrode regions so that holes are stored in the control electrode region of a first phototransistor while electrons, in the control electrode region of a second phototransistor. Since both types of carriers produced in response to the incident light are utilized, a high degree of sensitivity can be attained as will be described in detail below.

The unit photosensor cell shown in FIG. 24 is different from the one shown in FIG. 1 in that a refreshing p MOS transistor is added to each photosensor cell. More particularly, the p MOS transistor comprising a region 6 constituting the base of the first phototransistor, a channel doped n region 353, a p region 354, a gate insulating film 3 and a gate electrode 352, is provided and is turned on in the case of the refreshing operation so that holes stored in the p region 6 are drawn. A negative power supply is connected through a conductor 355 and a contact hole 359 to the p region 354 constituting the drain region of the p MOS transistor. The gate electrode 352 is extensitvely extended over the p region 6 so that a MOS capacitor is provided. Therefore, as is the case of the first embodiment shown in FIG. 1, the potential of the p region 6 is varied in the case of the readout operation.

The n+ region 351 constituting the base region of the second phototransistor is made in contact with a cell isolation region 4 and is extended beyond the surface of the substrate and, as in the case of the first phototransistor, a MOS capacitor comprising the insulating film 3 and an electrode 356 is formed over the n+ region 351. As a consequence, the potential of the n+ region 351 constituting the base of the second phototransistor varies through the MOS capacitor. A pulse is applied to the MOS capacitor 356 through a conductor 357 and a pulse is applied to the gate ahd the MOS capacitor through a conductor 358.

The n+ region 7 constituting the emitter of the first phototransistor and the conductor 8 are substantially the same as those described with reference to FIG. 1.

FIG. 24(c) shows a circuit diagram of the photosensor cell of the type just described above. A transistor 360 represents the first phototransistor comprising the n+ region 7, the p region 6, the n+ region 5 and the n+ region 351; a transistor 361 represents the second phototransistor comprising the p region 6, the n− region 5, the n+ region 351 and the p+ region 350; a MOS transistor 362 is the p channel MOS transistor comprising the p region 6, the n region 353, the p region 354, the gate insulating film 3 and the gate electrode 352; a capacitor 363 represents the MOS capacitor comprising the p region 6, the insulating film 3 and the electrode 352; and a capacitor 364 represents the MOS capacitor comprising the n+ region 351, the insulating film 3 and the electrode 356.

Figure 25:
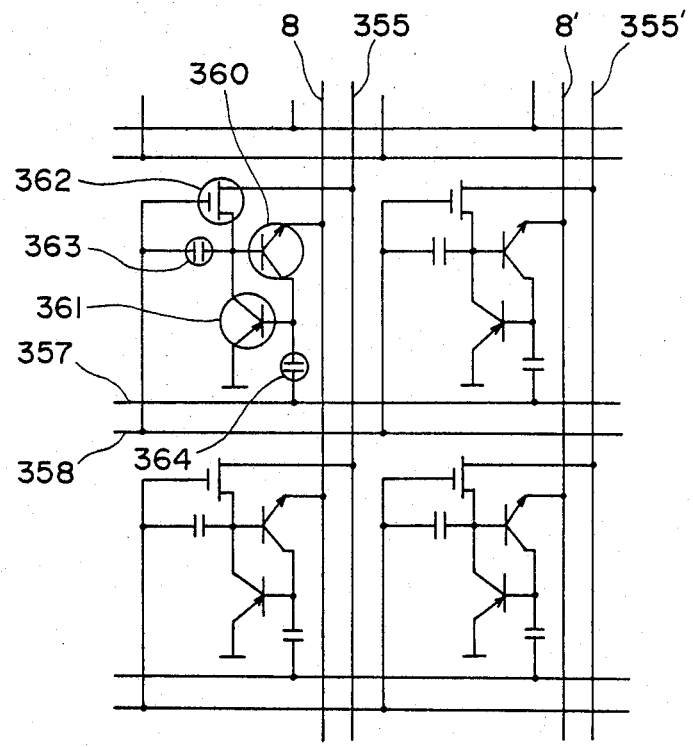
FIG. 25 is a circuit diagram of a photoelectric converter consisting of a plurality of photosensor cells of the type shown in FIG. 24.
Figure 26:
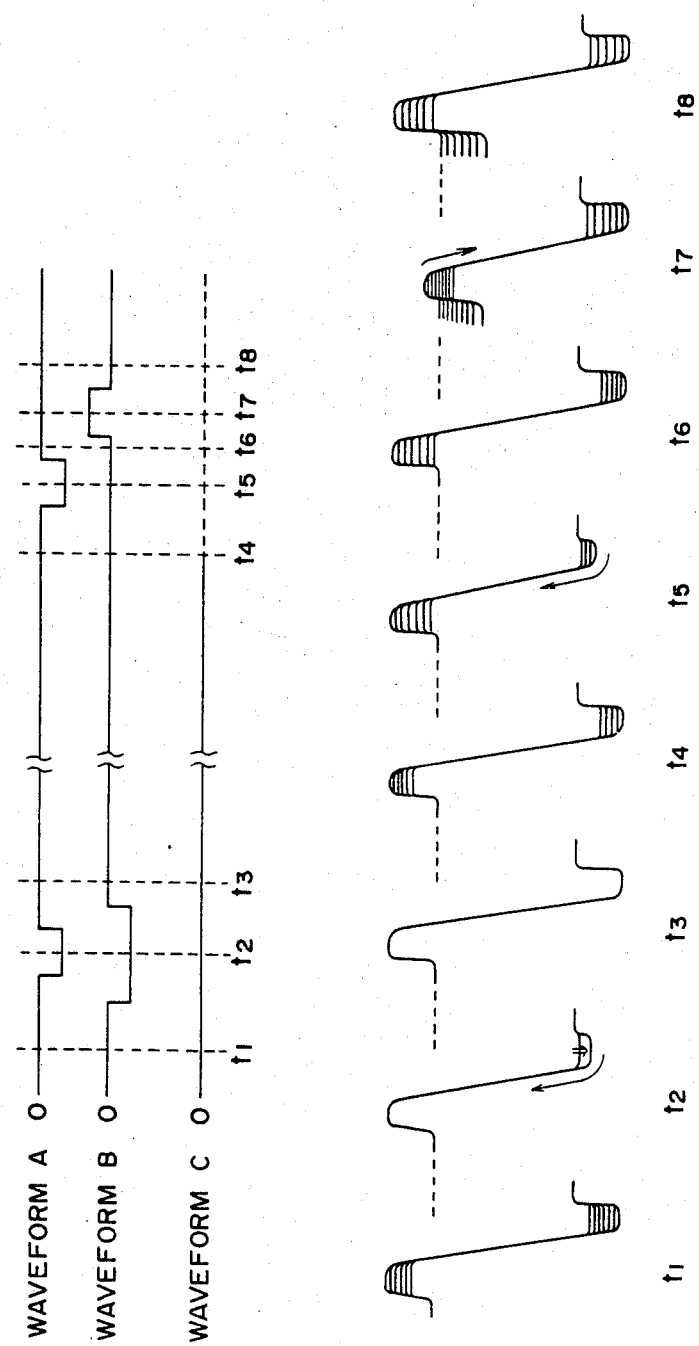
FIG. 26 is a view used to explain the mode of operation thereof.

Referring next to FIG. 25 showing a circuit diagram of a two-dimensional arrangement of photosensor cells and FIG. 26 showing pulse waveforms and internal potentials, the mode of operation of the unit photosensor cell with the above described construction will be described.

FIG. 25 shows a 2×2 arrangement of the unit sensor cells shown in FIG. 24(c), but a vertical shift register, a horizontal shift register, an output amplifier, a vertical line refreshing MOS transistor, a vertical line selection MOS transistor and so on which are additionally provided like those shown in FIG. 7 are not shown. As described hereinbefore, the MOS capacitor 363 and the gate of th p MOS transistor 362 are connected in common and are applied with a pulse through the horizontal line 358, but it is to be understood that separate lines may be provided so as to apply separate pulses to the MOS capacitor 363 and to the gate of the p MOS transistor 362. A pulse waveform A as shown in FIG. 26 is applied to the horizontal line 357 while a pulse waveform B is applied to the horizontal line 358. A waveform C represents the potential of the vertical line 8 and shows that until a time $t_4$, a MOS transistor (not shown) connected to the vertical line is turned on to maintain ground potential of the vertical line 8, which is then floated from $t_4$ so that the output signals are divided from the emitter regions of the photosensor cells. However, in the case of the embodiment shown in FIG. 24, it is not essential that the emitter region of each photosensor cell is grounded until $t_4$ because the refreshing operation is carried out by the p MOS transistor 362. Therefore, even though the emitter region may be floated, the operation is not adversely affected at all.

Referring particularly to FIG. 26 showing waveforms and internal potential diagrams, the mode of operation will be described from time to time. It is assumed that the region 350 constituting the emitter of the second phototransistor is connected to a positive power supply through the electrode 12 on the back surface of the substrate. In FIG. 26, the time period from $t_1$ to $t_3$ corresponds to the refreshing operation; the time period from $t_3$ to $t_4$ corresponds to the operation for storing photo-excited carriers; and the time period from $t_4$ to $t_8$ corresponds to the readout operation.

The readout operation is completed at time $t_1$ and as shown in the potential diagram at time $t_1$, holes corresponding to the intensity of light are stored in the p region 6, i.e., the first base region, while electrons corresponding to the intensity of light are stored in the n+ region 351, i.e., the second base region. At time $t_2$, as indicated by the waveform B, a negative pulse is applied through the horizontal line 358 to the gate of the refreshing p MOS transistor 362 so that the transistor 362 is turned on. Therefore, the holes stored in the first base region flow out so that as shown at time $t_2$ of the internal potential diagram, the first base region is brought to a negative voltage supplied through the conductor 355. In this case, a negative pulse is simultaneously applied through the MOS capacitor 363 to the first base region 6 but, since the p MOS transistor 362 is kept turned on, the first base region is not influenced at all.

At time $t_2$, a refreshing pulse is applied through the horizontal line 357 and the MOS capacitor 364 to the base region of the second pototransistor 361 as indicated by the waveform A. The relationship between the applied voltage and the voltage applied to the second base region and the refreshing operation are substantially the same as those described with reference to FIG. 1. That is, as indicated at time $t_2$ of the internal potential diagram, as soon as a pulse is applied, the potential of the n+ region 351 constituting the base and having been forward biased with respect to the p+ region constituting the emitter is gradually moved to the built-in voltage as indicated by the arrow. However, as shown in FIG. 24(b), the area of contact between the n+ region 351 constituting the base of the second phototransistor and the p+ region constituting the emitter of the second phototransistor is very large so that the refreshing operation is by far faster than the refreshing operation of the first embodiment described with reference to FIG. 1.

Thereafter, when the voltage applied to the n+ region 351 constituting the second base region returns to ground potential, the potential of the n+ region 351 is reverse biased with respect to the p+ region constituting the emitter of the second phototransistor. This operation is substantially similar to the refreshing operation described hereinbefore.

From time $t_3$ to time $t_4$, carriers produced in response to the incident light are stored. As described before, among the carriers produced in response to the incident light, holes are stored in the base region of the first phototransistor 360 while electrons are stored in the base region of the second phototransistor 360. In this case, if the electrons flowing into the emitter region, i.e., the first emitter region, of the first phototransistor as well as the electrons slightly varnishing due to recombination during the travel through a normal resistance region are neglected, almost equal amounts of charges are stored in the base regions of the first and second phototransistors. The storage voltage in each base region is equal to the value obtained by dividing the stored charge by the sum of the base-emitter capacitance and the base-collector capacitance of each phototransistor as described hereinbefore in conjunction with the first embodiment shown in FIG. 1. As described above, in the photosensor cell shown in FIG. 24, there are a plurality of base regions, i.e., control electrodes, but these base regions can be considered to function independently and equally while they are different in that either electrons or holes are concerned.

The internal potential diagram shown at time $t_4$ in FIG. 26 shows that photo-excited carriers are stored in respective base regions. At $t_4$, as indicated in the waveform C, the emitter region of the first phototransistor is floated and is ready to read out the next signal.

At time $t_5$, as shown by the waveform A, a pulse is applied through the horizontal line 357 and the MOS capacitor 364 to the base region of the second phototransistor 361 so that, as indicated by the potential diagram $t_5$, the base region is forward biased. As a result, holes are injected from the emitter region of the second phototransistor (the second emitter region) into the base region of the first phototransistor in proportion to the voltage stored corresponding to the intesity of light. Therefore, in the base region of the first phototransistor, the holes in proportion to the electrons stored in the base reg-:on of the second phototransistor are added to the holes photo-generated therein. The number of holes injected from the emitter region of the second phototransistor is dependent upon the time period during which the base region of the second phototransistor is forward biased so that a desired gain can be controlled. Further, in this case, the magnitude and time of the forward bias of the base region of the second phototransistor are optimally controlled so that the linearity of the number of injected holes may be ensured. The above-described operation principle is substantially the same as that described in conjunction with the first embodiment shown in FIG. 1. At time $t_6$, the voltage applied to the base region of the second phototransistor is returned to the initial state and, as indicated by the internal potential diagram at time $t_6$, the base region of the second phototransistor is reverse biased with respect to the emitter region thereof as is the case prior to the application of the pulse. Thus, the injection of holes is stopped.

At time $t_7$, as indicated in the waveform B, a voltage is applied through the horizontal line 358 and the MOS capacitor 363 to the base of the first phototransistor 360 so that the base region of the first phototransistor is forward biased with respect to the emitter region thereof. The pulse is positive and a voltage is also applied to the gate electrode of the p MOS transistor 362 connected in parallel with the MOS capacitor 363. However, the positive voltage is applied so that the p MOS transistor is not turned on and consequently the operation is not adversely affected at all.

Since the first emitter region is in the floating state, when the first base region is forward biased, the electrons are injected from the emitter region into the first base region so that the potential of the first emitter region varies and consequently the signal voltage stored in the first base region is read out. The above-described operation is substantially the same as that described above with reference to FIG. 1. However, there occurs a phenomenon that in the case of the embodiment shown in FIG. 24, the electrons which flow out of the first emitter region are stored in the second base region and, if the electrons are too much, a thyristor action partially occurs to cause a further increase in gain. This phenomenon, however, causes the nonlineary of the output signal and, therefore, each bias condition is so determined that the thyristor action will not occur. It is preferable, however, that the gain is increased by the thyristor action when the photoelectric converter is applied to usage wherein the linearity is not especially needed.

At time $t_8$ when the readout operation has been finished, the voltage applied through the MOS capacitor 363 to the first base region is removed so that, as indicated by the internal potential diagram $t_8$, the first base region is reverse biased with respect to the first emitter region as is the case prior to the application of the pulse. As a result, the injection of electrons from the first emitter region to the first base region is interrupted. Under these conditions, each output signal is read out on the vertical line and, as described with reference to FIG. 7, the horizontal shift register is operated so that each vertical line is selected so as to deliver the output signal to the exterior through the output amplifier. In the embodiment shown in FIG. 24, when holes are injected into the first base at $t_5$, the p region 354 of the p MOS transistor is connected to the negative power supply. As a result, there occurs a phenomenon that part of the holes are injected into this p region 354. When the p region 354 is small in size, the quantity of holes injected therein is not so great and in order to further decrease the number of holes injected into the p region 354, the SOI (silicon on insulator) technique may be employed so as to form a p MOS transistor on a cell isolation region. As has been described with reference to FIG. 1, in the refreshing operation and the readout operation, the magnitudes of the pulses in the waveforms A and B are determined at optimum values, respectively.

As described above, in the embodiment shown in FIG. 24, there is employed a system in which both carriers, i.e., photo-excited holes and electrons, are stored in a plurality of control electrode regions and then read out respectively while obtaining an increased gain. Therefore the photoelectric converter with a high degree of sensitivty can be provided.

Figure 27A:
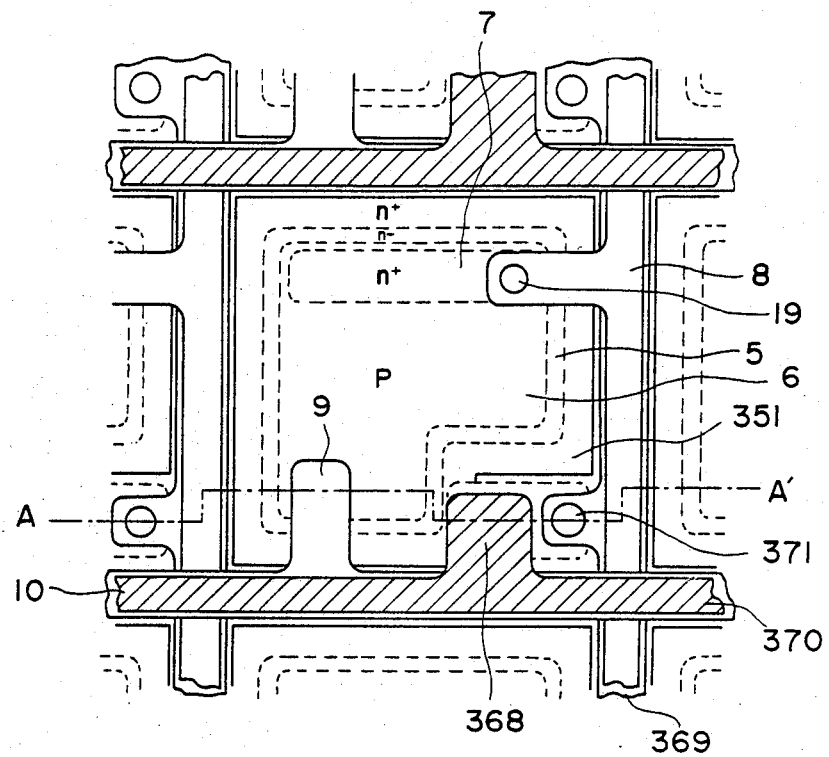
FIG. 27(a) is a plan view of a further embodiment of a photosensor cell in accordance with the present invention.
Figure 27B:
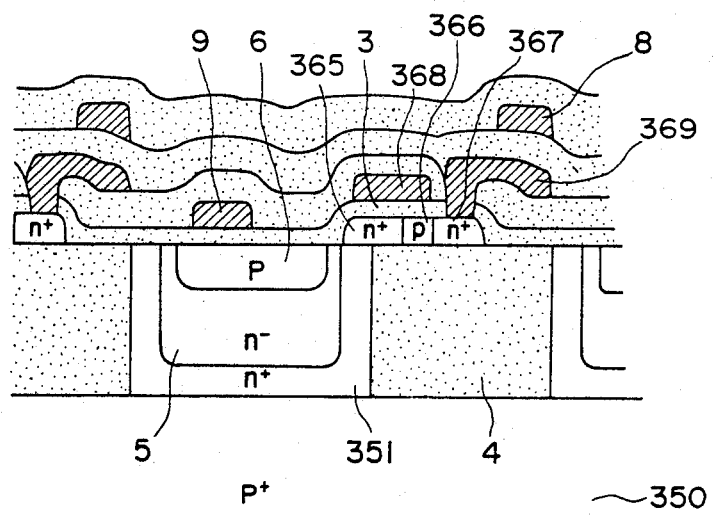
FIG. 27(b) is a sectional view taken along the line A—A' of FIG. 27(a)
Figure 27C:
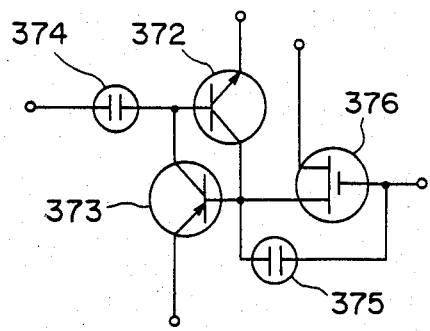
FIG. 27(c) shows an equivalent circuit thereof.

In FIG. 27 is shown a further embodiment having a plurality of control electrode regions as is the case of the embodiment shown in FIG. 24. In the embodiment shown in FIG. 24, the base region of a first phototransistor is refreshed by means of a p MOS transistor, but in the embodiment shown in FIG. 27, the base region of a second phototransistor is refreshed by means of an n MOS transistor. FIG. 27(a) shows a partial plan view ofaa two-dimensional arrangement of unit photosensor cells; FIG. 27(b) is a sectional view taken along the line A—A' of FIG. 27(a); and FIG. 27(c) is a diagram of an equivalent circuit of the unit sensor cell.

In FIG. 27, an n MOS transistor 376 is formed in a crystal silicon layer which is obtained through recrystallization by the laser beam annealing process or the electron beam annealing process from amorphous silicon formed by a sputtering process or from polysilicon by a CVD process on a cell isolation region 4. The n MOS transistor comprises an n+ region 365, an n+ region 367, a channel doped p region 366, a gate insulating film 3 and a gate electrode 368. The n+ region 365 is connected to an n+ region 351 constituting the base region of a second phototransistor and the n+ region 367 is connected through a contact hole 371 to a conductor 369 so that a positive voltage may be supplied from a positive power supply. The gate electrode 368 partially extends over the n+ region 365 so that a MOS capacitor is provided. A pulse is applied to the gate electrode 368 through a horizontal line 370.

The MOS capacitor comprising the electrode 9 for applying a pulse to the base region 6 of a first phototransistor for the refreshing and readout operations, the insulating film 3 and the base region 6, the n+ region 7 constituting the emitter region of the first phototransistor, the vertical line 8 for reading out the signal from the n+ region 7 and the contact hole 19 for interconnecting the vertical line 8, the n+ region 7, etc. are substantially the same as those described with reference to FIGS. 1 or 24.

The p region 366 constituting the channel region of the n MOS transistor is connected to the n+ region constituting the source region.

In FIG. 27(c) is shown an equivalent circuit of the unit photosensor cell. A first phototransistor 372 comprises the n+ region 7, the region 6, the n− region 5 and the n+ region 351; a second phototransistor 373 comprises the p region 6, the n− region 5, the n+ region 351 and the p+ region 350; a MOS capacitor 374 comprises the electrode 9, the insulating film 3 and the p region 6; another MOS capacitor comprises the electrode 368, the insulating film 3 and the n+ region 365; and an n MOS transistor 376 comprises the n+ region 365, the p region 366, the n+ region 367, the insulating film 3 and the electrode 368.

Figure 28:
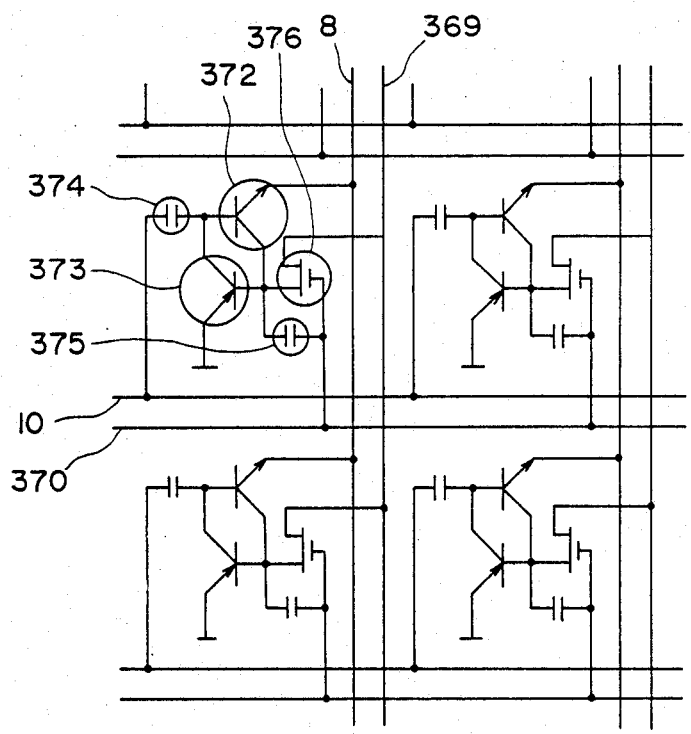
FIG. 28 is a circuit diagram of a photoelectric converter consisting of photosensor cells of the type shown in FIG. 27.

FIG. 28 shows a 2×2 arrangement of unit photosensor cells as shown in FIG. 27. A vertical shift register, a horizontal shift register, an output amplifier, a vertical line refreshing MOS transistor and a vertical line selection MOS transistor all of which are essentially the same as those described with reference to FIG. 7 are disposed around the 2×2 arrangement, but they are not shown in FIG. 28.

Figure 29:
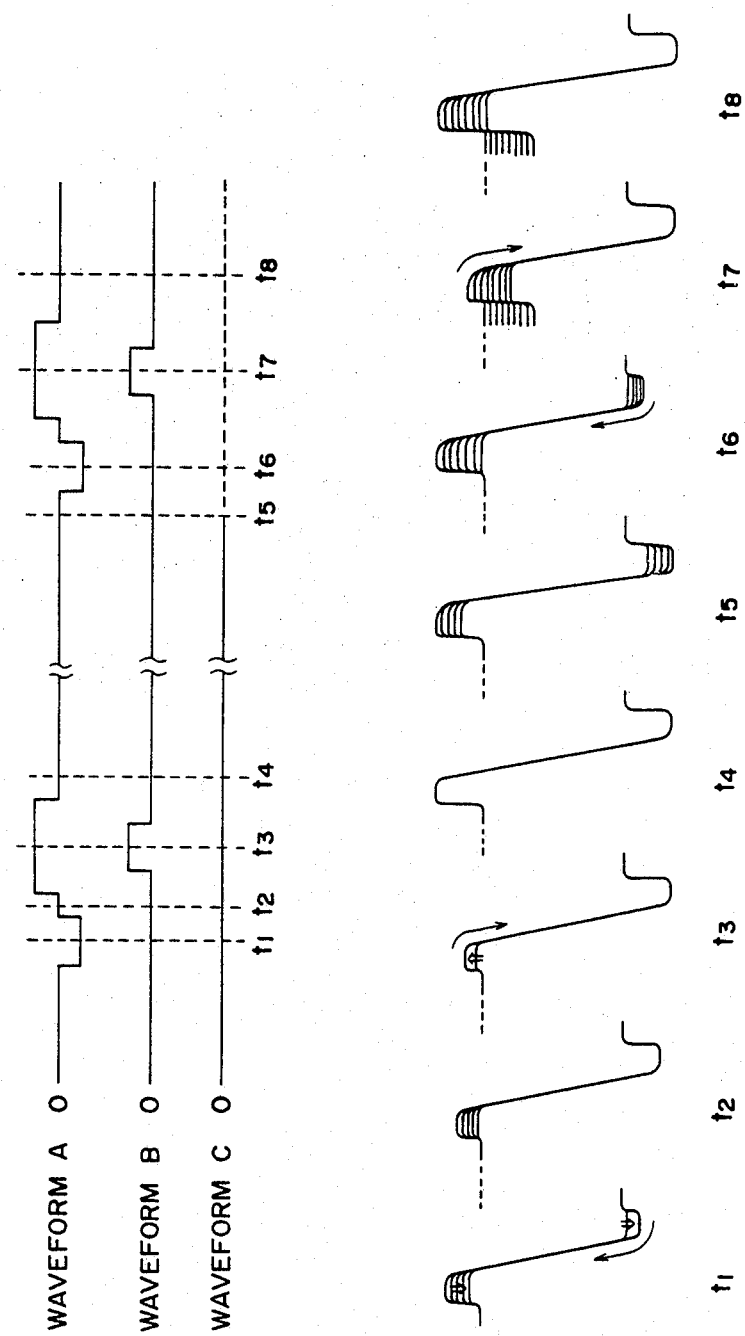
FIG. 29 is a view used to explain the mode of operation thereof.

The mode of operation of the unit sensor cell as well as the mode of operation of the photoelectric converter as shown in FIG. 28 will be described in detail below with reference to FIG. 29 showing pulse waveforms and internal potential diagrams.

Pulses as shown in a waveform A in FIG. 29 are applied to the horizontal line 370 and pulses in a waveform B in FIG. 29 are applied to the horizontal line 10. A waveform C represents the potential of the vertical line 8. As shown by the waveform C, until time $t_5$, a MOS transistor (not shown) connected to the vertical line for refreshing the charge thereon is kept turned onto maintain the vertical line at ground potential and, from time $t_5$, the vertical line is floated so that the signal from the emitter region of each photosensor cell is read out.

The mode of operation will be sequentially described from time to time with reference to the pulse waveforms and the internal potential diagrams. In FIG. 29, the time period from $t_1$ to $t_4$ corresponds to the refreshing operation; the time period from $t_4$ to $t_5$ corresponds to the operation for storing photo-excited carriers; and the time period from $t_5$ to $t_8$ corresponds to the signal readout operation. When a negative voltage pulse is applied through the horizontal line 370 at time $t_1$ as indicated by the waveform A, a negative potential is applied through the MOS capacitor 375 to the base region of the second phototransistor 373 so that, as indicated by the internal potential diagram $t_1$, the base region is brought to a negative potential and is forward biased with respect to the emitter region of the second phototransistor 373. Consequently, holes are injected into the base region from the emitter region so that the potential of the base region of the first phototransistor is charged toward a positive potential. In this case, as described hereinbefore, the potential of the second base region is gradually changed from the forward biased state toward the built-in voltage. As described with reference to FIG. 1, the holes are injected into the first base region at this time point so as to bering the potential of the first base region to a positive potential so that the transient refreshing operation can be carried out more positively.

When this negative pulse is applied, the negative pulse is also applied to the n MOS transistor 376 because the MOS capacitor 375 and the gate of the nMOS transistor 376 are connected in common, but the n MOS transistor remains turned off so that the operation is not adversely affected.

At time $t_2$, the negative pulse returns to ground potential as indicated by the waveform A. At the instant when the negative potential of the second base is returned to ground potential, as indicated by the internal potential diagram at time $t_2$, the second base region is reverse biased with respect to the second emitter region so that the injection of holes from the second emitter region is interrupted.

At time $t_3$, a positive pulse is applied through the conductor 370 to the gate region of the n MOS transistor 376 so that the transistor 376 is turned on. As a result, the potential of the second base region becomes equal to a positive potential supplied from a positive power supply through the vertical line 369. At this time, the positive pulse is also applied to the MOS capacitor 375, but the operation is not adversely affected. At time $t_3$, as indicated by the waveform B, a positive potential is applied to the first base region through the conductor 10 and the MOS capacitor 374. As indicated by the internal potential diagram $t_3$, the first base region is forward biased with respect to the first emitter region so that the holes flow out of the first base region and consequently the potential of the first base region is gradually increased to the built-in voltage. the above-described operation is substantially the same as the operation of the first embodiment shown in FIG. 1. The complete refreshing mode or the transient refreshing mode is selected depending upon the application of the photoelectric transistor. In this case, because th second base region is connected through the n MOS transistor to a positive power supply, an ordinary bipolar transistor operation is carried out.

At time $t_4$, respective pulse potentials are brought back to ground potential and, as idicated by the internal potential diagram $t_4$, the first and second base regions are reverse biased with respect to their respective emitter regions so that the operation for storing photo-excited carriers is initiated.

As described before, the time period from $t_4$ to $t_5$ corresponds to the operation for storing photo-excited carriers. Of the photo-excited carriers, holes are stored in the first base region while electrons are stored in the second base region as descried hereinbefore with reference to FIG. 24.

The internal potential diagram at time $t_5$ shows that photo-excited carriers are stored in the base regions of the first and second phototransistors. At time $t_5$, as indicated by the waveform C, the emitter region of the first phototransistor is floated and is ready to read out the next signal because the MOS transistor 376 connected to the vertical line 369 is turned off. At time $t_6$, as indicated by the waveform A, a negative pulse is first applied through the horizontal line 370 and the MOS capacitor 375 to the base region of the second phototransistor 373 so that, as indicated by the internal potential diagram at time $t_6$, the second base region is forward biased with respect to the second emitter region. Accordingly, in the base region of the first transistor, in addition to the holes generated therein by photo-excitation, those holes proportional to the charge stored corresponding to the intensity of light in the second emitter region are injected as indicated by the arrow and stored. The above-described operation is substantially the same as the operation described before with reference to FIG. 24.

At time $t_7$, as indicated by the waveform A, a positive voltage is applied through the horizontal line 370 to the gate region of the n MOS transistor 367 so that the transistor 376 is turned on. Therefore, the second base region is connected through the n MOS transistor 376 and the vertical line 369 to a positive power supply so that the operation of the first phototransistor becomes substantially the same as that of the bipolar transistor described with reference to FIG. 1. Furthermore, at time $t_7$, as indicated by the waveform B, the signal readout operation carried out by applying a positive voltage to the first base region through the horizontal line 10 and the MOS capacitor 374 is substantially the same as that described with reference to FIG. 1 so that further explanation is omitted. Moreover, the explanation of the internal potential diagram $t_8$ shall not be made because the operation indicated by this potential diagram is substantially the same as that described with reference to FIG. 1.

As described above, the embodiment described with reference to FIGS. 27, 28 and 29 is different from the embodiment as shown in FIG. 24 in that the operation substantially the same as that described with reference to FIG. 1 can be carried out without the fear of undesirable thyristor action in the readout operation. Yet, a photoelectric converter with a high degree of sensitivity can be provided as is the case of the embodiment described before with reference to FIG. 24.

Figure 30:
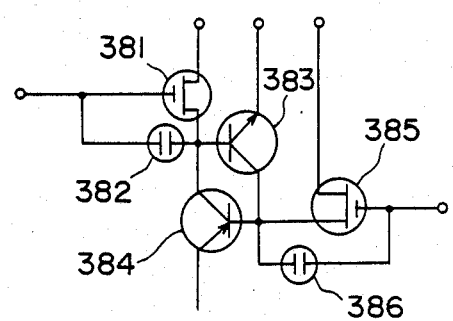
FIG. 30 shows an equivalent circuit of a modification of the photoelectric converter of the type shown in FIG. 28.

In FIG. 30 is shown a diagram of an equivalent circuit of a unit photosensor cell of the present invention in which a refreshing p MOS transistor of the type as shown in FIG. 24 is added to the base region of a first phototransistor while a refreshing n MOS transistor is added to the base region of a second phototransistor.

Figure 31:
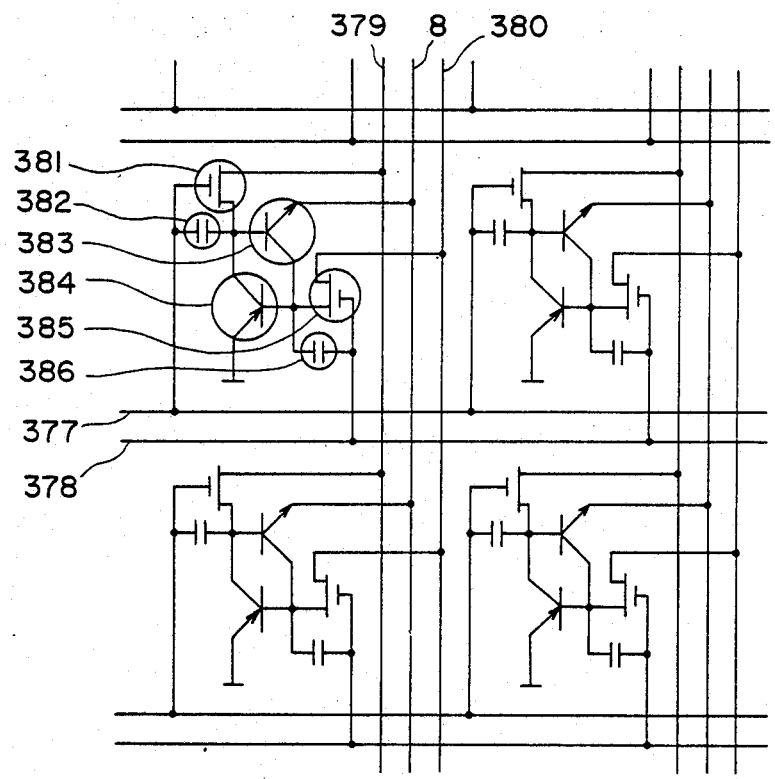
FIG. 31 is a circuit diagram of a photoelectric converter consisting of photosensor cells as shown in FIG. 27.

The embodiment shown in FIG. 30 has a structure substantially identical to a combination of the structures shown in the plan and sectional views in FIGS. 24 and 27 so that a plan view and a sectional view of the embodiment of FIG. 30 is not shown. In FIG. 31 is shown a 2×2 two-dimensional arrangement of a photoelectric converter, but its peripheral devices of the types described before are not shown.

Figure 32:
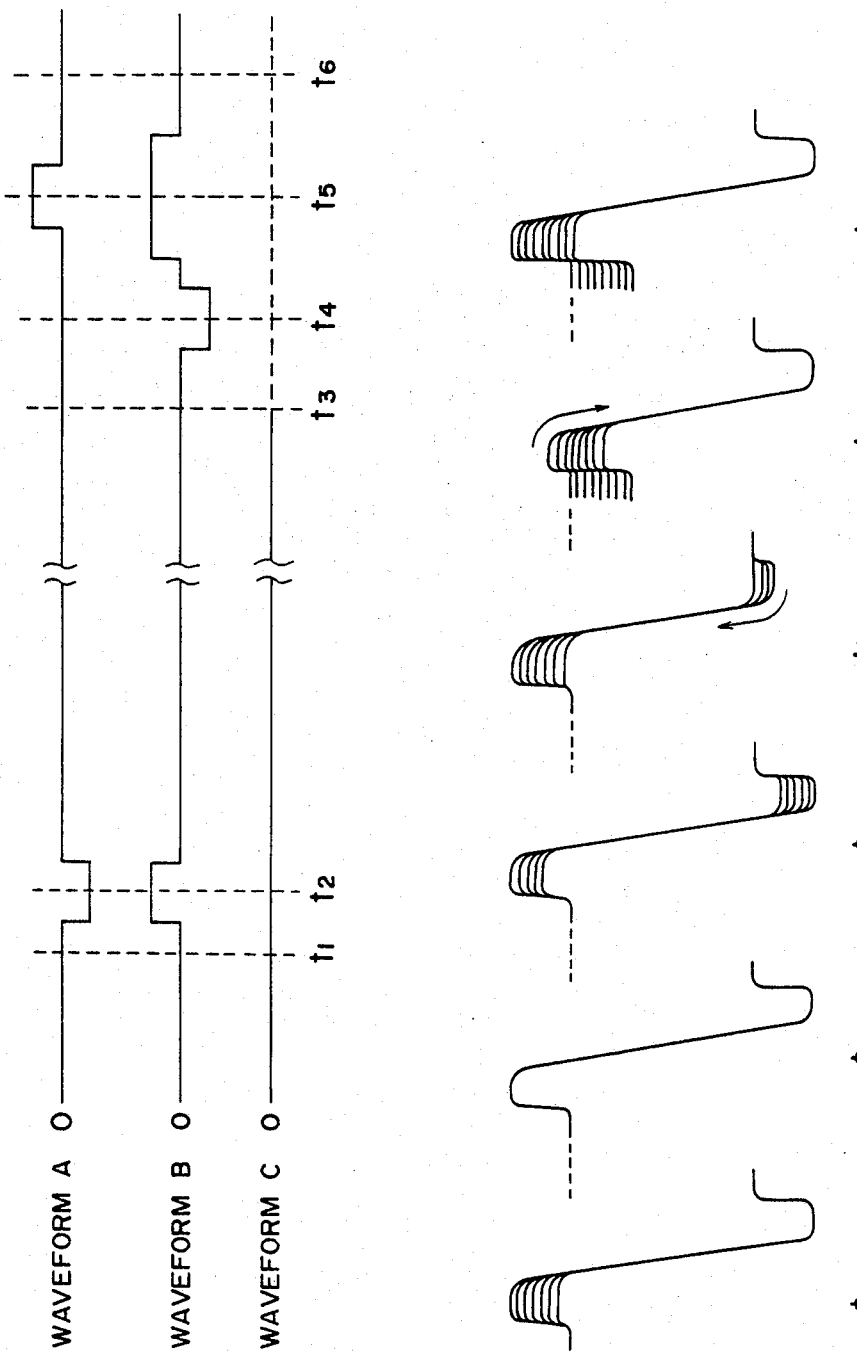
FIG. 32 is a view used to explain the mode of operation thereof.

FIG. 32 shows waveforms applied to respective lines and internal potential diagrams. In FIG. 32, a waveform A is applied through a horizontal line 377 to the gate region of a p MOS transistor 381 and a MOS capacitor 382; a waveform B is applied through a horizontal line 378 to the gate region of an n MOS transistor 385 and a MOS capacitor 386; and a waveform C representrs the potential of a vertical line 8 as is the case of the embodiment described hereinbefore.

Further, it is assumed that the vertical line 379 is connected to a negative power supply and the vertical line 380 a positive power supply, respectively.

In the embodiment as shown in FIGS. 30 and 31, the readout operation carried out during the time period from $t_4$ to $t_6$ is substantially the same as that of the embodiment described with reference to FIG. 27. The embodiment shown in FIGS. 30 and 31 is different from the previously described two embodiments in the refreshing operation. That is, at time $t_2$, both the p MOS and n MOS transistors 381 and 385 are simultaneously turned on so that the hole flow out of the first base region and electrons flow out of the second base region and consequently the refreshing operation can be accomplished in an extremely simple manner.

Therefore, while the waveform C shows that the emitter region of the first phototransistor 383 is grounded, but it is not necessary in the refreshing operation to ground the emitter region of the first phototransistor. In other words, the emitter of the first phototransistor 383 may be maintained in any desired state.

In the cases of the embodiments described above with reference to FIGS. 24, 27 and 30, by using a photosensor cell of a thyristor structure comprising two main electrode regions of opposite conduction types and two control electrode regions disposed adjacent to the respective main electrode regions and having conductive types respectively opposite to those of the main electrode regions, of photo-excited electron-hole pairs, holes are stored in a first control electrode region while electrons are stored in a second control electrode region. Therefore, these embodiments have a significant feature as compared with a photoelectric converter of the type in which, of photo-excited carriers, only holes or electrons are utilized. Thus, a photoelectric converter with a high degree of sensitivity is provided.

Hereinabove, photoelectric converters of the type capable of amplifying the photo-excited carriers within themselves have been described with reference to some embodiments. The structures described so far are those in which the photo-excited carriers are generated within a single crystal, but it is to be understood that, as will be described in detail below, there may be provided a structure in which a readout transistor is disposed in a single crystal, an amorphous or a polycrystalline layer is provided on the surface of the single crystal, and a transistor only for receiving light is provided by the use of the amorphous or polycrystallinne layer at a position corresponding to and above the readout transistor.

Figure 33A:
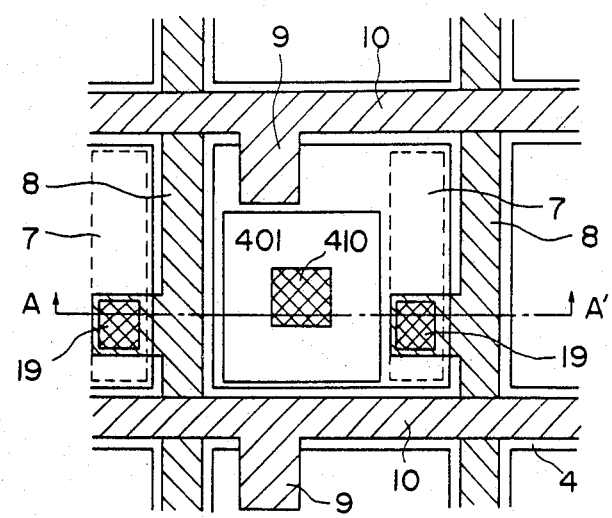
FIG. 33(a) is a plan view of a photosensor cell in accordance with the present invention with part of the cell moved.
Figure 33B:
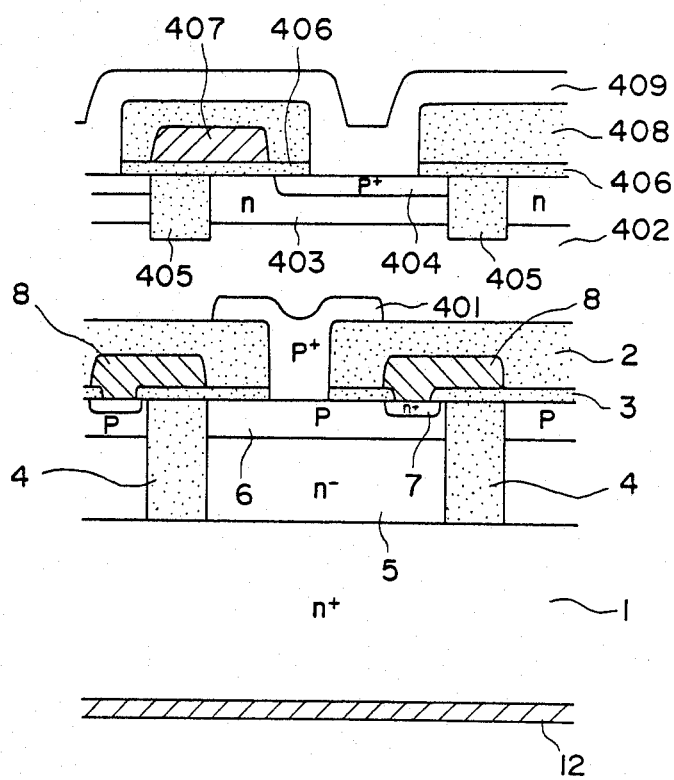
FIG. 33(b) is a sectional view taken along the line A—A' of FIG. 33(a)
Figure 33C:
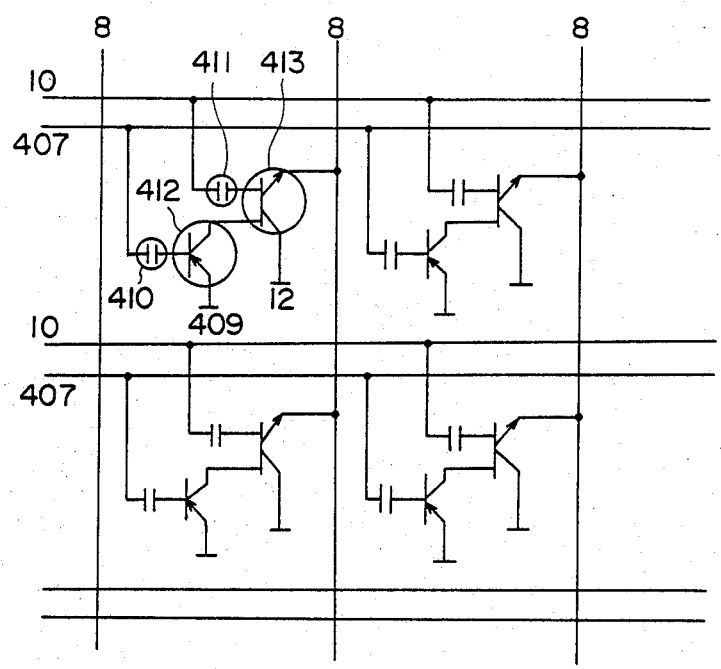

A typical embodiment of such photoelectric converter as described above is shown in FIG. 33. FIG. 33(a) is an internal plan view of a unit photosensor cell showing a substantial part thereof including a readout transistor disposed within a single crystal; FIG. 33(b) is a sectional view taken along the line A—A' of FIG. 33(a); and FIG. 33(c) shows a two-dimensional arrangement of such cells. The plan view shown in FIG. 33(a) is essentially the same as that shown in FIG. 1(a) except that a p+ region 401 constituting the collector of a light receiving transistor is disposed within an amorphous layer formed on a signle crystal in which is disposed a readout transistor. The p+ polysilicon region 401 is connected through a contact hole 410 to a p region constituting the base of the readout transistor. In an actual cell structure, an amorphous silicon layer is formed over the surface of the p+ polysilicon region 401 as best shown in FIG. 33(b). A high-resistance region 402 has such a low impurity concentration that it becomes completely a depletion layer during the operation. From a fundamental point of view, the high-resistance region 402 may be either an n− region or a p− region as are the cases of the above-described embodiments. An n region 403 and a p+ region 404 correspond to the base and emitter regions, respectively, of the light receiving transistor. The n region 403 is floated and the potential of the n region 403 is controlled by a MOS capacitor comprising an electrode 407, an insulating layer 406 of $SiO_2$ or the like and the n region 403. It is preferable that the p+ region has an impurity concentration of the order of $1\times10^{20}$ cm$^{-3}$ or higher. The impurity concentration of the n region 403 is preferably of the order of $1-50\times10^{17}$ cm$^{-3}$ so that no punch-through occurs during the operation. The thickness of the high-resistance region 402 is so determined that a desired light-sensitivity sectrum distribution can be obtained. Isolation region 405 of the light-receiving-transistor is made of $SiO_2$, $Si_3N_4$, a nondoped silicon or a combination thereof. A thin insulating oxide film 406 is formed on the amorphous layer and an insulating film 408 consists of a PSG film or a $SiO_2$ film formed by a CVD proces. A transparent electorde 409 is made of $SnO_2$, $In_2O_3$, InTiO (ITO) or the like and may be disposed to cover all the surface of the cells. The conductors 8 and 10 have been described as mainly consisting of aluminum, but in the case of the embodiment as shown in FIG. 33, these conductors 8 and 10 are covered with an amorphous silicon film and the n region 403 and the p+ region 404 are formed thereabove so that these conductors 8 and 10 are required to be made of a material capable of withstanding a high-temperature process. Therefore, these conductors are generally made of a metal having a high melting point such as Mo and W or a highly heat-resistant conductive material such as $MoSi_2$, $WSi_2$, $TiSo_2$ or $TaSi_2$. The electrode 407 may be made of aluminum or an alloy mainly consisting of aluminum. For the sake of simplicity in explanation, the electrode 407 is assumed to further serve as a conductor.

In FIG. 33(c) is shown an equivalent circuit of the two-dimensional arrangement of photosensor cells as shown in FIG. 33(a) and (b).

Next, the mode of operation of the embodiment shown in FIG. 33 will be described. The fundamental mode of operation is substantially the same as that described above so that it will be described in a simple manner.

First, the refreshing operation will be described. A negative pulse is applied through the conductor 407 to the MOS capacitor 410 so that the junction between the p+ region 404 and the n region 403 is forward biased. As a result, electrons excessively stored in the n region 403 flow out and the n region 403 is charged to a predetermined positive voltage. Concurrently, holes flow out from the p+ region 404 into the p+ region 401 so that the holes are stored in the p region 6. Thereafter, a positive pulse is applied to the conductor 10 so that the p region 6 is set to a predetermined negative voltage. Then the photosensor cell starts the operation for storing photo-excited carriers. Holes photo-excited in the high-resistance region 402 flow into the p+ region 401 while electrons flow into the n region 403. These carriers, i.e., the holes and electrons, are therefore stored in respective regions as an optical signal corresponding to the incident light signal. Next, the readout operation is started. First, a negative pulse is applied to the conductor 407 so that the junction between the p+ region 404 and the n region 403 is forward biased by, for instance, 0.5–0.65V. Then, during a pulse width of 1–0.1 microsecond, the holes, the number of which is in proportion to the charge of electrons photo-excited in the high-resistance region 402 and stored in the n region 403, flow out of the p+ region 404 into th p+ region 401. That is, not only the holes directly generated in response to the incident light but also the holes in an amount proportional to the photo-excited electrons are stored in the p region 6. After the holes in proportion to a light signal are stored in the p region 6 by utilizing the internal amplification function, a positive readout voltage is applied through the conductor 10 to the electrode 9 of the MOS capacitor 411 so that the voltage signal in proportion to the light signal is read out through the vertical line 8. The above operation has been already described in detail hereinbefore. In the photoelectric converter in accordance with the present invention, a readout voltage is high so that an amplifier can be made simple in construction and the divisional readout operation can be carried out in a simple manner as described above. The same positive voltage may be applied to the electrodes 12 and 409, but different positive voltages may be applied as the case may be.

Figure 34:
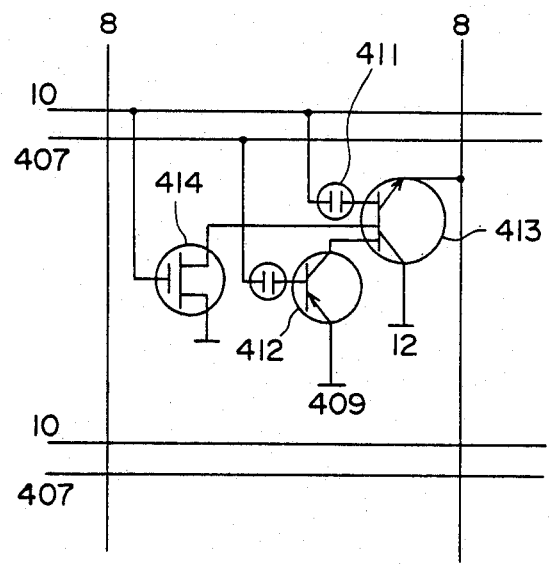
FIGS. 34, 35 and 36 show modifications, respectively, of one cell of the equivalent circuit shown in FIG. 33(c).

In FIG. 33, the p region 6 constituting the base of the readout transistor 413 and the n region 403 constituting the base of the light receiving transistor 412 are both floated. It is to be understood that, as already described, a structure in which a MOS transistor having the p region 6 as a main electrode is provided, a structure in which a MOS transistor having the n region 403 as a main electrode or a combination of these, can be adopted in such a structure where a readout transistor and a light receiving transistor are isolated from each other. This is described below with reference to FIGS. 34, 35 and 36. FIG. 34 shows an embodiment i which a p MOS transistor 414 is provided in order to refresh the p base of a readout transistor 413. A negative voltage is applied to one main electrode of the transistor 414. A negative voltage is applied to the gate of the refreshing p MOS transistor 414 for operation. Therefore, both the p MOS transistor 414 and the readout transistor 413 can be driven in common by the horizontal line 10.

Figure 35:
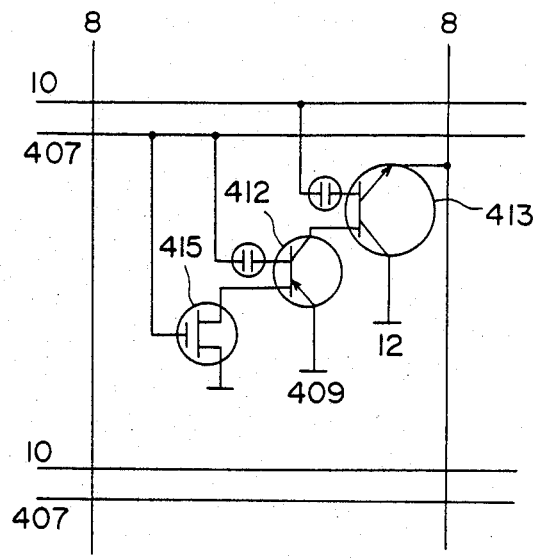

In an embodiment shown in FIG. 35, an n region 403 constituting the base of a light receiving transistor 412 is used as a main electrode of an n MOS transistor 415 for the refreshing operation. In the refreshing operation of the n MOS transistor 415, a positive pulse voltage is applied to the gate thereof so that the gate can be driven in common with the high receiving transistor 412 by the horizontal line 407. A predetermined positive voltage (which is higher than the positive potential applied to an electrode 409) is applied to the other main electrode of the n MOS transistor 415.

Figure 36:
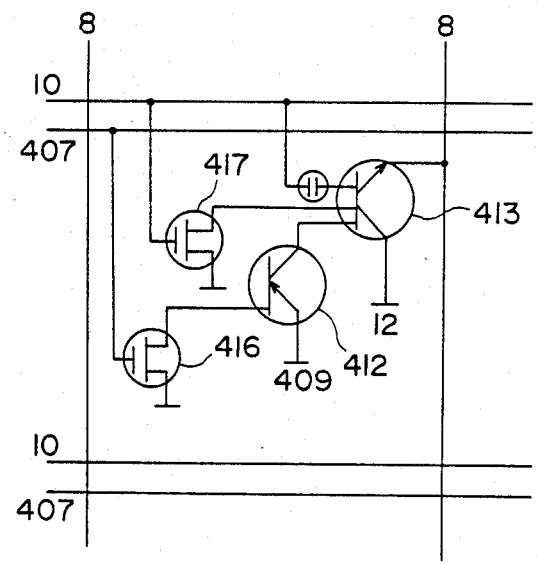

In FIG. 36, refreshing MOS transistors 416 and 417 are respectively connected to the p region 6 constituting the base of the light receiving transistor 414. The mode of operation of the embodiment as shown in FIG. 36 is substantially the same as that described hereinbefore.

The above embodiment in which transistors composed by using amorphous silicon has an advantage that because the effective light receiving area can be made larger and because amorphous silicon has a high band gap of 1.7–1.8 eV, the sensitivity to light rays with short wavelengths becomes high.

The conductors which are buried or embedded in the interior are made of the above-described metals having a high melting point or silisides thereof. A PSG film, a $SiO_2$ formed by a CVD process or an $SiO_2$ film formed by a sputtering process may be overlaid on the conductors. When it is desired that an insulating film is flattened, an $SiO_2$ film is formed through a sputtering process in the final step. This is effected within a same vacuum chamber for forming films by changing the voltage (DC bias) between the sputter electrodes whereby the modes are switched from one for formation of an $SiO_2$ film over a sample to one for sputtering of the $SiO_2$ film. Thereafter, the contact hole 410 is opened and then a p+ polysilicon film is deposited by a CVD process. Then, after a patterning step, a high-resistance amorphous silicon film is deposited to a desired thickness of, for instance, 2–7 microns. The deposition of an amorphous silicon film may be carried out by a low temperature deposition process in an ultra-high vacuum, by a sputtering process in an atmosphere of, for instance, Ar or by a CVD process (including plasma CVD processes) using $SiH_4$ or $Si_2H_6$. Furthermore, a MOCVD process using an organic metal source gas may be employed. After the insulating isolationn region 405 has been formed, the n region 403 and the p+ region 404 are formed by a diffusion or ion injection process.

As described above, the photoelectric converter of the present invention is basically characterized in that photo-excited carriers are stored in a floated base region which is a control electrode region so that it may be called Base Store Image Sensor abbreviated to "BASIS".

Particularly, the photoelectric converters of the type as shown in FIGS. 26, 29 and 32 have two control electrode regions in which carriers are stored, respectively, so that they may be called Double Base Store Image Sensors, abbreviated to "D.BASIS".

As described in detail with reference to various embodiments, the photoelectric converter in accordance with the present invention has may advantageous features as follows. One picture element is constituted by one transistor so that a high density of picture elements can be easily attained. Because of its structure, blooming and smearing can be reduced to a minimum and a high sensitivity can also be attained. A considerably wide dynamic range can be secured. Because of a self-amplification capacibilty, a high signal voltage can be produced without depending upon the conductor capacitance. A low noise characteristic is attained, and peripheral circuits can be made simple in construction. Thus, the industrial value of the photoelectric converter in accordance with the present invention is very high, for instance, as a high-quality solid-state image sensor in the future.

In addition to the solid state image sensors, the photoelectric converter in accordance with the present invention may be applied to image input devices such as facsimiles, work stations, digital copiers, word processors and the like; OCRs; bar code readers; and photoelectric conversion type object detecting devices used in automatic focusing systems of cameras, video cameras and 8 mm movie cameras.

What is claimed is:

1. A photoelectric converter, comprising:
   (a) a transistor including:
      a first semiconductor region of a first conductivity type,
      a second semiconductor region of the first conductivity type, and
      a third semiconductor region of a second conductivity type opposite to the first conductivity type and operatively associated with the first and second semiconductor regions to form the transistor, said third semiconductor region being capable of accumulating photoexcited carriers therein;
   (b) first reference potential means, disposed connectable to the second semiconductor region;
   (c) switching means for connecting the second semiconductor region to the first reference potential means;
   (d) second reference potential means connected to the first semiconductor region; and
   (e) bias means for forward biasing the third semiconductor region with respect to the second semiconductor region while the second semiconductor region is not connected to the first reference potential means for readout of the photoexcited carriers in the third semiconductor region and while the second semiconductor region is connected to the first reference potential means for the refreshing;
      said bias means including means for controlling the potential of the third semiconductor region preferentially to the first and second semiconductor regions.

2. A photoelectric converter according to claim 1, which further comprises a capacitive load disposed connectable to the second semiconductor region, so that the carriers in the third semiconductor region are read out through the capacitive load, said switching means having a function of connecting the capacitive load or the first reference potential means selectively to the second semiconductor region.

3. A photoelectric converter according to claim 1, wherein said bias means comprises first bias means for forward biasing the third semiconductor region for readout, and second bias means for forward biasing the third semiconductor region for refreshing.

4. A photoelectric converter according to claim 1, wherein said bias means also has a function of reverse biasing the third semiconductor region with respect to the second semiconductor region for the accumulation.

5. A photoelectric converter according to claim 1, wherein said first reference potential means provides variable potential levels.

6. A photoelectric converter according to claim 1, wherein said second reference potential means provides variable potential levels.

7. A photoelectric converter according to claim 1, wherein said bias means provides different forward bias levels to the third semiconductor region for readout and for refreshing.

8. A photoelectric converter according to claim 7, wherein said bias means provides a higher forward bias level for refreshing than for readout.

9. A photoelectric converter according to claim 1, which further comprises a first capacitor connected to the control electrode region.

10. A photoelectric converter according to claim 9, wherein said bias means provides a forward bias potential to the third semiconductor region through the first capacitor for readout.

11. A photoelectric converter according to claim 10, which further comprises a second capacitor connected to the third semiconductor region.

12. A photoelectric converter according to claim 11, wherein said bias means provides a forward bias potential to the third semiconductor region through the second capacitor for refreshing.

13. A photoelectric converter according to claim 12, wherein said first and second capacitors have different capacitances.

14. A photoelectric converter according to claim 9, wherein said bias means provides a forward bias potential to the third semiconductor region through said first capacitor for both readout and refreshing.

15. A photoelectric converter according to claim 1, wherein said transistor is provided in a plurality arranged in a matrix comprising rows and columns.

16. A photoelectric converter according to claim 15, wherein said bias means is so connected to the plurality of transistors as to refresh all the transistors at a time.

17. A photoelectric converter according to claim 15, wherein said bias means is so connected to the plurality of transistors as to refresh the transistors row by row.

18. A photoelectric converter according to claim 15, wherein said bias means is so connected to the plurality of transistors as to refresh the transistors in a selected row while effecting the readout from the transistors in a row next to the selected row.

19. A photoelectric converter according to claim 1, wherein said transistor is provided in a plurality on a same semiconductor substrate, the plurality of transistors are respectively provided with an individual capacitive load connectable thereto, and the resultant plurality of individual capacitive loads are connected partially in common to provide a common capacitive load.

20. A photoelectric converter according to claim 19, wherein said transistor is provided in a plurality arranged in a matrix comprising plural rows and plural columns on a same semiconductor substrate, each column of transistors are provided with an individual capacitive load disposed connectable in common thereto, and the resultant plural individual capacitive loads are connected partially in common to provide a common capacitive load.

21. A photoelectric converter according to claim 19, which comprises output means connected to said common capacitive load for reading out the outputs of the transistors through the common capacitive load.

22. A photoelectric converter according to claim 21, wherein said output means comprises a bipolar transistor.

23. A photoelectric converter according to claim 19, wherein the plurality of individual capacitive loads are divided into a plurality of groups each comprising plural individual capacitive loads which are connected in common to provide a common capacitive load.

24. A photoelectric converter according to claim 23, which comprises a plurality of output means each connected to one of the common capacitive loads so as to read out signals from the transistors connected thereto.

25. A photoelectric converter according to claim 24, wherein said output means comprises a bipolar transistor.

26. A photoelectric converter according to claim 24, which further comprises a pluality of shift registers each provided corresponding to one group of plural transistors which are connected to one common capacitive load, each shift register functioning to scan the transistors in one group to sequentially read out signals from the transistors in a prescribed order.

27. A photoelectric converter according to claim 1, which comprises output means for detecting the output from the capacitive load.

28. A photoelectric converter according to claim 27, wherein said output means comprises a bipolar transistor.

29. A photoelectirc converter according to claim 1, wherein said second semiconductor region is held at a ground or potential for the accumulation.

30. A photoelectric converter according to claim 1, wherein the potential of said first semiconductor region is varied during the accumulation.

31. A photoelectric converter according to claim 1, wherein said transistor is provided in a plurality on a semiconductor substrate, and the first semiconductor regions of the plurality of transistors are electrically isolated from each other.

32. A photoelectric converter according to claim 1, whereins said transistor is provided in a plurality arranged in a matrix comprising rows and columns, and wherein the first semiconductor regions of the transistors in a row is electrically isolated from those of the transistors in the other rows.

33. A photoelectric converter according to claim 1, which further comprises a diode connected to said third semiconductor region.

34. A photoelectric converter according to claim 1, which further comprises switching means disposed between said third semiconductor region and a reference power supply.

35. A photoelectric converter according to claim 1, wherein said second semiconductor region is set to a negative potential immediately before the readout.

36. A photoelectric converter, comprising:
(a) a first semiconductor region of a first conductivity type,
(b) a second semiconductor region of a second conductivity type for accumulation of carriers relevant to the second conductivity type among hole-electron pairs generated by photoexcitation disposed contiguous to the first semiconductor region;

(c) a third semiconductor region of the first conductivity type for accumulation of carriers relevant to conductivity type among the hole-electron pairs generated by photoexcitation, disposed adjacent to the second semiconductor region by the medium of a high resistivity semiconductor region;

(d) a fourth semiconductor region of the second conductivity type disposed contiguous to the third semiconductor region; and (e) bias means for separately forward biasing the second semiconductor region with respect to the first semiconductor region to read out the relevant carriers accumulated in the second semiconductor region and forward biasing the third semiconductor region with respect to the second semiconductor region to read out the relevant carriers accumulated in the third semiconductor region.

37. A photoelectric converter according to claim 36, wherein the bias means is operated sequentially for forward biasing the third semiconductor region and then for forward biasing the second semiconductor region.

38. A photoelectric converter, comprising:
(a) a transistor including:
a first semiconductor region of a first conductivity type,
a second semiconductor region of the first conductivity type, and
a third semiconductor region of a second conductivity type opposite to the first conductivity type and operatively associated with the first and second semiconductor regions to form the transistor, said third semiconductor region being capable of accumulating photoexcited carriers therein;
(b) first reference potential means;
(c) first switching means for connecting the second semiconductor region to said first reference potential means for refreshing the third semiconductor region to extinguish the photoexcited carriers therein;
(d) second reference potential means connected to said first semiconductor region; and
(e) second switching means disposed between the third semiconductor region and a reference power supply providing a higher potential level than the first reference potential means,
said second switching means being turned on to provide the third semiconductor region with the potential given by the reference power supply, and then being turned off so as to provide simultaneous occurrence of the off-state of the second switching means and the on-state of the first switching means.

39. A photoelectric converter, comprising:
(a) a transistor including:
a first semiconductor region of a first conductivity type,
a second semiconductor region of the first conductivity type, and
a third semiconductor region of a second conductivity type opposite to the first conductivity type and operatively associated with the first and second semiconductor regions to form the transistor, said third semiconductor region being capable of accumulating photoexcited carriers therein;

(b) a capacitive load disposed connectable to said second semiconductor region;
(c) switching means disposed between the third semiconductor region and a reference power supply;
(d) bias means for forward biasing the third semiconductor region with respect to the second semiconductor region to read out the carriers accumulated in the third semiconductor region through the capacitive load; and
(e) a potential source connected to said first semiconductor region;
said switching means being turned on for refreshing to extinguish the carriers in the third semiconductor region.

40. A photoelectric converter according to claim 39, which further comprises a capacitor connected to said third semiconductor region.

41. A photoelectric converter according to claim 40, wherein said bias means forward biases said third semiconductor region through the capacitor to effect the readout.

42. A photoelectric converter according to claim 39, wherein said transistor is formed in a semiconductor substrate, and an isolation region is formed so as to surround and electrically isolate the transistor.

43. A photoelectric converter according to claim 42, wherein said switching means is formed on the isolation region.

44. A photoelectric conversion process comprising the steps of:
(A) providing a photoelectric converter comprising:
(a) a transistor including:
a first semiconductor region of a first conductivity type,
a second semiconductor region of the first conductivity type, and
a third semiconductor region of a second conductivity type opposite to the first conductivity type and operatively associated with the first and second semiconductor regions to form the transistor, said third semiconductor region being capable of accumulating photoexcited carriers therein;
(b) a capacitive load disposed connectable to the second semiconductor region; and
(c) reference potential means connected to the first semiconductor region; and
(B) sequentially conducting the following stages of operations:
(d) accumulation operation, comprising exposing the transistor to accumulate photoexcited carriers in the third semiconductor region;
(e) readout operation, comprising:
connecting the capacitive load to the second semiconductor region; and
forward biasing the third semiconductor region with respect to the second semiconductor region to read out the carriers accumulated in the third semiconductor region through the capacitive load; and
(f) refreshing operation, comprising:
providing a reference potential to the second semiconductor region, and
forward biasing the third semiconductor region with respect to the second semiconductor region to extinguish the carriers in the third semiconductor region.

45. A process according to claim 44, wherein said accumulation operation further comprises, prior to the exposure of the transistor;
  providing a reference potential to the second semiconductor region; and
  reverse biasing the third semiconductor region with respect to the second semiconductor region.

46. A photoelectric converter for providing an output signal which varies as a function of light energy received thereby, comprising:
  a transistor including a first semiconductor region, a second semiconductor region connected to an output circuit which includes a capacitive element, and a third semiconductor region which is operatively associated with the first and second semiconductor regions to form the transistor and being capable of accumulating carriers in response to the received light energy; and
  read-out means for reading out a signal dependent on the accumulated carriers;
  the third semiconductor region being coupled to a potential source which controls the potential of the third semiconductor region preferentially to the first and second semiconductor regions and forward biases the junction of said third and second semiconductor regions during readout, the output signal being produced as a voltage across the capacitive element.

47. A converter according to claim 46, wherein the capacitance of the capacitive element is provided by stray capacitance of the output circuit.

48. A converter according to claim 46, wherein said control electrode region is a base region and said second semiconductor region is an emitter region.

49. A converter according to claim 46, comprising refresh means for extinguishing the accumulated carriers.

50. A converter according to claim 49, wherein the refresh means forward biases the junction of the third and second semiconductor regions to extinguish the accumulated carriers.

51. A converter according to claim 50, wherein the refresh means includes a switching means for selectively connecting the second semiconductor region to a potential source to extinguish the carriers.

52. A convertor according to claim 50, wherein the refresh means selectively connects the second semiconductor region to a reference potential to extinguish the accumulated carriers.

53. A converter according to claim 52, wherein the refresh means includes switching means for selectively connecting the second semiconductor region to the reference potential.

54. A converter according to claim 50, wherein the forward bias during read-out has a different level to the extinguishing forward bias.

55. A converter according to claim 54, wherein the extinguishing forward bias is greater than the forward bias during read-out.

56. A convertor according to claim 46, comprising means for biasing the third semiconductor region to allow carrier accumulation in response to received light energy.

57. A convertor according to claim 56, wherein the third semiconductor region is reverse biased relative to the second semiconductor region during carrier accumulation.

58. A converter according to claim 56, wherein the third semiconductor region is in a floating state during carrier accumulation.

59. A converter according to claim 46, wherein read-out takes place at a different time from accumulation.

60. A converter according to claim 49, wherein extinguishing the carriers takes place at a different time from accumulation.

61. A converter according to claim 49, wherein read-out takes place at a different time from extinguishing.

62. A converter according to claim 60, wherein accumulation, read-out and extinguishing all take place at different times.

63. A converter according to claim 46, further comprising an amplifying arrangement and means for selectively coupling the capacitive element to the amplifying arrangement.

64. A converter according to claim 63, wherein the amplifying arrangement comprises a bipolar transistor, an MOS transistor, an FET or a J-FET.

65. A converter according to claim 46, wherein the read-out means includes switch means for selectively coupling the third semiconductor region to said potential source.

66. A converter according to claim 46, comprising capacitive means for coupling the third semiconductor region to said potential source.

67. A converter according to claim 50, wherein the refresh means applies forward biasing potential to the control electrode region via capacitive means.

68. A converter according to claim 66 wherein the capacitive means comprises a single capacitive element.

69. A converter according to claim 49, wherein the capacitive means comprises first and second capacitive elements through which potential is applied to the third semiconductor region during carrier extinguishing and read-out respectively.

70. A converter according to claim 69 wherein the first and second capacitive elements have different capacitances.

71. A converter according to claim 50, further comprising means selectively actuatable prior to forward biasing said junction to extinguish the accumulated carriers, for causing the potential of the third semiconductor region to tend towards forward bias relative to the second semiconductor region.

72. A converter according to claim 71 wherein the causing means comprises a further transistor having a first semiconductor region coupled to the said third semiconductor region, second semiconductor region arranged to selectively receive a reference potential, and a third control region coupled to the first semiconductor region of the first-mentioned transistor.

73. A converter according to claim 50, further comprising means for limiting the extent to which the third semiconductor tends away from forward bias relative to the second semiconductor region of said transistor.

74. A converter according to claim 73, wherein the limiting means comprises a diode having a first electrode region coupled to the third semiconductor region, and a second electrode region arranged to receive a reference potential.

75. A photoelectric converter for providing an output signal which varies as a function of light energy received thereby, comprising:
  a transistor including a first semiconductor region, second semiconductor region connected to an output circuit which includes a capacitive element, and a third semiconductor region which is operatively associated with the first and second semiconductor regions to form the transistor and being capable of accumulating carriers in response to the received light energy;

means for extinguishing the accumulated carriers in a refresh step after the production of the output signal; and bias means for controlling the potential of the third semiconductor region preferentially to the first and second semiconductor regions;

wherein, in the refresh step, the extinguishing means forward biases the junction of the third and second semiconductor regions.

76. A converter according to claim 75, wherein the extinguishing means connects said second semiconductor region to a reference potential source during the refresh step.

77. A converter according to claim 76 wherein the extinguishing means comprises switching means and control means therefor, for connecting said second semiconductror region to said reference potential source during the refresh step.

78. A converter according to claim 75 wherein the extinguishing means couples said third semiconductor region to a potential source which forward biases said junction during the refresh step.

79. A converter according to claim 78, wherein the bias means comprises switching means for connecting the third semiconductor region to the potential source during the refresh step.

80. A converter according to claim 78, comprising capacitive means for coupling the third semiconductor region to said potential source.

81. A converter according to claim 80, wherein said capacitive means is in series with the third semiconductor region and the bias means is arranged to apply a pulsed voltage to the third semiconductor region via the capacitive means to forward bias the said junction in the refresh step.

82. A converter according to claim 75, further comprising means for selectively coupling the third semiconductor region to a reference potential thereof to tend towards forward bias relative to the said one main electrode region.

83. A converter according to claim 82, wherein the selective coupling means comprises a further transistor.

84. A converter according to claim 82, wherein the further transistor has a first electrode region coupled to said third semiconductor region, a second electrode region arranged to receive a reference potential, and a third electrode region coupled to the first semiconductor region of the first-mentioned transistor.

85. A converter according to claim 75, further comprising means for limiting the extent to which the third semiconductor region tends away from forward bias with respect to the second semiconductor region.

86. A converter according to claim 85, wherein the limiting means comprises a diode.

87. A converter according to claim 86, wherein the diode has a first electrode region coupled to the third semiconductor region, and a second electrode region arranged to receive a reference potential.

88. A converter according to claim 76, further comprising means for selectively coupling the said reference potential source to the third semiconductor region prior to the refresh step to cause the potential of the third semiconductor region to assume the reference potential.

89. A converter according to claim 75, comprising read-out means in response to the operation of which the said output signal is produced.

90. A converter according to claim 89, wherein the output circuit includes a capacitive element across which the output signal is produced as a voltage.

91. A converter according to claim 90, wherein the capacitance of the capacitive element is provided by stray capacitance of the outut circuit.

92. A converter according to claim 89, further comprising an amplifying arrangement and means for selectively coupling the capacitive element to the amplifying arrangement.

93. A converter according to claim 92 wherein the amplifying arrangement comprises a bipolar transistor, an MOS transistor, and FET or a J-FET.

94. A converter according to claim 75, wherein said bias means biases the third semiconductor region to allow carrier accumulation in response to received light energy.

95. A converter according to claim 94, wherein the third semiconductor region is reverse biased relative to said second semiconductor region during carrier accumulation.

96. A converter according to claim 94, wherein the third semiconductor region is in a floating state during carrier accumulation.

97. A converter according to claim 75, wherein the refresh step takes place at a different time to carrier accumulation.

98. A converter according to claim 97, wherein the output signal is produced at a different time to carrier accumulator.

99. A photoelectric converter according to claim 1, wherein said second reference potential means provides a constant potential which reverse biases the junction of the first and third semiconductor regions.

100. A photoelectric converter according to claim 38, wherein said second reference potential means provides a constant potential which reverse biases the junction of the first and third semiconductor regions.

101. A photoelectric converter according to claim 39, wherein said second reference potential means provides a constant potential which reverse biases the unction of the first and third semiconductor regions.

102. A process according to claim 44, wherein said reference potential means provides a constant potential which reverse biases the junction of the first and third semiconductor regions.

103. A converter according to claim 46, wherein the first semiconductor region is connected to a constant potential source which reverse biases the junction of the first and third semiconductor regions.

104. A converter according to claim 75, wherein the first semiconductor region is connected to a constant potential source which reverse biases the junction of the first and third semiconductor regions.

105. A photoelectric converter according to claim 1, wherein said second semiconductor region is held at a negative potential for the accumulation.

* * * * *

UNITED STATES PATENT AND TRADEMARK OFFICE
CERTIFICATE OF CORRECTION

PATENT NO. : 4,791,469

DATED : December 13, 1988

INVENTOR(S) : TADAHIRO OHMI, ET AL.

Page 1 of 11

It is certified that error appears in the above-identified patent and that said Letters Patent is hereby corrected as shown below:

IN [57] ABSTRACT

Line 4, "region an" should read --region, an--.

COLUMN 1

Line 52, "pick up," should read --pickup,--.
Line 61, "greatly thereof is extremely" should read
--efficiency thereof is greatly--.

COLUMN 2

Line 8, "extremely" should read --an extremely--.
Line 14, "ecause" should read --Because--.
Line 46, "transistor" should read --transistor)--.

COLUMN 3

Line 59, "wherein;" should read --wherein:--.

COLUMN 4

Lines 5-6, "semicoducter" should read --semiconductor--.
Line 36, "opertion" should read --operation--.

COLUMN 5

Line 6, "15(b)" should read --15(b),--.
Line 9, "16(g)" should read --16(g),--.
Line 18, "photosesor" should read --photosensor--.

UNITED STATES PATENT AND TRADEMARK OFFICE
CERTIFICATE OF CORRECTION

PATENT NO. : 4,791,469

DATED : December 13, 1988

INVENTOR(S) : TADAHIRO OHMI, ET AL.

It is certified that error appears in the above-identified patent and that said Letters Patent is hereby corrected as shown below:

COLUMN 6

Line 17, "FIG. 1" should read --FIGS. 1(a), 1(b) and 1(c)--.
Line 18, "operation a" should read --operation of a--.
Line 35, "n type" should read --n-type--.

COLUMN 8

Line 30, "sensor" should read --photosensor--.

COLUMN 10

Line 46, "appllied" should read --applied--.

COLUMN 11

Line 47, "is" should read --in--.

COLUMN 12

Line 10, "$V_{bias}$" should read --$V_{bias}.$--.

COLUMN 14

Line 3, "above described" should read --above-described--.

UNITED STATES PATENT AND TRADEMARK OFFICE
CERTIFICATE OF CORRECTION

PATENT NO. : 4,791,469
DATED : December 13, 1988
INVENTOR(S) : TADAHIRO OHMI, ET AL.   Page 3 of 11

It is certified that error appears in the above-identified patent and that said Letters Patent is hereby corrected as shown below:

COLUMN 15

Line 13, "thermally" should read --thermal--.
    Line 16, "thermally" should read --thermal--.
    Line 58, "of the" should read --the--.
    Line 68, "appliation" should read --application--.

COLUMN 16

Line 40, "sensor" should read --photosensor--.
    Line 56, "6(a).)." should read --6(a).)--.
    Line 59, "$V_{RH}$ is 0.6V," should read --V is 0.6V,--.

COLUMN 17

Line 44, "refeeshing" should read --refreshing--.

COLUMN 18

Line 33, "transsitor" should read --transistor--.

COLUMN 19

Line 60, "38 38'" should read --38, 38'--.

COLUMN 20

Line 53, "readout" should read --read out--.

UNITED STATES PATENT AND TRADEMARK OFFICE
CERTIFICATE OF CORRECTION

PATENT NO. : 4,791,469
DATED : December 13, 1988
INVENTOR(S) : TADAHIRO OHMI, ET AL.

It is certified that error appears in the above-identified patent and that said Letters Patent is hereby corrected as shown below:

COLUMN 22

Line 68, "capaticance" should read --capacitance--.

COLUMN 23

Line 24, "40,40'" should read --40, 40'--.

COLUMN 24

Line 20, "row.)" should read --row)--.
    Line 26, "finalstage" should read --final-stage--.

COLUMN 25

Line 10, "compensate it" should read --compensate for it--.

COLUMN 26

Line 2, "that two" should read --two--.

COLUMN 27

Line 11, "n type" should read --n-type--.

UNITED STATES PATENT AND TRADEMARK OFFICE
CERTIFICATE OF CORRECTION

PATENT NO. : 4,791,469

DATED : December 13, 1988

INVENTOR(S) : TADAHIRO OHMI, ET AL.

It is certified that error appears in the above-identified patent and that said Letters Patent is hereby corrected as shown below:

COLUMN 28

Line 4, "pluralty" should read --plurality--.
Line 12, "sensor" should read --photosensor--.
Line 29, "n type" should read --n-type--.
Lines 55-56, "ion ion" should read --ion--.

COLUMN 29

Line 13, "tebs Torrs." should read --tens Torrs.--.
Line 60, "imigration" should read --migration--.

COLUMN 30

Line 63, "A" should read --Å--.
Line 67, "A" should read --Å--.

COLUMN 31

Line 14, "A" should read --Å--.
Line 31, "A" should read --Å--.

COLUMN 32

Line 10, "A" should read --Å--.
Line 12, "SIH$_4$" should read --SiH$_4$--.
Line 13, "A" should read --Å--.
Line 14, "SiH$_4$ NH$_3$" should read --SiH$_4$ + NH$_3$--.

UNITED STATES PATENT AND TRADEMARK OFFICE
CERTIFICATE OF CORRECTION

PATENT NO. : 4,791,469

DATED : December 13, 1988

INVENTOR(S) : TADAHIRO OHMI, ET AL.　　　Page 6 of 11

It is certified that error appears in the above-identified patent and that said Letters Patent is hereby corrected as shown below:

COLUMN 33

Line 18, "n type" should read --n-type--.
Line 22, "n type" should read --n-type--.
Line 31, "deposited" should read --is deposited--.
Line 51, "is" should read --has been--.

COLUMN 34

Line 60, "(A)" should read --(Å)--.

COLUMN 35

Lines 7-8, "between," should read --between--.
Line 10, "varnish" should read --vanish--.
Line 45, "above men-" should read --above-men- --.

COLUMN 36

Line 48, "emiter" should read --emitter--.

COLUMN 38

Line 19, "sensor" should read --photosensor--.
Line 22, "sensor" should read --photosensor--.
Line 41, "sensor" should read --photosensor--.
Line 46, "satisfied;" should read --satisfied:--.
Line 59, "uried" should read --buried--.
Line 66, "sensor" should read --photosensor--.

UNITED STATES PATENT AND TRADEMARK OFFICE
CERTIFICATE OF CORRECTION

PATENT NO. : 4,791,469
DATED : December 13, 1988
INVENTOR(S) : TADAHIRO OHMI, ET AL.

It is certified that error appears in the above-identified patent and that said Letters Patent is hereby corrected as shown below:

COLUMN 40

Line 2, "and an" should read --an--.
    Line 12, "sensor" should read --photosensor--.
    Line 34, "ootential" should read --potential--.

COLUMN 41

Line 24, "Xthe" should read --the--.

COLUMN 42

Line 2, "sensor" should read --photosensor--.
    Line 4, "sensor" should read --photosensor--.
    Line 33, "sensor" should read --photosensor--.

COLUMN 43

Line 23, "consistig" should read --consisting--.
    Line 63, "cosequently" should read --consequently--.
    Line 64, "readout" should read --read out--.

COLUMN 44

Line 12, "When the" should read --The--.
    Line 18, "voltge" should read --voltage--.
    Line 34, "n type" should read --n-type--.
    Line 40, "n type" should read --n-type--.
    Line 43, "phototansistor" should read --phototransistor--.

UNITED STATES PATENT AND TRADEMARK OFFICE
CERTIFICATE OF CORRECTION

PATENT NO. : 4,791,469

DATED : December 13, 1988

INVENTOR(S) : TADAHIRO OHMI, ET AL.

Page 8 of 11

It is certified that error appears in the above-identified patent and that said Letters Patent is hereby corrected as shown below:

COLUMN 45

Line 27, "extensitvely" should read --extensively--.
Line 50, "$n^+$ region" should read --$n^-$ region--.

COLUMN 46

Line 58, "pototransistor" should read --phototransistor--.

COLUMN 47

Line 22, "varnishing" should read --vanishing--.
Line 50, "intesity" should read --intensity--.
Line 53, "reg-:on" should read --region--.

COLUMN 49

Line 2, "sensitivty" should read --sensitivity--.
Line 11, "ofaa" should read --of a--.

COLUMN 50

Line 10, "onto" should read --on to--.
Line 37, "bering" should read --bring--.

UNITED STATES PATENT AND TRADEMARK OFFICE
CERTIFICATE OF CORRECTION

PATENT NO. : 4,791,469

DATED : December 13, 1988

INVENTOR(S) : TADAHIRO OHMI, ET AL.

It is certified that error appears in the above-identified patent and that said Letters Patent is hereby corrected as shown below:

COLUMN 51

Line 2, "voltage. the" should read --voltage. The--.
    Line 7, "th" should read --the--.
    Line 12, "idicated" should read --indicated--.
    Line 21, "descried" should read --described--.

COLUMN 52

Line 24, "representrs" should read --represents--.
    Line 44, "but" should be deleted.

COLUMN 53

Line 19, "signle" should read --single--.
    Line 44, "sectrum" should read --spectrum--.
    Line 50, "proces." should read --process.-- and "electorde" should read --electrode--.

COLUMN 54

Line 34, "th" should read --the--.
    Line 64, "i" should read --in--.

COLUMN 55

Line 50, "isolationn" should read --isolation--.
    Line 67, "may" should read --many--.

UNITED STATES PATENT AND TRADEMARK OFFICE
CERTIFICATE OF CORRECTION

PATENT NO. : 4,791,469
DATED : December 13, 1988
INVENTOR(S) : TADAHIRO OHMI, ET AL.

It is certified that error appears in the above-identified patent and that said Letters Patent is hereby corrected as shown below:

COLUMN 56

Line 6, "capacibilty" should read --capability--.

COLUMN 57

Line 64, "are" should read --is--.

COLUMN 58

Line 21, "pluality" should read --plurality--.
Line 33, "photoelectirc" should read --photoelectric--.
Line 35, "potential" should read --negative potential--.
Line 45, "whereins" should read --wherein--.
Line 48, "is" should read --are--.

COLUMN 61

Line 33, "control electrode" should read --third semiconductor--.
Line 61, "convertor" should read --converter--.
Line 65, "convertor" should read --converter--.

UNITED STATES PATENT AND TRADEMARK OFFICE
CERTIFICATE OF CORRECTION

PATENT NO. : 4,791,469

DATED : December 13, 1988

INVENTOR(S) : TADAHIRO OHMI, ET AL.

It is certified that error appears in the above-identified patent and that said Letters Patent is hereby corrected as shown below:

COLUMN 62

Line 30, "control electrode" should read --third semiconductor--.
Line 31, "claim 66" should read --claim 66,--.
Line 38, "claim 69" should read --claim 69,--.
Line 47, "claim 71" should read --claim 71,--.

COLUMN 63

Line 48, "claim 82," should read --claim 83,--.

COLUMN 64

Line 12, "outut" should read --output--.
Line 36, "accumulor" should read --accumulation--.
Line 47, "unction" should read --junction--.

Signed and Sealed this

Second Day of January, 1990

Attest:

JEFFREY M. SAMUELS

Attesting Officer    Acting Commissioner of Patents and Trademarks